(12) United States Patent
Takagi

(10) Patent No.: US 8,471,382 B2
(45) Date of Patent: Jun. 25, 2013

(54) PACKAGE AND HIGH FREQUENCY TERMINAL STRUCTURE FOR THE SAME

(75) Inventor: Kazutaka Takagi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/417,785

(22) Filed: Mar. 12, 2012

(65) Prior Publication Data

US 2012/0234592 A1 Sep. 20, 2012

Related U.S. Application Data

(63) Continuation-in-part of application No. 13/164,155, filed on Jun. 20, 2011.

(30) Foreign Application Priority Data

Nov. 18, 2010 (JP) .................................. 2010-258223
Nov. 16, 2011 (JP) .................................. 2011-250469

(51) Int. Cl.
*H01L 23/34* (2006.01)

(52) U.S. Cl.
USPC ........... 257/728; 257/678; 257/710; 257/729; 257/730; 257/731; 257/734; 257/E23.193

(58) Field of Classification Search
USPC ................. 257/704, 705, 706, 708, 710, 711, 257/678, 728, 729, 730, 731, 734, E23.001–E23.194
See application file for complete search history.

(56) References Cited

U.S. PATENT DOCUMENTS

| 4,259,684 A | * | 3/1981 | Dean et al. ..................... 257/664 |
| 4,698,661 A | | 10/1987 | Bessonneau et al. |
| 4,985,753 A | * | 1/1991 | Fujioka et al. ................ 257/700 |
| 7,605,465 B2 | * | 10/2009 | Takagi ........................... 257/707 |
| 8,102,036 B2 | * | 1/2012 | Kashiwabara ................ 257/664 |

FOREIGN PATENT DOCUMENTS

| JP | 3-268618 | 11/1991 |
| JP | 08-097320 | 4/1996 |
| JP | 11-238823 | 8/1999 |
| JP | 2000-183222 | 6/2000 |

OTHER PUBLICATIONS

Office Action issued Jan. 22, 2013 in Japanese Patent Application No. 2011-250469 filed Nov. 16, 2011 with English translation.

* cited by examiner

*Primary Examiner* — Jasmine Clark
(74) *Attorney, Agent, or Firm* — Oblon, Spivak, McClelland, Maier & Neustadt, L.L.P.

(57) ABSTRACT

A package includes: a metal wall disposed on a conductive base plate; a through-hole disposed in input/output portions of the metal wall; a lower layer feed through disposed on the conductive base plate; a wiring pattern disposed on the lower layer feed through; an upper layer feed through disposed on a part of the lower layer feed through and a part of the wiring pattern; and a terminal disposed on the wiring pattern, wherein a width of a part of the lower layer feed through and a width of the upper layer feed through are wider than a width of the through-hole, the lower layer feed through is adhered to a side surface of the metal wall, the upper layer feed through is adhered to the side surface of metal wall, and an air layer is formed between the wiring pattern and an internal wall of the through-hole.

12 Claims, 51 Drawing Sheets

PACKAGE AND HIGH FREQUENCY TERMINAL STRUCTURE FOR THE SAME

CROSS REFERENCE TO RELATED APPLICATIONS

This is a continuation-in-part (CIP) of co-pending U.S. patent application Ser. No. 13/164,155, filed on Jun. 20, 2011, which claims priority to Japan Patent Application No. P2010-258223 filed on Nov. 18, 2010 and is based upon and claims the benefit of priority from prior Japanese Patent Application No. P2011-250469 filed on Nov. 16, 2011, the entire contents of each of which are incorporated herein by reference.

FIELD

Embodiments described herein generally relate to a package.

BACKGROUND

Conventionally, a resin-sealed type and a sealed and airtight type are known as a package utilized for a semiconductor element.

The resin-sealed type semiconductor device has a structure which embedded directly the semiconductor element mounted in a leadframe in the resin by using a transfer mold etc., and is widely used by the advantage, such as low cost, being suitable for mass production, and a miniaturization being possible.

The sealed and airtight type semiconductor device has a structure which performed in hollow airtight maintenance of the semiconductor element mounted on a base substance composed of conductive materials, such as copper. Although the cost is higher compared with the resin-sealed type semiconductor device, the sealed and airtight type semiconductor device is used when high reliability is required because of excellent in airtightness.

In the sealed and airtight type package, it is known about an example of package mounting a semiconductor element directly on the heat radiation body composed of metal, and including an input/output terminal portion having convex feed through structure.

It is preferable that a characteristic impedance of feed through is 50Ω. However, in the sealed and airtight type package, the characteristic impedance of feed through is reduced due to the feed through being surrounded by a grounded metal outer wall. Although the characteristic impedance can be reached to 50Ω by forming a signal line of feed through to be narrow, an electric power capability is reduced due to the narrowed signal line, because a function of the feed through is to allow electric current and signals to pass through.

BRIEF DESCRIPTION OF THE DRAWINGS

FIG. 1B is a schematic bird's-eye view showing the package according to the first embodiment, and is a schematic configuration diagram of a metal seal ring 14a.

FIG. 14B is a schematic bird's-eye view showing the package according to the second embodiment, and is a schematic configuration diagram showing a metal seal ring 14a.

FIG. 18B is a schematic bird's-eye view showing the package according to the third embodiment, and is a schematic configuration diagram showing a metal seal ring 14a.

FIG. 22B is a schematic bird's-eye view showing the package according to the fourth embodiment, and is a schematic configuration diagram showing a metal seal ring 14a.

FIG. 24B is a schematic bird's-eye view showing the package according to the fifth embodiment, and is a schematic configuration diagram showing a metal seal ring 14a.

FIG. 32B is a schematic bird's-eye view showing the package according to the sixth embodiment, and is a schematic configuration diagram showing a metal seal ring 14a.

FIG. 36B is a schematic bird's-eye view showing the package according to the seventh embodiment, and is a schematic configuration diagram showing a metal seal ring 14a.

FIG. 39B is a schematic bird's-eye view showing the package according to the eighth embodiment, and is a schematic configuration diagram showing a metal seal ring 14a.

FIG. 40B is a schematic bird's-eye view showing the package according to the ninth embodiment, and is a schematic configuration diagram showing a metal seal ring 14a.

FIG. 48B is a schematic bird's-eye view showing the package according to the tenth embodiment, and is a schematic configuration diagram showing a metal seal ring 14a.

FIG. 54B is a schematic bird's-eye view showing the package according to the eleventh embodiment, and is a schematic configuration diagram showing a metal seal ring 14a.

DETAILED DESCRIPTION

Figure 1A:
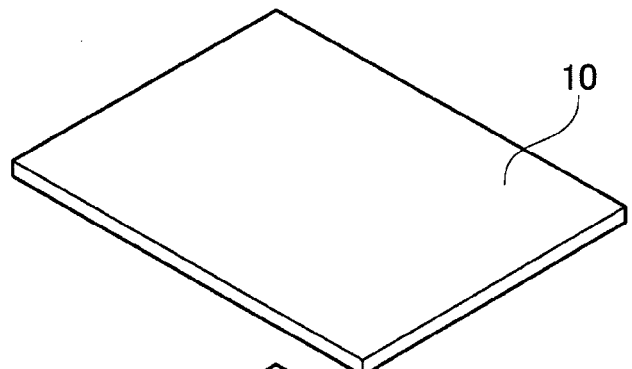
FIG. 1A is a schematic bird's-eye view showing a package according to a first embodiment, and is a schematic configuration diagram of a metal cap 10.
Figure 1B:
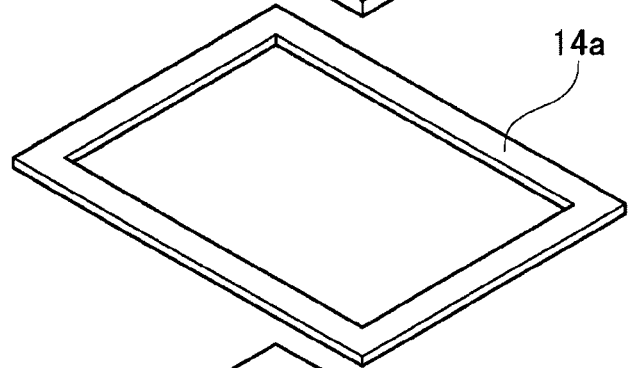
Figure 1C:
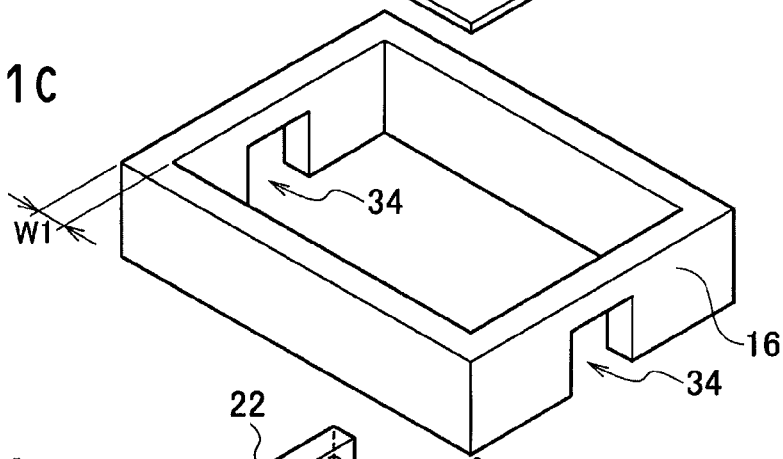
FIG. 1C is a schematic bird's-eye view showing the package according to the first embodiment, and is a schematic configuration diagram of a metal wall 16.

Next, certain embodiments of the invention will be described with reference to drawings.

A package according to a certain embodiment includes a conductive base plate, a metal wall, a through-hole, a lower layer feed through, a wiring pattern, an upper layer feed through, and a terminal. The metal wall is disposed on the conductive base plate. The through-hole is formed at input and output portions of the metal wall. The lower layer feed through is disposed on the conductive base plate. The wiring pattern is disposed on the lower layer feed through. The upper layer feed through is disposed on a part of the lower layer feed through and a part of the wiring pattern. The terminal is disposed on the wiring pattern. In this case, a width of a part of the lower layer feed through is wider than a width of the through-hole, the lower layer feed through is adhered to a side surface of the metal wall, a width of the upper layer feed through is wider than the width of the through-hole, the upper layer feed through is adhered to the side surface of metal wall, and an air layer is formed between the wiring pattern and an internal wall of the through-hole.

First Embodiment

Package Structure

A schematic bird's-eye view configuration for explaining a package according to a first embodiment is expressed as shown in FIG. 1. FIG. 1A shows a schematic configuration showing a metal cap 10. FIG. 1B shows a schematic configuration showing a metal seal ring 14*a*. FIG. 1C shows a schematic configuration showing a metal wall 16. FIG. 1D shows a schematic configuration of a lower layer feed through (20*i* and 20*o*) on a conductive base plate 200, an input stripline 19*a* and an output stripline 19*b* on the lower layer feed through (20*i* and 20*o*), and an upper layer feed through 22 on the lower layer feed through 20*i*.

As shown in FIG. 1, the package according to the first embodiment includes: a metal cap 10; a metal seal ring 14*a*; a metallic wall 16; a conductive base plate 200; lower layer feed throughs (20*i* and 20*o*) disposed on the conductive base plate 200; an input stripline 19*a* and an output stripline 19*b* disposed respectively on the lower layer feed throughs (20*i* and 20*o*); and upper layer feed throughs 22 disposed respectively on the inside lower layer feed throughs 20*i*.

—Conductive Base Plate—

The conductive base plate 200 of the package according to the first embodiment is formed of conductive metals, such as molybdenum and a copper molybdenum alloy, for example. Furthermore, electroplated conductors, such as Au, Ni, Ag, an Ag—Pt alloy and an Ag—Pd alloy, may be formed on the surface of the conductive base plate 200, for example.

—Lower Layer Feed Through and Upper Layer Feed Through—

The lower layer feed through (20*i* and 20*o*) and the upper layer feed through 22 may be formed of the same material, for example, ceramics. The material of ceramics can be formed of alumina ($Al_2O_3$), aluminum nitride (AlN), beryllium oxide (BeO), etc., for example.

Figure 1D:
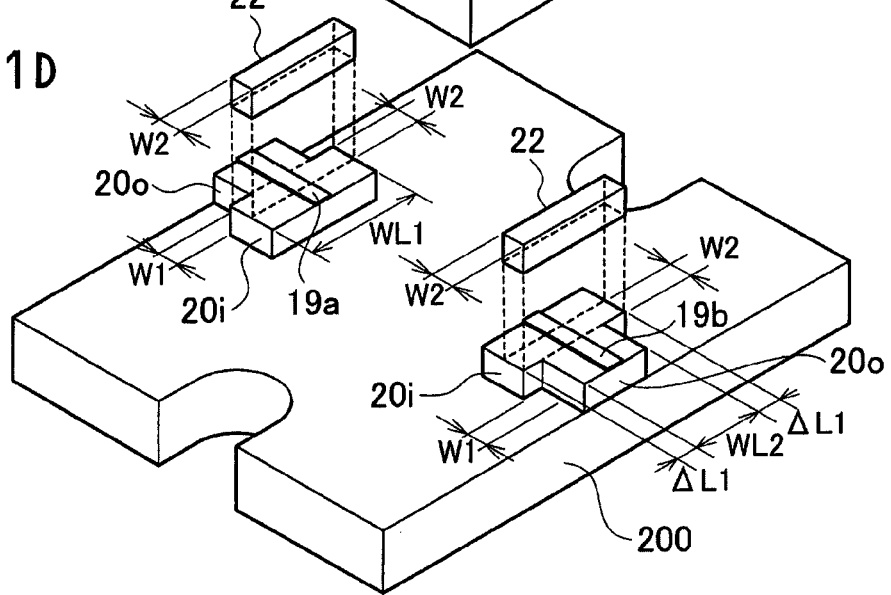
FIG. 1D is a schematic bird's-eye view showing the package according to the first embodiment, and is a schematic configuration diagram showing a lower layer feed through (20i and 20o) on a conductive base plate 200, an input stripline 19a and an output stripline 19b on the lower layer feed through (20i and 20o), and an upper layer feed through 22 on the lower layer feed through 20i.
Figure 3:
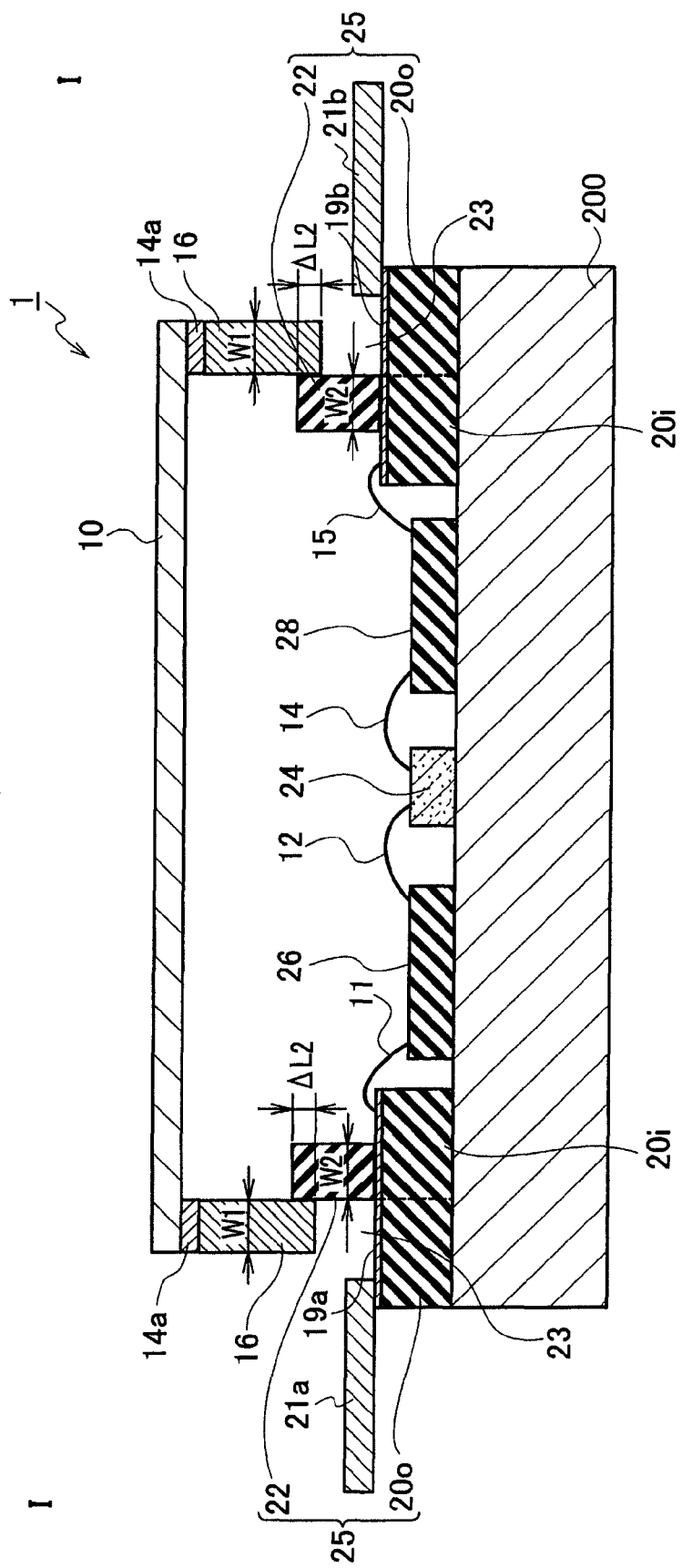
FIG. 3 is a schematic cross-sectional configuration showing the package according to the first embodiment, and is a schematic cross section configuration diagram taken in the line I-I of FIG. 2.
Figure 6:
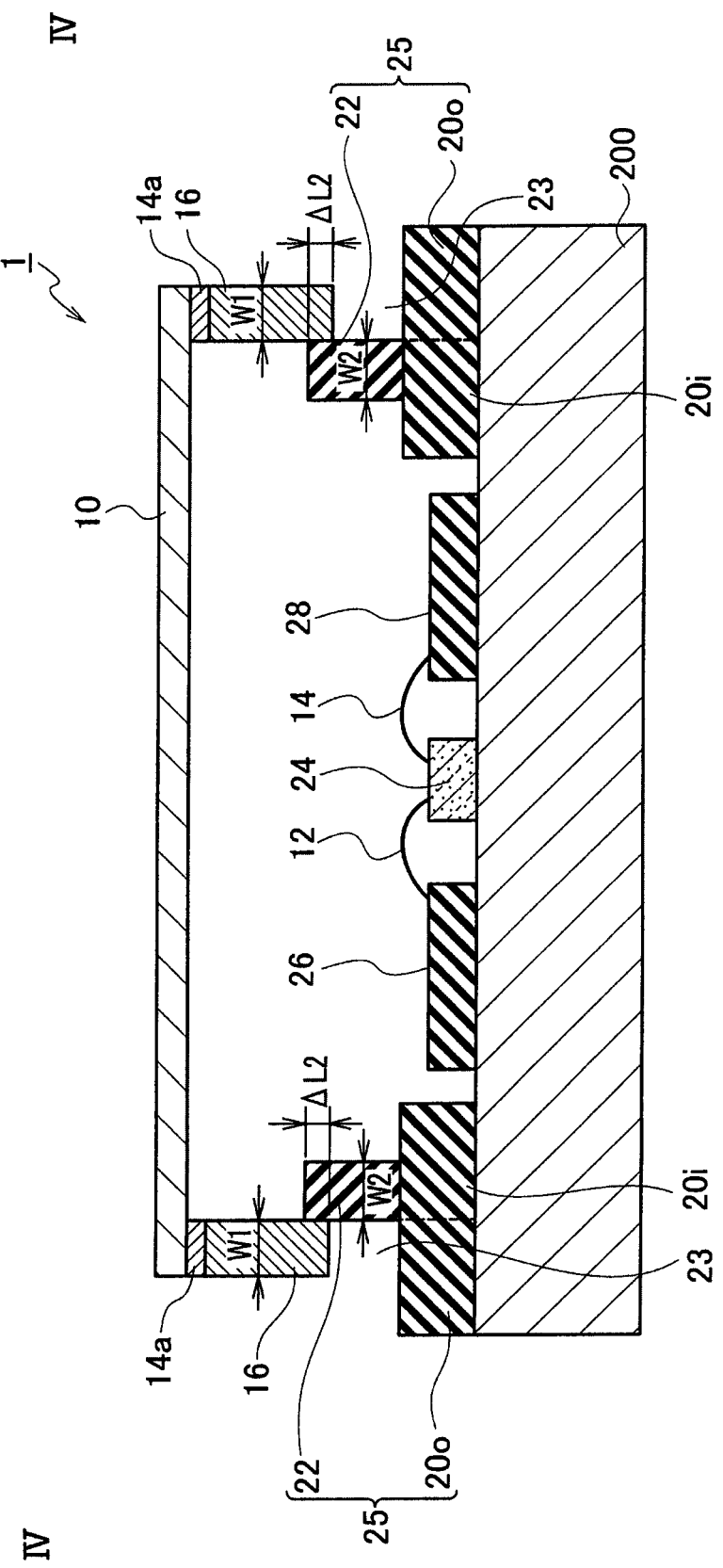
FIG. 6 is a schematic cross section configuration showing the package according to the first embodiment, and is a schematic cross-sectional configuration diagram taken in the line IV-IV of FIG. 2.

As shown in FIG. 1D, a width WL1 of the inside lower layer feed through 20*i* and the upper layer feed through 22 disposed the inside of the metal wall 16 is formed more widely than a width of the through-hole 34 of the metal wall 16. In this case, WL1−WL2=2ΔL1, for example, as shown in FIG. 1. Thus, the inside lower layer feed through 20*i* and the upper layer feed through 22 can be contacted on the side surface of the metal wall 16, by forming the width WL1 of the inside lower layer feed through 20*i* more widely than the width of the through-hole 34 of the metal wall 16, thereby securing airtightness. Also, as shown in FIGS. 3 and 6, an air gap is disposed between the input stripline 19*a* and the metal wall 16. Since the air layer 23 is formed between the top surface of the input stripline 19*a*, and the metal wall 16, reduction of impedance is avoidable.

Figure 4:
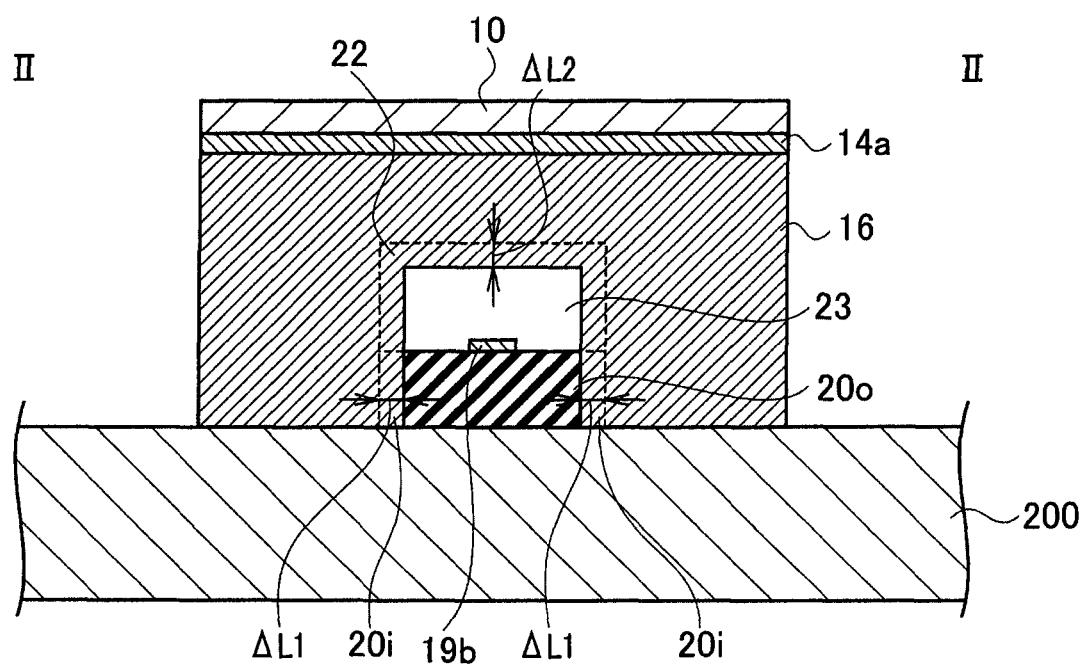
FIG. 4 is a schematic cross section configuration showing the package according to the 1st embodiment, and is a schematic cross-sectional configuration diagram taken in the line II-II of FIG. 2.

Yet also, as shown in FIGS. 3, 4 and 6, an air gap is disposed between the output stripline 19*b* and the metal wall 16. Since the air layer 23 is formed between the top surface of the output stripline 19*b*, and the metal wall 16, reduction of impedance is avoidable.

—Wiring Pattern—

The input stripline 19*a* and the output stripline 19*b* are formed of tungsten, gold plate, copper foil, etc., for example. A width and thickness of the input stripline 19*a* and the output stripline 19*b* are determined in consideration of value of an amount of electric power capability, and values of a dielectric constant and desired characteristic impedance of the lower layer feed through (20*i* and 20*o*).

—Metal Wall—

The metal wall 16 is formed with conductive metals (e.g. FeNiCo, copper, KOVAR, and a copper molybdenum alloy).

A solder metal layer (not shown) for soldering is formed on the top surface of the metallic wall 16 via the metal seal ring 14*a*. The solder metal layer can be formed of a gold germanium alloy, a gold tin alloy, etc., for example.

—Metal Cap—

The metal cap 10 has a flat plate shape as shown in FIG. 1. The metal cap 10 is formed of conductive metals (e.g. FeNiCo, copper, KOVAR, and a copper molybdenum alloy).

The metal cap 10 is disposed on the metallic wall 16 via the metal seal ring 14*a*.

As a result, the package according to the first embodiment includes the metal wall 16, the metal seal ring 14a disposed on the metal wall 16, and the metal cap 10 disposed on the metal wall 16 via the metal seal ring 14a, as shown in FIG. 1.

The semiconductor package according to the first embodiment has the high frequency characteristics of not less than 2 GHz. Accordingly, the package according to the first embodiment is applicable as a package for devices and component parts having high frequency (that is, frequency over 2 GHz).

(Plane Pattern Configuration)

Figure 2:
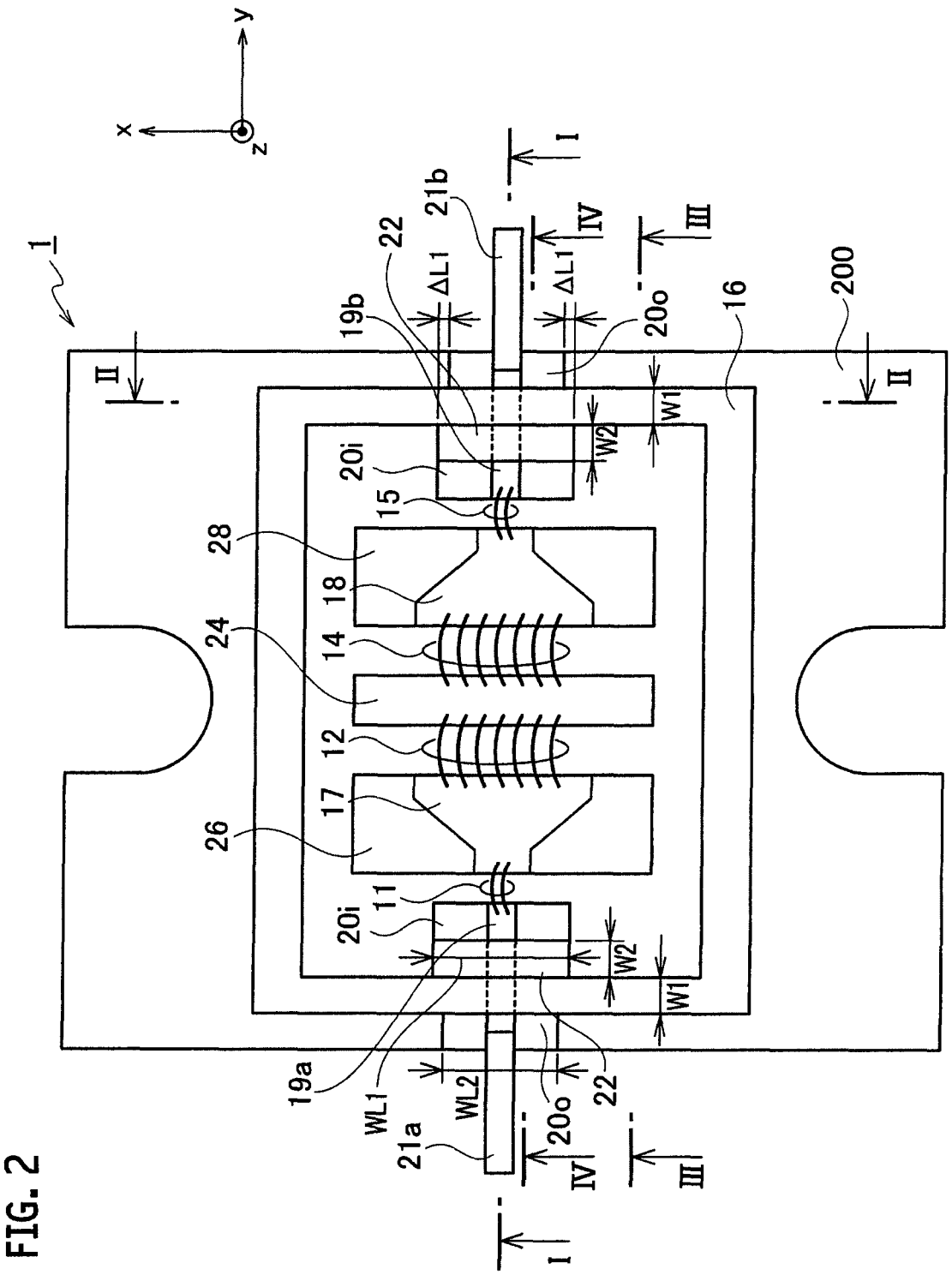
FIG. 2 is a schematic planar pattern configuration diagram showing the package according to the first embodiment.

A schematic planar pattern configuration of the package 1 according to the first embodiment is expressed as shown in FIG. 2. Also, a schematic cross-sectional structure taken in the line I-I of FIG. 2 is expressed as shown in FIG. 3.

Figure 5:
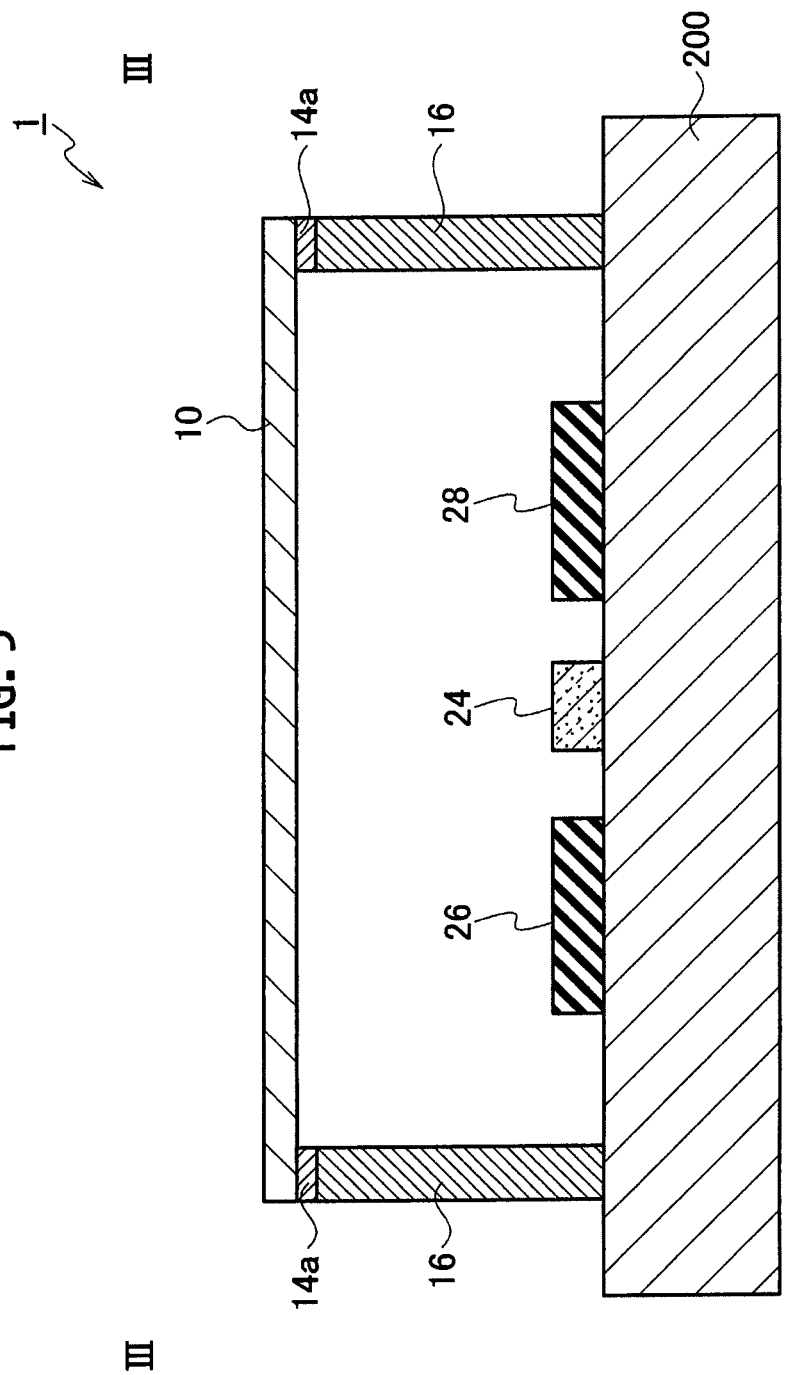
FIG. 5 is a schematic cross section configuration showing the package according to the first embodiment, and is a schematic cross-sectional configuration diagram taken in the line III-III of FIG. 2.

Also, a schematic cross-sectional structure taken in the line II-II of FIG. 2 is expressed as shown in FIG. 4, and a schematic cross-sectional structure taken in the line III-III of FIG. 2 is expressed as shown in FIG. 5. Also, a schematic cross-sectional structure taken in the line IV-IV of FIG. 2 is expressed as shown in FIG. 6. In FIG. 2, y axis indicates a direction which the line I-I extends, x axis indicates a direction in parallel to the drawing sheet and vertical to the y axis, and z axis indicates a direction vertical to the drawing sheet. Also in explanations of following embodiments, it is similar to the coordinates on FIG. 2.

As shown in FIG. 1 to FIG. 6, the package according to the first embodiment includes: a conductive base plate 200; a metal wall 16 disposed on the conductive base plate 200; through-holes 34 formed at both the input and output portions of the metal wall 16; lower layer feed throughs (20i and 20o) disposed on the conductive base plate 200; wiring patterns 19a and 19b disposed respectively on the lower layer feed throughs (20i and 20o); upper layer feed throughs 22 disposed respectively on a part of the lower layer feed throughs (20i and 20o) and a part of the wiring patterns 19a and 19b; and terminals 21a and 21b disposed respectively on the wiring pattern 19a and 19b. In this case, a width of a part of the lower layer feed through 20 is wider than a width of the through-hole 34, and the lower layer feed throughs (20i and 20o) are adhered to the metal wall 16 side surface. Also, a width of the upper layer feed throughs 22 is wider than the width of the through-hole 34, and the upper layer feed throughs 22 are adhered to the metal wall 16 side surface. Accordingly, air layers 23 are formed respectively between the wiring patterns 19a and 19b and the internal wall of the through-holes 34.

The upper layer feed through 22 and the lower layer feed through 20 are adhered to the inside of the metal wall 16.

A semiconductor device 24 is disposed on the conductor plate 200, and the metal wall 16 disposed on the conductive base plate 200 houses the semiconductor device 24.

As shown in FIGS. 2, 3 and 7-8, terminals 21a and 21b are disposed respectively out of the through-holes 34.

As shown in FIGS. 1-6, in the package 1 according to a first embodiment, the upper layer feed through 22 is disposed the inside of the metal wall 16, and are adhered to the sidewall of the metal wall 16 in the internal wall of the metal wall 16.

As shown in FIGS. 3, 4 and 6, in the package 1 according to the first embodiment, the outside lower layer feed through 20o is surrounded by the metal wall 16.

As shown in FIGS. 3, 4 and 6, the lengthwise overlap width between the metal wall 16 and the upper layer feed through 22 is expressed as ΔL2. Also, as shown in FIGS. 1, 2 and 4, the horizontal overlap width between the metal wall 16 and the inside lower layer feed through 20i is expressed as ΔL1.

The upper layer feed through 22 is adhered to the sidewall of the metal wall 16 with silver brazing, for example. The width size of the adhesion portion is about 0.5 mm, for example. Similarly, a contact surface between the lower layer feed through (20i and 20o) and the metal wall 16 is also adhered with silver brazing, for example.

As shown in FIGS. 3, 4 and 6, the outside lower layer feed through 20o passes through the metal wall 16. A bottom surface of the lower layer feed through (20i and 20o) contacts the conductive base plate 200, and a side surfaces of the lower layer feed through (20i and 20o) contacts the metal wall 16.

Also, the package 1 according to the first embodiment includes: an input stripline 19a disposed on the lower layer feed through (20i and 20o), in the input portion of the metal wall 16; and an output stripline 19b disposed on the lower layer feed through (20i and 20o), in the output portion of the metal wall 16.

Also, the upper layer feed through 22 is disposed at the inside of the metal wall 16, and is adhered to the sidewall of the metal wall 16 in the internal wall of the metal wall 16 as mentioned above.

Also, as shown in FIG. 3 and FIG. 6, an air gap is provided between the input stripline 19a and the metal wall 16. Since the air layer 23 is formed between the top surface of the input stripline 19a, and the metal walls 16, reduction of impedance is avoided.

Similarly, as shown in FIGS. 3, 4 and 6, an air gap 23 is disposed between the output stripline 19b and the metal wall 16. Since the air layer 23 is formed between the top surface of the output stripline 19b and the metal walls 16, reduction of impedance is avoided.

Also, in the package 1 according to the first embodiment, the lower layer feed through (20i, 20o) includes the inside lower layer feed through 20i disposed at the inside of the metal wall 16, and the outside lower layer feed through 20o disposed at the outside of the metal wall 16. In plane view, a width WL1 of the inside lower layer feed through 20i disposed along the lines of the metal wall 16 is wider than a width WL2 of the outside lower layer feed through 20o, as above-mentioned.

Also, the package 1 according to the first embodiment may include: an input circuit substrate 26 and an output circuit substrate 28 which are adjoining of the semiconductor device 24 and are disposed on the conductive base plate 200 surrounded by the metal wall 16; an input matching circuit 17 which is disposed on the input circuit substrate 26 and is connected to the input stripline 19a; an output matching circuit 18 which is disposed on the output circuit substrate 28 and is connected to the output stripline 19b; and bonding wires 12 and 14 connect respectively between the semiconductor device 24 and the input matching circuit 17 and the output matching circuit 18. In addition, between the input stripline 19a and the input matching circuits 17 is connected by the bonding wire 11, and between the output stripline 19b and the output matching circuits 18 is connected by the bonding wire 15.

Also, the package 1 according to the first embodiment may include the metal seal ring 14a disposed on the metal wall 16, and the metal cap 10 disposed on the metal seal ring 14a.

(High Frequency Terminal Structure)

According to the first embodiment, the air layers 23 are formed respectively at the top surfaces of the signal lines of the input stripline 19a and the output stripline 19b of the portion surrounded by the metal wall 16, and thereby reduction of impedance is avoidable. As a result, it can obtain the high frequency terminal structure whose impedance matching is satisfactory, reflection loss is controlled, and characteristics of the electric power resistance.

(Fabrication Method of Package)

As shown in FIG. 1, a fabrication method of the package according to the first embodiment includes: forming the conductive base plate 200; forming the metal wall 16 on the conductive base plate 200; forming the through-holes 34 at the respective input and output portions of the metal wall 16; forming the lower layer feed throughs (20i and 20o) on the conductive base plate 200; forming the wiring patterns 19a and 19b on the lower layer feed through 20i and 20o; forming the upper layer feed throughs 22 on a part of the lower layer feed throughs (20i and 20o) and a part of the wiring patterns 19a and 19b; and forming the terminals 21a and 21b on the wiring pattern 19a and 19b.

The fabrication method of the package according to the first embodiment may further include: forming the input circuit substrate 26 and the output circuit substrate 28 on the conductive base plate 200 surrounded by the metal wall 16 so as to adjoin the semiconductor device 24; forming the input matching circuit 17 connected to the input stripline 19a on the input circuit substrate 26; forming the output matching circuit 18 connected to the output stripline 19b on the output circuit substrate 28; and forming the bonding wires 12 and 14 for connecting the semiconductor device 24 with the input matching circuit 17 and the output matching circuit 18.

The fabrication method for the package according to the first embodiment may further include: forming the metal seal ring 14a on the metal wall 16; and forming the metal cap 10 on the metal seal ring 14a.

(Feed Through Structure)

Figure 7:
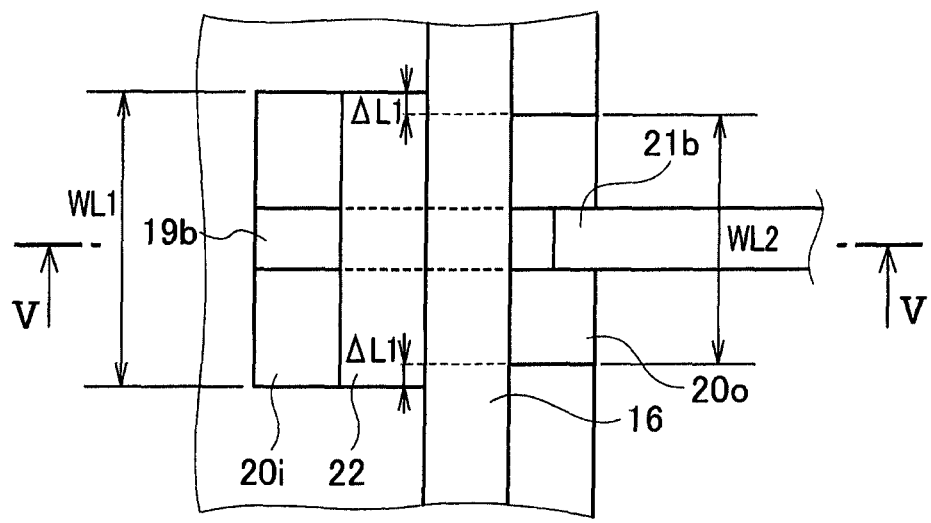
FIG. 7 is a schematic planar pattern configuration diagram showing by enlarging a feed through structure near an output terminal of the package according to the first embodiment.
Figure 8:
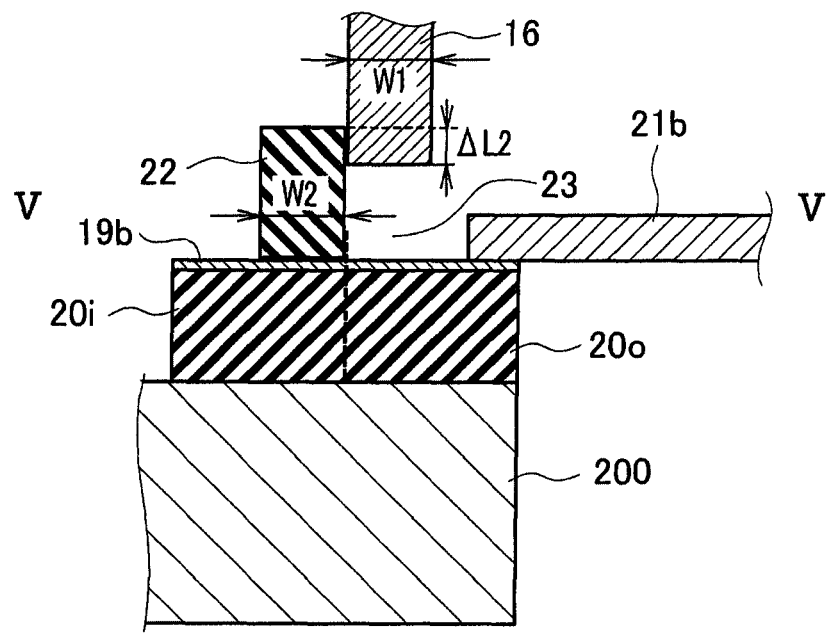
FIG. 8 is a cross-sectional structure showing by enlarging the feed through structure near the output terminal of the package according to the first embodiment, and is a schematic cross-sectional structure diagram taken in the line V-V of FIG. 7.

A schematic planar pattern configuration showing by enlarging the feed through structure near the output terminal of the package 1 according to the first embodiment is expressed as shown in FIG. 7. Also, a schematic cross-sectional structure taken in the line V-V of FIG. 7 is expressed as shown in FIG. 8.

As shown in FIG. 7, the following formula is satisfied: WL1−WL2=2ΔL1 where WL1 is the width of the inside lower layer feed through 20i disposed along the lines of the metal wall 16 in plane view, WL2 is the width of the outside lower layer feed through 20o disposed along the lines of the metal wall 16 in plane view, and ΔL1 is the horizontal overlap width between the inside lower layer feed through 20i and the metal wall 16 in plane view, as mentioned above. Also, Δ2 is the lengthwise overlap width between the upper layer feed through 22 and the metal wall 16, in FIG. 8.

In the package 1 according to the first embodiment, the outside lower layer feed throughs 20o are surrounded by the metal wall 16, and the upper layer feed throughs 22 are adhered to the sidewall of the metal wall 16, and thereby the air layers 23 are formed respectively at the top surfaces of the signal lines of input stripline 19a and the output stripline 19b. Accordingly, reduction of impedance is avoided.

For example, if the feed through structure (comparative example) by which each of the top surfaces of the signal lines of input stripline 19a and the output stripline 19b is surrounded by the metal outer wall is compared with the feed through structure of the package 1 according to the first embodiment by which each of the air layers 23 is formed at each of the top surfaces of the signal lines of the input stripline 19a and the output stripline 19b, the ratio of reduction of impedance is about 40% according to the comparative example, for example. On the other hand, according to the package 1 according to the first embodiment, since each of the air layers 23 is formed at each of the top surfaces of the signal lines of input stripline 19a and the output stripline 19b of the portion surrounded by the metal wall 16, the reduction of impedance is avoidable. As a result, it can obtain the feed through structure whose impedance matching is satisfactory, reflection loss is controlled, and characteristics of the electric power resistance.

Also, in the configuration example of the package 1 according to the first embodiment, the thickness W2 of the upper layer feed through 22 may be formed of the same grade with (or formed widely than) the thickness W1 of the metal wall 16.

(Configuration of Semiconductor Device)

Figure 9A:
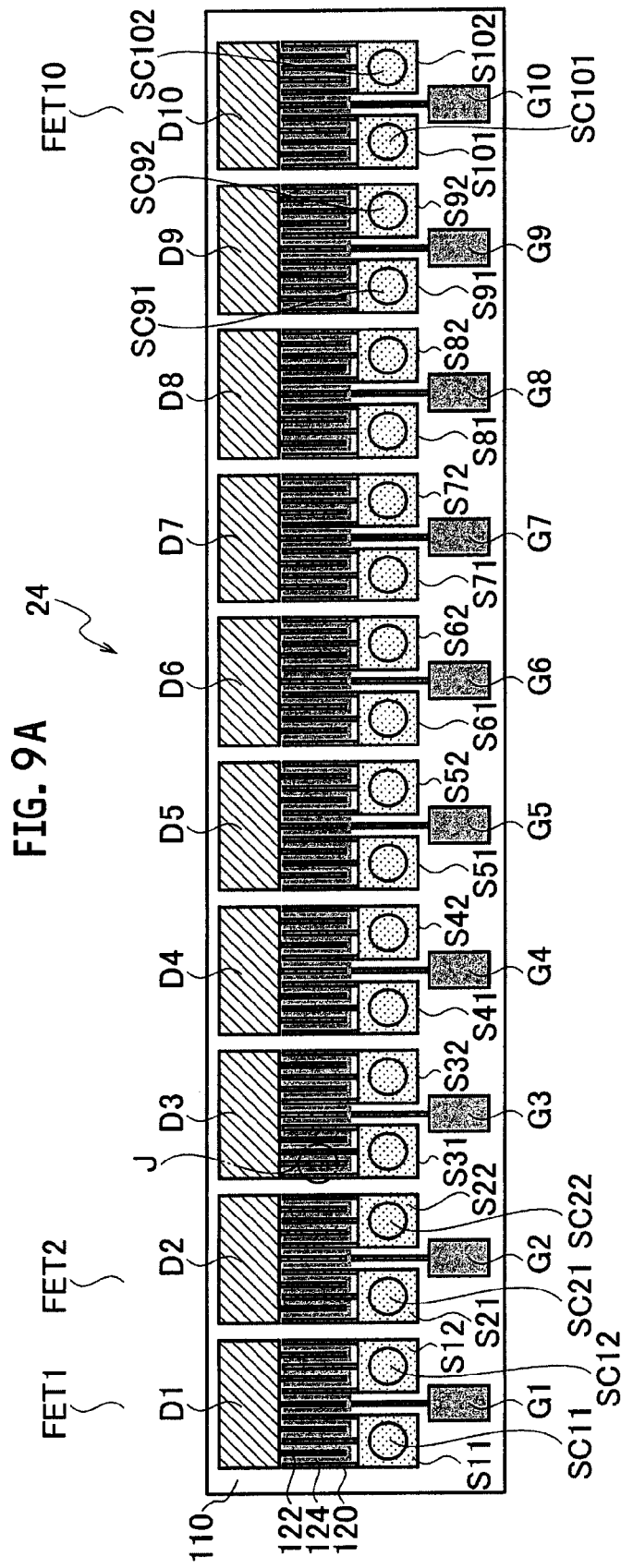
FIG. 9A shows an example of schematic planar pattern configuration of a semiconductor device which can be mounted in the package according to the first embodiment.
Figure 9B:
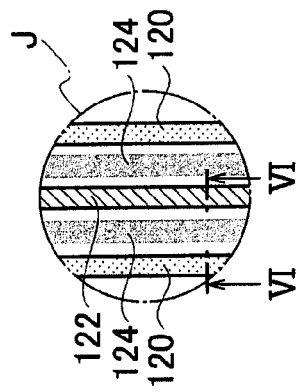
FIG. 9B is an enlarged drawing of a part J of FIG. 9A.

A schematic planar pattern configuration of the semiconductor device 24 which can be mounted on the package according to the first embodiment is expressed as shown in FIG. 9A, and an enlarged drawing of a part J of FIG. 9A is expressed as shown in FIG. 9B. Also, configuration examples 1-4 of the semiconductor device 24 which can be mounted on the package according to the first embodiment, and schematic cross-sectional configuration examples 1-4 taken in the line VI-VI of FIG. 9B are expressed as shown in FIG. 10 to FIG. 13, respectively.

As shown in FIG. 9 to FIG. 13, in the semiconductor chip 24 mounted in the semiconductor device according to the embodiment, a plurality of FET cells FET1 to FET10 include: a semi-insulating substrate 110; a gate finger electrode 124, a source finger electrode 120, and a drain finger electrode 122 which are disposed on a first surface of the semi-insulating substrate 110, and have a plurality of fingers, respectively; a plurality of gate terminal electrodes G1, G2, . . . , G10, a plurality of source terminal electrodes S11, S12, S21, S22, . . . , S101, and S102 and the drain terminal electrodes D1, D2, . . . , D10 which are disposed on the first surface of the semi-insulating substrate 110, and ties a plurality of fingers, respectively every the gate finger electrode 124, the source finger electrode 120, and the drain finger electrode 122; VIA holes SC11, SC12, SC21, SC22, . . . , SC101, and SC102 disposed at the lower part of the source terminal electrodes S11, S12, S21, S22, . . . , S101, and S102; and a ground electrode (not shown) which is disposed on a second surface of the opposite side of a first surface of the semi-insulating substrate 110, and is connected via the VIA holes SC11, SC12, SC21, SC22, . . . , SC101, and SC102 to the source terminal electrodes S11, S12, S21, S22, . . . , S101, and S102.

The bonding wire 12 is connected to the gate terminal electrodes G1, G2, . . . , G10, as already shown in FIG. 2, and the bonding wire 14 is connected to the drain terminal electrodes D1, D2, . . . , D10. The source terminal electrodes S11, S12, S21, S22, . . . , S101, and 5102 are connected to the ground electrode (not shown), via the barrier metal layers (not shown) formed in the internal wall of the VIA holes SC11, SC12, SC21, SC22, . . . , SC101 and SC 102, and via the filling metal layers (not shown) formed on the barrier metal layers and filled up with the VIA holes.

The semi-insulating substrate 110 is either of a GaAs substrate, an SiC substrate, a GaN substrate, a substrate in which a GaN epitaxial layer is formed on the SiC substrate, a substrate which a heterojunction epitaxial layer composed of GaN/AlGaN is formed on the SiC substrate, a sapphire substrate or a diamond substrate.

Constructional Example 1

Figure 10:
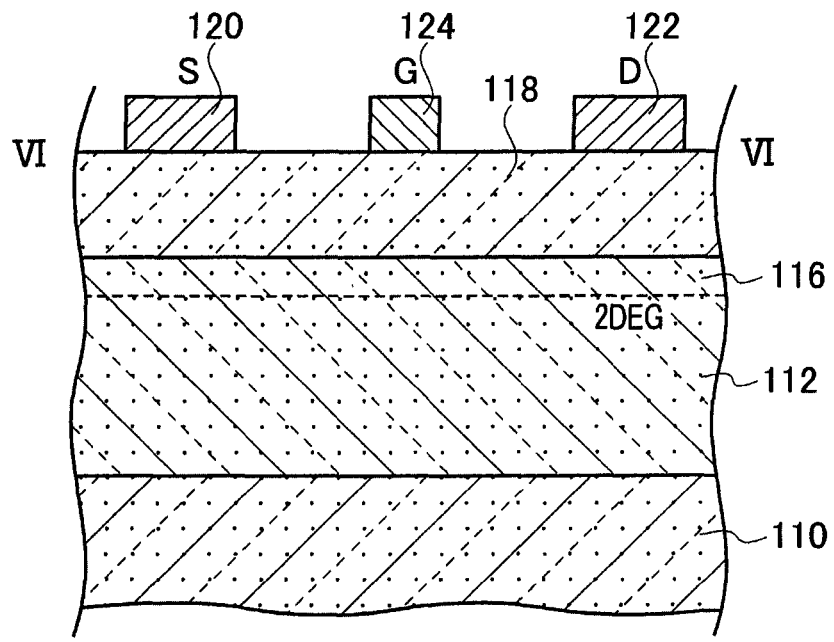
FIG. 10 shows a constructional example 1 of the semiconductor device which can be mounted in the package according to the first embodiment, and is a schematic cross-sectional structure diagram taken in the line VI-VI of FIG. 9B.

As shown in FIG. 10, a configuration example 1 of an FET cell of the semiconductor device 24 which can be mounted in the package according to the first embodiment includes: a semi-insulating substrate 110; a nitride based compound semiconductor layer 112 disposed on the semi-insulating substrate 110; an aluminum gallium nitride layer ($Al_xGa_{1-x}N$) (where $0.1 \leq x \leq 1$) 118 disposed on the nitride based compound semiconductor layer 112; and a source finger electrode (S) 120, a gate finger electrode (G) 124, and a drain finger electrode (D) 122 which are disposed on the aluminum gallium nitride layer ($Al_xGa_{1-x}N$) (where $0.1<=x<=1$) 118. A two dimensional electron gas (2DEG) layer 116 is formed in an interface between the nitride based compound semiconductor layer 112 and the aluminum gallium nitride layer ($Al_xGa_{1-x}N$) (where $0.1<=x<=1$) 118. FIG. 10 shows a High Electron Mobility Transistor (HEMT) as the constructional example 1.

Constructional Example 2

Figure 11:
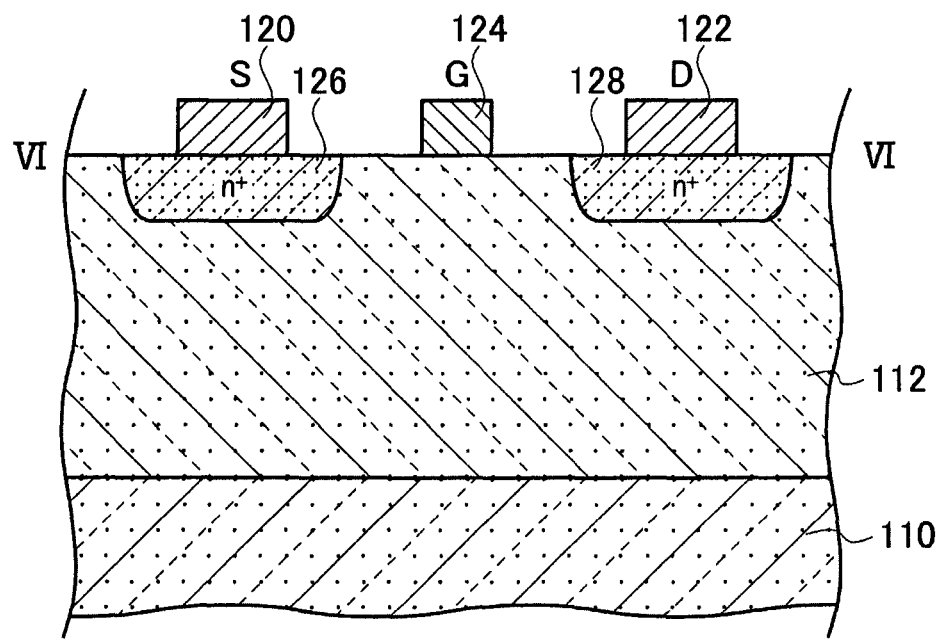
FIG. 11 shows a constructional example 2 of the semiconductor device which can be mounted in the package according to the first embodiment, and is a schematic cross-sectional structure diagram taken in the line VI-VI of FIG. 9B.

As shown in FIG. 11, a configuration example 2 of an FET cell of the semiconductor device 24 which can be mounted in the package according to the first embodiment includes: a semi-insulating substrate 110; a nitride based compound semiconductor layer 112 disposed on the semi-insulating substrate 110; a source region 126 and a drain region 128 which are disposed on the nitride based compound semiconductor layer 112; and a source finger electrode (S) 120 disposed on the source region 126, a gate finger electrode (G) 124 disposed on the nitride based compound semiconductor layer 112, and a drain finger electrode (D) 122 disposed on the drain region 128. Schottky contact is formed in the interface between the nitride based compound semiconductor layer 112 and the gate finger electrode (G) 124. FIG. 11 shows a Metal Semiconductor Field Effect Transistor (MESFET) as the constructional example 2.

Constructional Example 3

Figure 12:
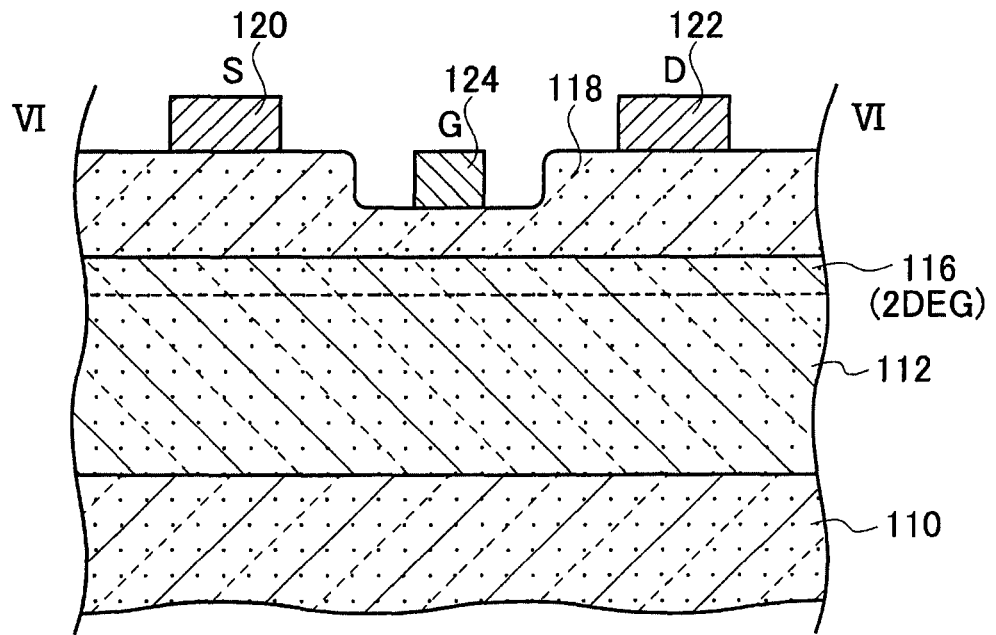
FIG. 12 shows a constructional example 3 of the semiconductor device which can be mounted in the package according to the first embodiment, and is a schematic cross-sectional structure diagram taken in the line VI-VI of FIG. 9B.

As shown in FIG. 12, a configuration example 3 of an FET cell of the semiconductor device 24 which can be mounted in the package according to the first embodiment includes: a semi-insulating substrate 110; a nitride based compound semiconductor layer 112 disposed on the semi-insulating substrate 110; an aluminum gallium nitride layer ($Al_xGa_{1-x}N$) (where $0.1<=x<=1$) 118 disposed on the nitride based compound semiconductor layer 112; a source finger electrode (S) 120 and a drain finger electrode (D) 122 which are disposed on the aluminum gallium nitride layer ($Al_xGa_{1-x}N$) (where $0.1<=x<=1$) 118; and a gate finger electrode (G) 124 disposed at a recessed part on the aluminum gallium nitride layer ($Al_xGa_{1-x}N$) (where $0.1<=x<=1$) 118. A 2DEG layer 116 is formed in an interface between the nitride based compound semiconductor layer 112 and the aluminum gallium nitride layer ($Al_xGa_{1-x}N$) (where $0.1<=x<=1$) 118. FIG. 12 shows HEMT as the constructional example 3.

Constructional Example 4

Figure 13:
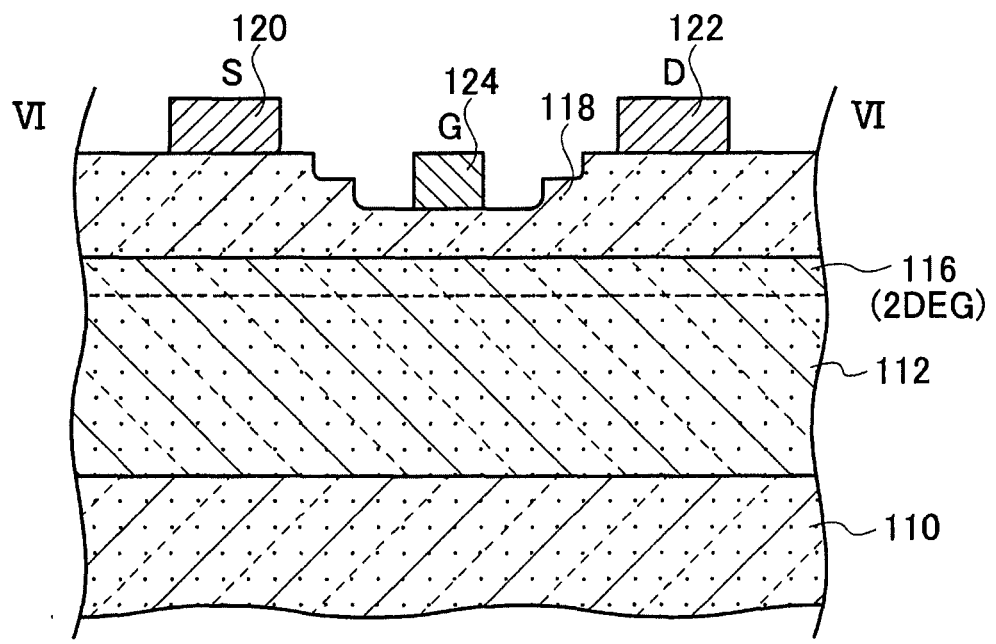
FIG. 13 shows a constructional example 4 of the semiconductor device which can be mounted in the package according to the first embodiment, and is a schematic cross-sectional structure diagram taken in the line VI-VI of FIG. 9B.
Figure 14A:
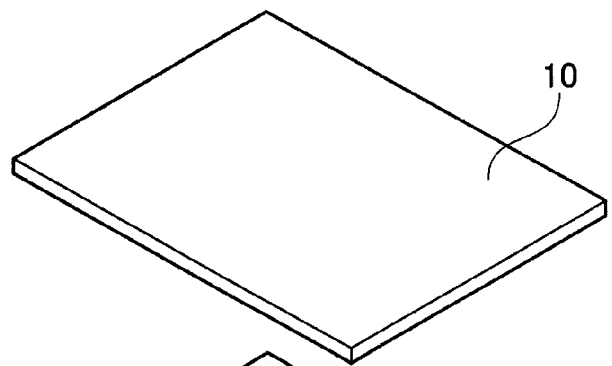
FIG. 14A is a schematic bird's-eye view showing a package according to a second embodiment, and is a schematic configuration diagram showing a metal cap 10.
Figure 14B:
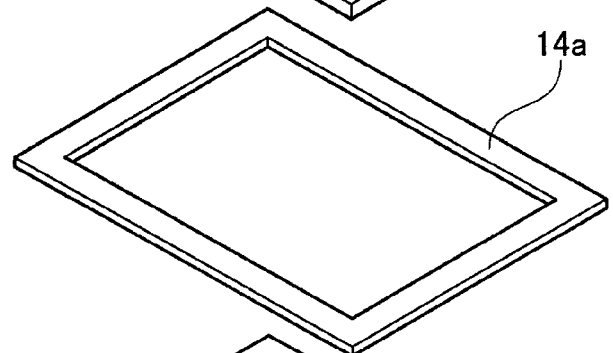
Figure 14C:
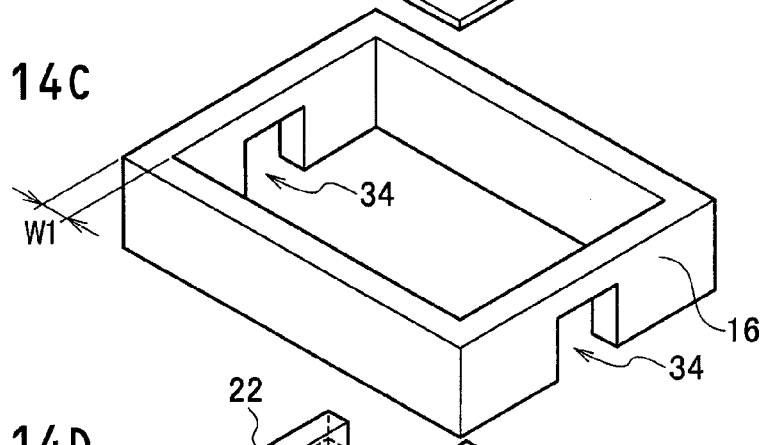
FIG. 14C is a schematic bird's-eye view showing the package according to the second embodiment, and is a schematic configuration diagram showing a metal wall 16.
Figure 14D:
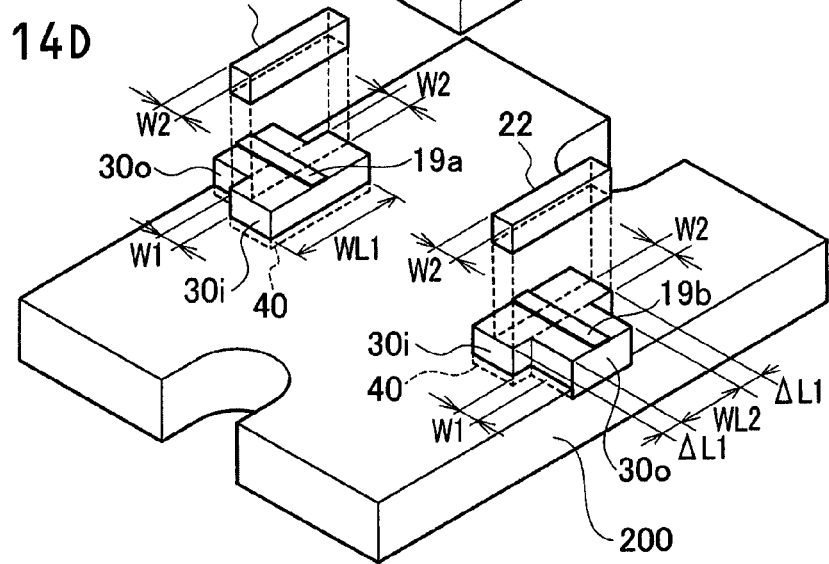
FIG. 14D is a schematic bird's-eye view showing the package according to the second embodiment, and is a schematic configuration diagram showing a lower layer feed through (30i and 30o) on a conductive base plate 200 including a counter boring unit 40, an input stripline 19a and an output stripline 19b on the lower layer feed through (30i and 30o), and upper layer feed through 22 on the lower layer feed through 30i.

As shown in FIG. 13, a configuration example 4 of an FET cell of the semiconductor device 24 which can be mounted in the package according to the first embodiment includes: a semi-insulating substrate 110; a nitride based compound semiconductor layer 112 disposed on the semi-insulating substrate 110; an aluminum gallium nitride layer ($Al_xGa_{1-x}N$) (where $0.1<=x<=1$) 118 disposed on the nitride based compound semiconductor layer 112; a source finger electrode (S) 120 and a drain finger electrode (D) 122 which are disposed on the aluminum gallium nitride layer ($Al_xGa_{1-x}N$) (where $0.1<=x<=1$) 118; and a gate finger electrode 124 (G) disposed at a two-step recessed part on the aluminum gallium nitride layer ($Al_xGa_{1-x}N$) (where $0.1<=x<=1$) 118. A 2DEG layer 116 is formed in an interface between the nitride based compound semiconductor layer 112 and the aluminum gallium nitride layer ($Al_xGa_{1-x}N$) (where $0.1<=x<=1$) 118. FIG. 13 shows HEMT as the constructional example 4.

Moreover, in the above-mentioned constructional examples 1-4, the nitride based compound semiconductor layer 112 except an active area is electrically used as an inactivity isolation region. Here, the active area is composed of the source finger electrode 120, the 2DEG layer 116 directly under the gate finger electrode 124 and the drain finger electrode 122, and the 2DEG layer 116 between the source finger electrode 120 and the gate finger electrode 124 and between the drain finger electrode 122 and the gate finger electrode 124.

As another fabrication method of the isolation region, it can also form by ion implantation to a part of depth direction of the aluminum gallium nitride layer ($Al_xGa_{1-x}N$) (where $0.1<=x<=1$) 18 and the nitride based compound semiconductor layer 112. As ion species, nitrogen (N), argon (Ar), etc. are applicable, for example. Moreover, the amount of dosage with the ion implantation is about $1\times10^{14}$ (ions/$cm^2$), for example, and accelerating energy is about 100 keV to 200 keV, for example.

On the isolation region and the device surface, an insulating layer for passivation (not shown) is formed. As the insulating layer, it can be formed of a nitride film, an alumina ($Al_2O_3$) film, an oxide film ($SiO_2$), an oxynitriding film (SiON), etc. deposited by a Plasma Enhanced Chemical Vapor Deposition (PECVD) method, for example.

The source finger electrode 120 and the drain finger electrode 122 are formed of Ti/Al etc., for example. The gate finger electrode 124 can be formed, for example of Ni/Au etc.

In addition, in the semiconductor device 24 which can be mounted in the package according to the first embodiment, the pattern length of the longitudinal direction of the gate finger electrode 124, the source finger electrode 120, and the drain finger electrode 122 is set up to be short as operating frequency becomes high such as microwave/millimeter wave/submillimeter wave. For example, in the millimeter wave band, the pattern length is about 25 μm to 50 μm.

Also, the width of the source finger electrode 120 is about 40 μm, for example, and the width of the source terminal electrode S11, S12, S21, S22, . . . , S101, and S102 is about 100 μm, for example. Yet also, the formation width of the VIA holes SC11, SC12, SC21, SC22, . . . , SC101, and SC102 is about 10 μm to about 40 μm, for example.

According to the first embodiment, since the air layer is formed between the top surface of the signal line of the portion surrounded by the metal wall and the metal wall, the reduction of impedance is avoidable. As a result, it can obtain the package whose impedance matching is satisfactory, reflection loss is controlled, and characteristics of the electric power resistance.

According to the first embodiment, in the high airtight package used for a microwave band semiconductor device, it can provide the package which keeps characteristic impedance at 50Ω, without degrading an electric power capability.

Second Embodiment

A schematic bird's-eye view configuration for explaining a package according to a second embodiment is expressed as shown in FIG. 14. FIG. 14A shows a schematic configuration showing a metal cap 10. FIG. 14B shows a schematic configuration showing a metal seal ring 14a. FIG. 14C shows a schematic configuration showing a metal wall 16. FIG. 14D shows a schematic configuration showing a lower layer feed through (30i and 30o) on a conductive base plate 200 provided with a counter boring unit 40, an input stripline 19a and an output stripline 19b on the lower layer feed through (30i and 30o), and an upper layer feed through 22.

A schematic planar pattern configuration of the package 1 according to the second embodiment is similarly expressed as FIG. 2.

Figure 15:
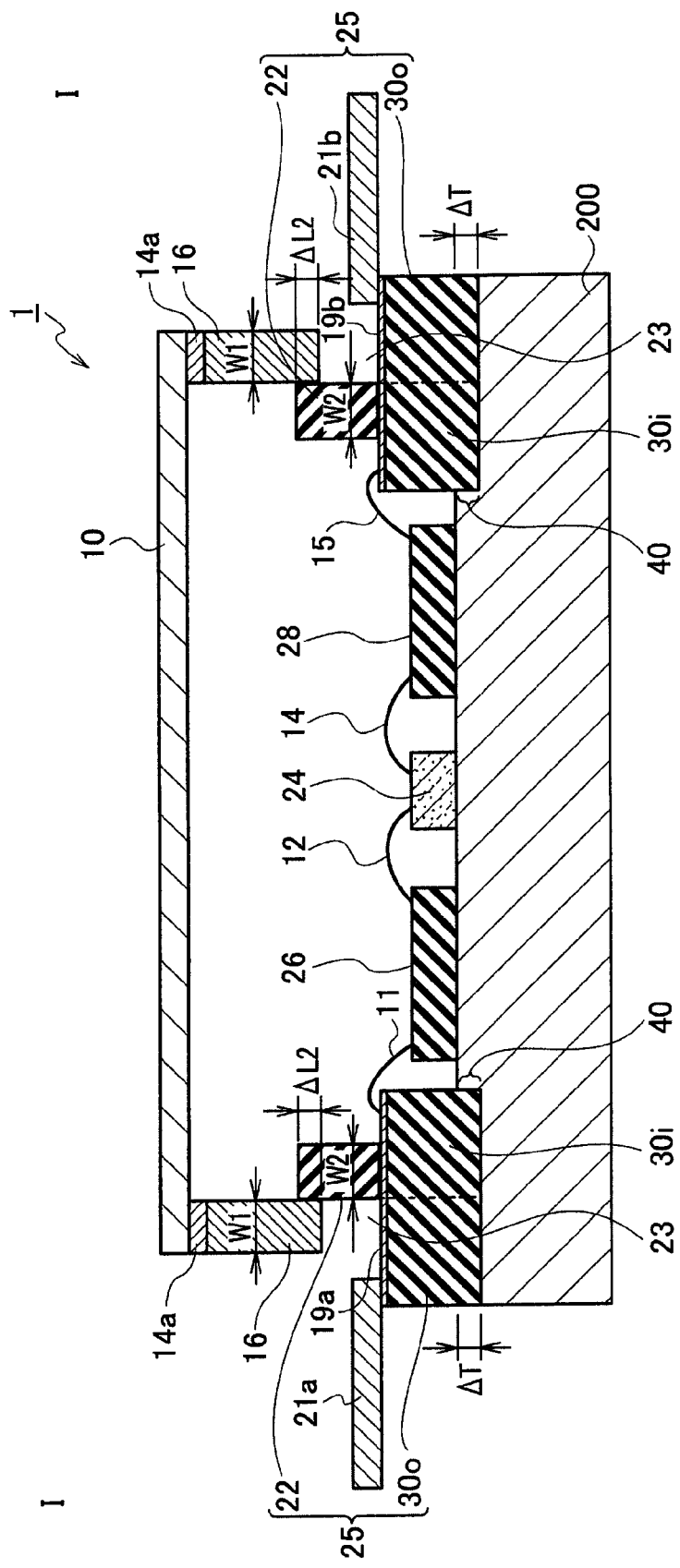
FIG. 15 is a schematic cross-sectional configuration showing the package according to the second embodiment, and is a schematic cross-sectional structure diagram taken in the line I-I of FIG. 2.
Figure 16:
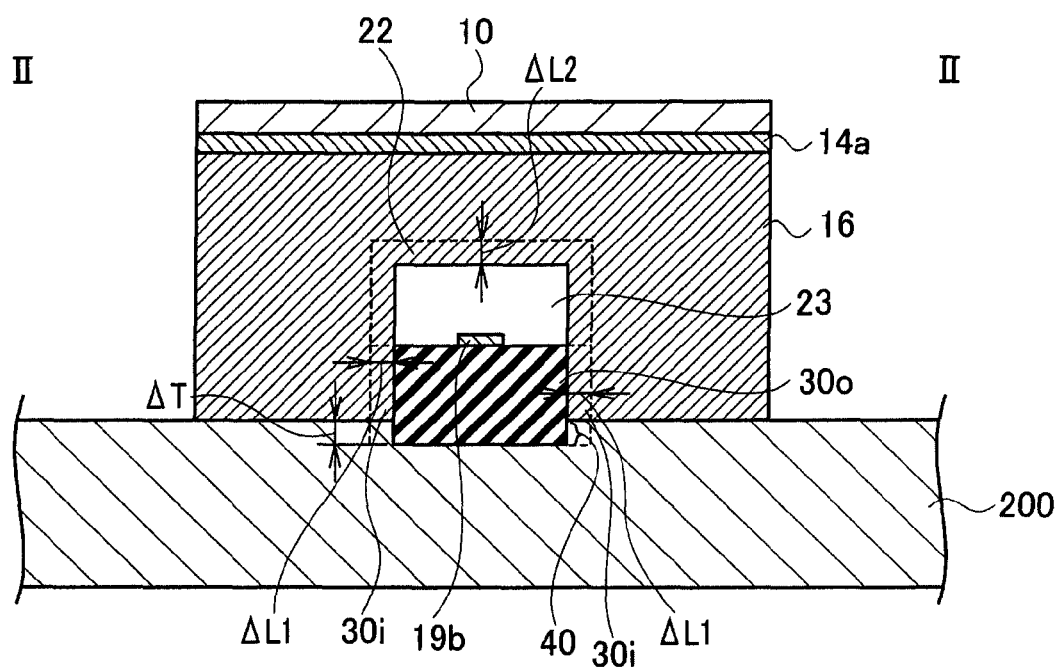
FIG. 16 is a schematic cross-sectional configuration showing the package according to the second embodiment, and is a schematic cross-sectional structure diagram taken in the line II-II of FIG. 2.
Figure 17:
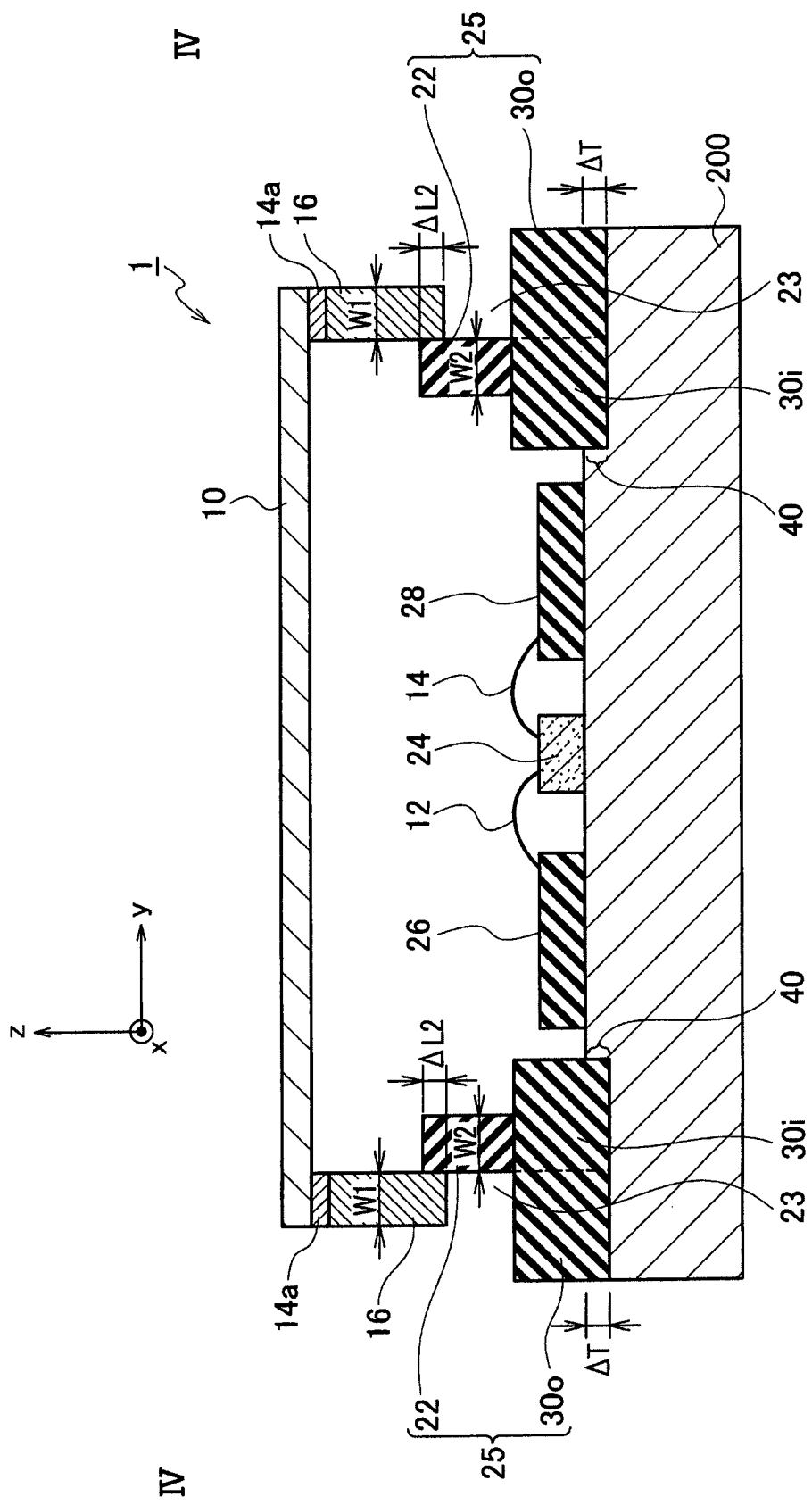
FIG. 17 is a schematic cross-sectional configuration showing the package according to the second embodiment, and is a schematic cross-sectional structure diagram taken in the line IV-IV of FIG. 2.

A schematic cross-sectional configuration of the package according to the second embodiment, and a schematic cross-sectional structure taken in the line I-I of FIG. 2 is expressed as shown in FIG. 15, a schematic cross-sectional structure taken in the line II-II of FIG. 2 is expressed as shown in FIG. 16, and a schematic cross-sectional structure taken in the line IV-IV of FIG. 2 is expressed as shown in FIG. 17. Also in FIG. 7, y axis indicates a direction which the line IV-IV extends, x axis indicates a direction vertical to the drawing sheet, and z axis indicates a direction in parallel to the drawing sheet and vertical to the y axis.

As shown in FIG. 14 to FIG. 17, in the package 1 according to the second embodiment, the conductive base plate 200 includes the counter boring unit 40, and the lower layer feed through (30i and 30o) is disposed on the counter boring unit 40 of the conductive base plate 200. The counter boring depth ΔT of the counter boring unit 40 is about 0.1 mm to 0.5 mm, for example. Duplicating explanation is omitted since other configurations are the same as those of the package according to the first embodiment.

According to the second embodiment, since the lower layer feed through (30i and 30o) can be disposed in the counter boring unit 40 by using the conductive base plate 200 including the counter boring unit 40, it can prevent from a displacement between the convex feed through 25 composed of the lower layer feed through (30i and 30o) and the upper layer feed through 22, and the metal wall 16.

(Configuration of Semiconductor Device)

An example of a schematic planar pattern configuration of the semiconductor device 24 which can be mounted in the package according to the second embodiment is similarly expressed as FIG. 9A and FIG. 9B. Also, configuration examples 1-4 of the semiconductor device 24 which can be mounted in the package according to the second embodiment are similarly expressed as FIG. 10 to FIG. 13, respectively.

In addition, examples of schematic planar pattern configurations of the semiconductor devices 24 which can be mounted in the packages according to third to twelfth embodiments described later are similarly expressed as FIG. 9A and FIG. 9B. Also, configuration examples 1-4 of the semiconductor devices 24 which can be mounted in the packages according to the third to twelfth embodiments are similarly expressed as FIG. 10 to FIG. 13, respectively. Therefore, the duplicating explanation will be omitted.

(High Frequency Terminal Structure)

According to the high frequency terminal structure according to the second embodiment, the air layers 23 are formed respectively at the top surfaces of the signal lines of the input stripline 19a and the output stripline 19b of the portion surrounded by the metal wall 16, and thereby reduction of impedance is avoidable. As a result, it can obtain the high frequency terminal structure whose impedance matching is satisfactory, reflection loss is controlled, and characteristics of the electric power resistance.

(Fabrication Method of Package)

A fabrication method for the package according to the second embodiment includes forming the counter boring unit 40 on the conductive base plate 200, as shown in FIG. 14. In this case, the counter boring unit 40 can be formed by implementing dry etching or wet etching, for example to the conductive base plate 200. Alternatively, the counter boring unit 40 may be formed beforehand in the formation process of the conductive base plate 200.

Therefore, in the fabrication method for the package according to the second embodiment, the step of forming the lower layer feed through (30i and 30o) includes forming the lower layer feed through (30i and 30o) on the counter boring unit 40 of the conductive base plate 200. Duplicating explanation is omitted since other steps are the same as those of the fabrication method for the package according to the first embodiment.

According to the second embodiment, since the air layer is formed between the top surface of the signal line of the portion surrounded by the metal wall and the metal wall, the reduction of impedance is avoidable. As a result, it can obtain the package whose impedance matching is satisfactory, reflection loss is controlled, and characteristics of the electric power resistance.

According to the second embodiment, it can provide the high airtight package which can prevent the displacement between the convex feed through and the metal wall, by using the conductive base plate including the counter boring unit.

According to the second embodiment, in the high airtight package used for a microwave band semiconductor device, it can provide the package which keeps characteristic impedance at 50Ω, without degrading an electric power capability.

Third Embodiment

Package Structure

A schematic bird's-eye view configuration of a package according to a third embodiment is expressed as shown in FIG. 18. FIG. 18A shows a schematic configuration showing a metal cap 10. FIG. 18B shows a schematic configuration showing a metal seal ring 14a. FIG. 18C shows a schematic configuration showing a metal wall 16. FIG. 18D shows a schematic configuration of a lower layer feed through (20i and 20o) on a conductive base plate 200, an input stripline 19a and an output stripline 19b on the lower layer feed through (20i and 20o), and an upper layer feed through 22 on the lower layer feed through 20i.

As shown in FIG. 18, the package according to the third embodiment includes: a metal cap 10; a metal seal ring 14a; a metallic wall 16; a conductive base plate 200; lower layer feed throughs (20i and 20o) disposed on the conductive base plate 200; an input stripline 19a and an output stripline 19b disposed respectively on the lower layer feed throughs (20i and 20o); and upper layer feed throughs 22 disposed respectively on the inside lower layer feed throughs 20i.

Figure 18A:
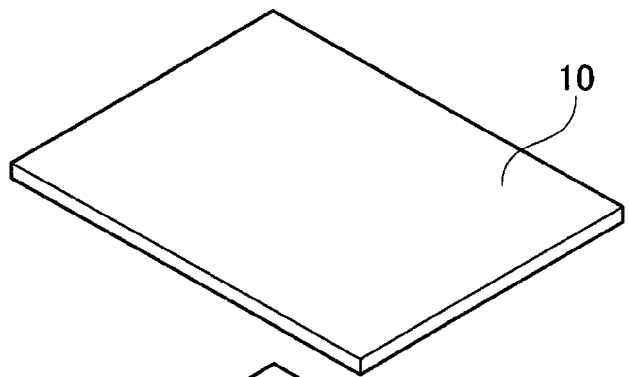
FIG. 18A is a schematic bird's-eye view showing a package according to a third embodiment, and is a schematic configuration diagram showing a metal cap 10.
Figure 18B:
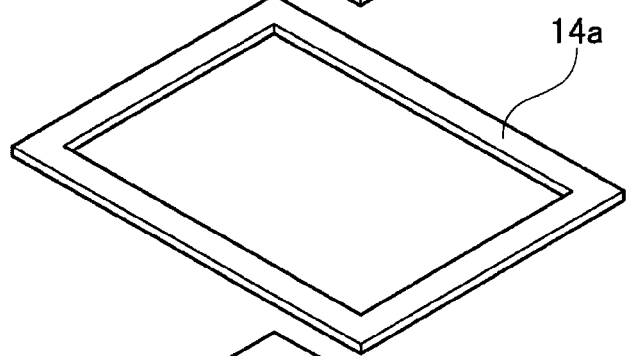
Figure 18C:
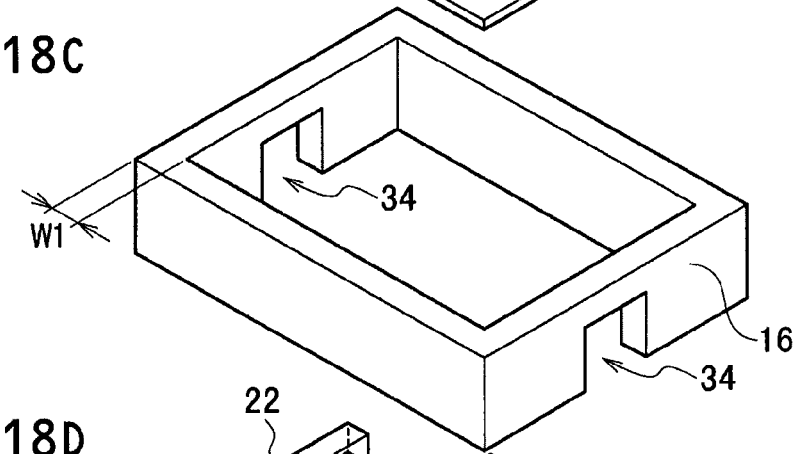
FIG. 18C is a schematic bird's-eye view showing the package according to the third embodiment, and is a schematic configuration diagram showing a metal wall 16.
Figure 18D:
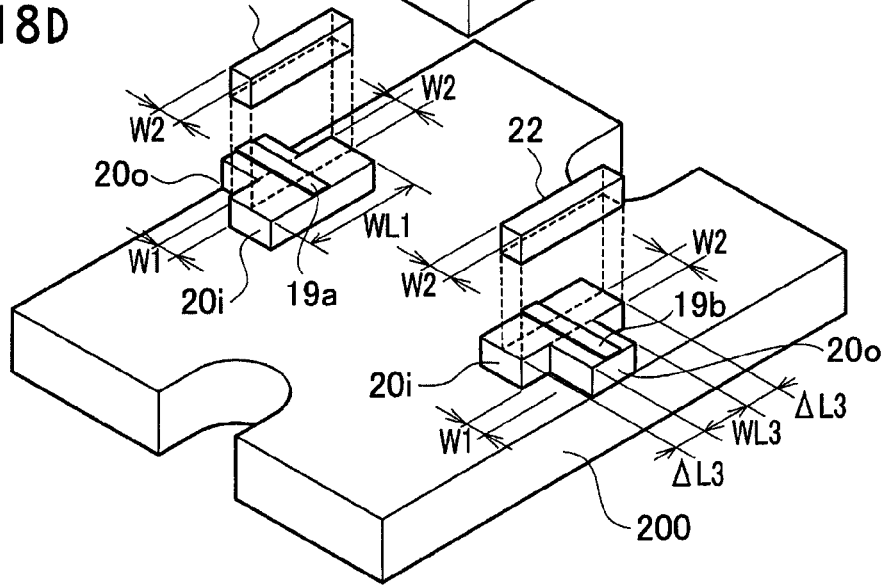
FIG. 18D is a schematic bird's-eye view showing the package according to the third embodiment, and is a schematic configuration diagram showing a lower layer feed through (20i and 20o) on a conductive base plate 200, an input stripline 19a and an output stripline 19b on the lower layer feed through (20i and 20o), and an upper layer feed through 22 on the lower layer feed through 20i.

As shown in FIG. 18D, a width WL1 of the inside lower layer feed through 20i and the upper layer feed through 22 disposed the inside of the metal wall 16 is formed more widely than a width of the through-hole 34 of the metal wall 16. In this case, WL1−WL3=2ΔL3, for example, as shown in FIG. 18. Thus, the inside lower layer feed through 20i and the upper layer feed through 22 can be contacted on the side surface of the metal wall 16, by forming the width WL1 of the inside lower layer feed through 20i more widely than the width of the through-hole 34 of the metal wall 16, thereby securing airtightness. Also, an air gap is provided between the input stripline 19a and the metal wall 16. Since the air layer 23 is formed between the top surface of the input stripline 19a, and the metal wall 16, reduction of impedance is avoidable.

Figure 20:
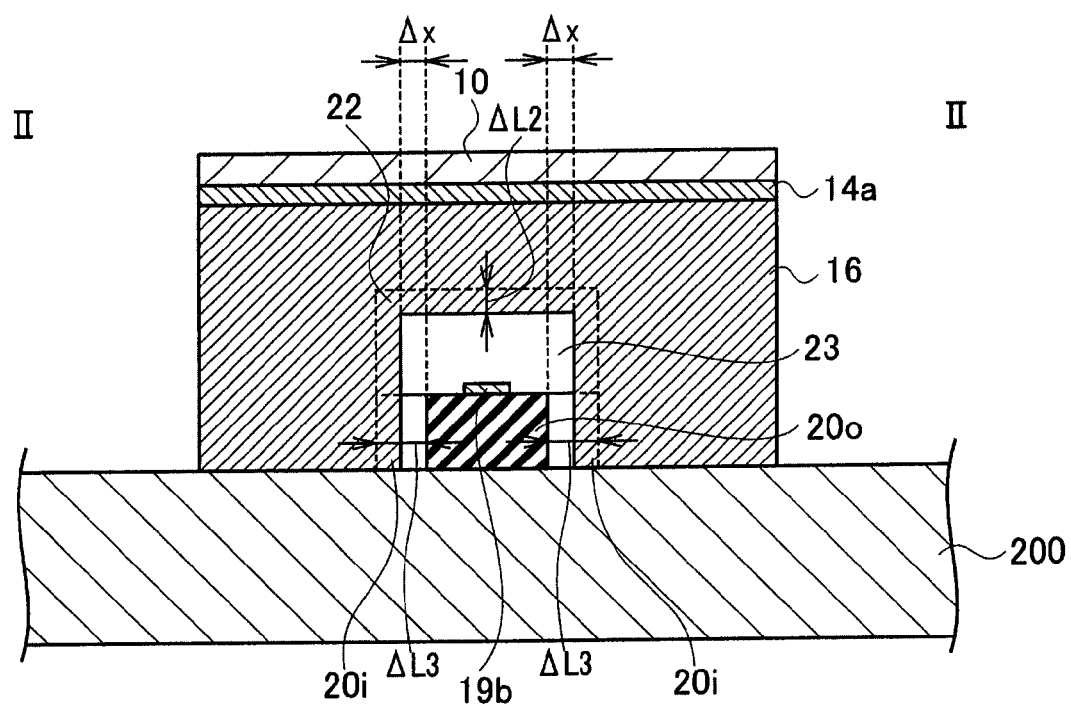
FIG. 20 is a schematic cross-sectional configuration showing the package according to the third embodiment, and is a schematic cross-sectional structure diagram taken in the line II-II of FIG. 19.

Yet also, as shown in FIG. 20, an air gap is provided between the input stripline 19b and the metal wall 16. Since the air layer 23 is formed between the top surface of the output stripline 19b, and the metal wall 16, reduction of impedance is avoidable.

In the third embodiment, a width WL3 of the outside lower layer feed through 20o is formed still smaller than the width WL2 of the outside lower layer feed through 20o in the first embodiment. That is, the width WL3 of the outside lower layer feed through 20o is set up to WL3<WL2, thereby giving the gap between the metal wall 16 and the outside lower layer feed through 20o.

Since the metal wall 16 does not contact the side surface of the through-hole 34 by giving such a gap between the metal wall 16 and the outside lower layer feed through 20o, an impedance of the input stripline 19a on the outside lower layer feed through 20o can be kept highly. Moreover, since the outside lower layer feed through 20o is not subject to a stress from the metal wall 16, it can reduce a possibility that a stress crack will occur in the outside lower layer feed through 20o.

Duplicating explanation is omitted since other configurations are the same as those of the first embodiment.

(Plane Pattern Configuration)

Figure 19:
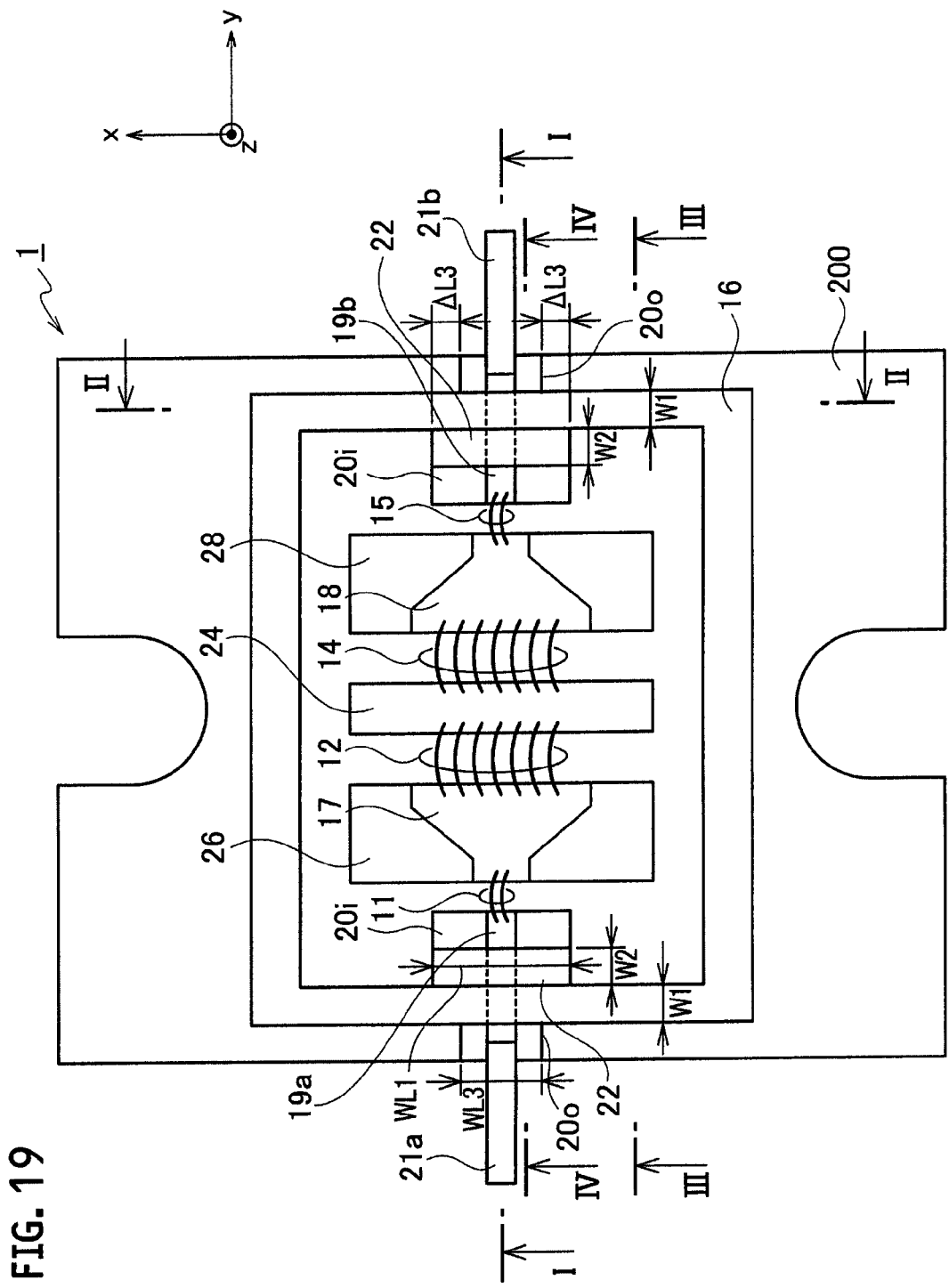
FIG. 19 is a schematic planar pattern configuration diagram showing the package according to the third embodiment.

A schematic planar pattern configuration of the package 1 according to the third embodiment is expressed as shown in FIG. 19. Also, a schematic cross-sectional structure taken in the line I-I of FIG. 19 is similarly expressed as FIG. 3.

Moreover, a schematic cross-sectional structure taken in the line II-II of FIG. 19 is expressed as shown in FIG. 20, and a schematic cross-sectional structure taken in the line III-III of FIG. 19 is similarly expressed as FIG. 5. Also, a schematic cross-sectional structure taken in the line IV-IV of FIG. 19 is similarly expressed as FIG. 6. In FIG. 19, y axis indicates a direction which the line I-I extends, x axis indicates a direction in parallel to the drawing sheet and vertical to the y axis, and z axis indicates a direction vertical to the drawing sheet.

As shown in FIG. 18 to FIG. 21, the package according to the third embodiment includes: a conductive base plate 200; a metal wall 16 disposed on the conductive base plate 200; through-holes 34 formed at both the input and output portions of the metal wall 16; lower layer feed throughs (20i and 20o) disposed on the conductive base plate 200; wiring patterns 19a and 19b disposed respectively on the lower layer feed throughs (20i and 20o); upper layer feed throughs 22 disposed respectively on a part of the lower layer feed throughs (20i and 20o) and a part of the wiring patterns 19a and 19b; and terminals 21a and 21b disposed respectively on the wiring pattern 19a and 19b. In this case, a width of a part of the lower layer feed through 20 is wider than a width of the through-hole 34, and the lower layer feed throughs (20i and 20o) are adhered to the metal wall 16 side surface. Also, a width of the upper layer feed throughs 22 is wider than the width of the through-hole 34, and the upper layer feed throughs 22 are adhered to the metal wall 16 side surface. Accordingly, air layers 23 are formed respectively between the wiring patterns 19a and 19b and the internal wall of the through-holes 34.

Moreover, the upper layer feed through 22 and the lower layer feed through 20 are adhered to the inside of the metal wall 16.

Also, a semiconductor device 24 is disposed on the conductor plate 200, and the metal wall 16 disposed on the conductive base plate 200 houses the semiconductor device 24.

Figure 21:
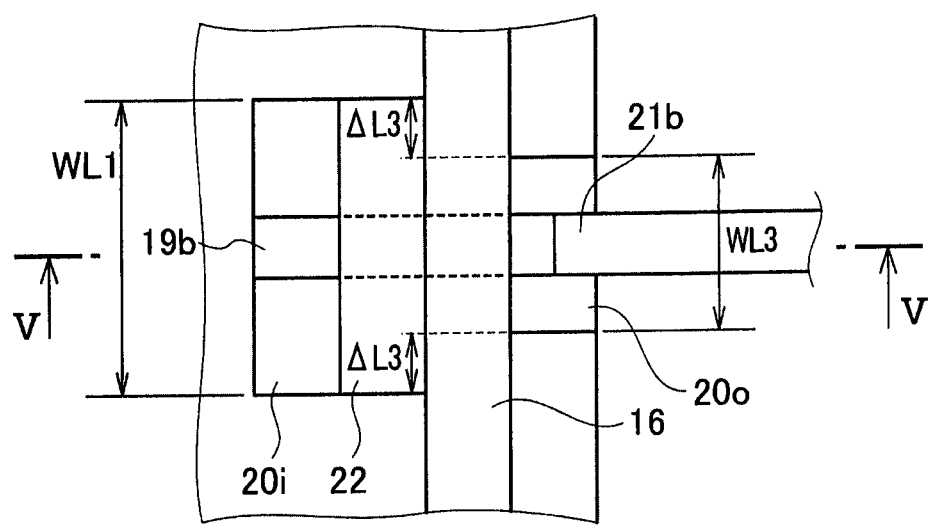
FIG. 21 is a schematic planar pattern configuration diagram showing by enlarging a feed through structure near an output terminal of the package according to the third embodiment.
Figure 22A:
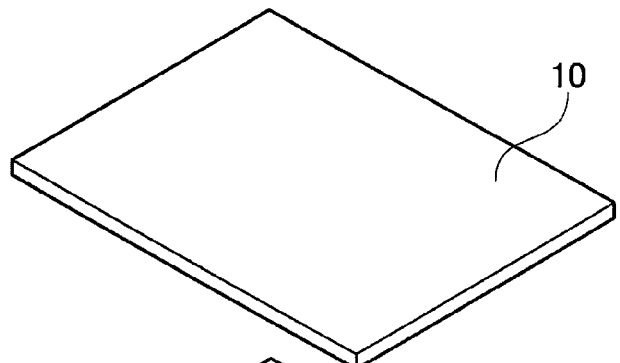
FIG. 22A is a schematic bird's-eye view showing a package according to a fourth embodiment, and is a schematic configuration diagram showing a metal cap 10.
Figure 22B:
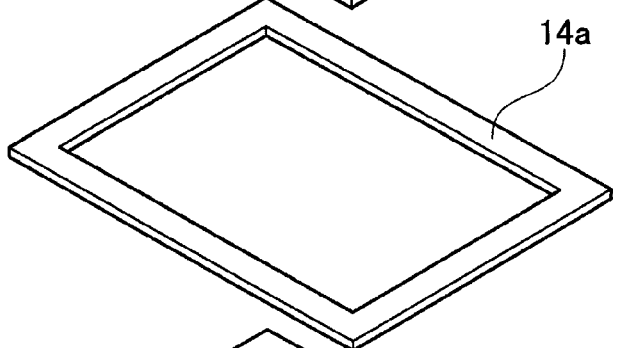
Figure 22C:
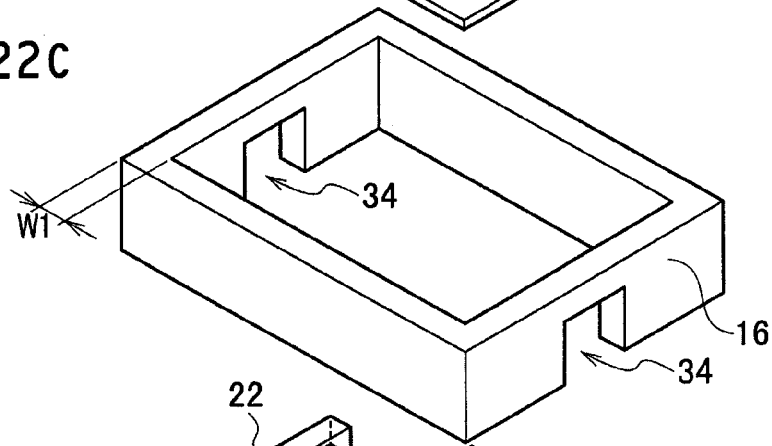
FIG. 22C is a schematic bird's-eye view showing the package according to the fourth embodiment, and is a schematic configuration diagram showing a metal wall 16.
Figure 22D:
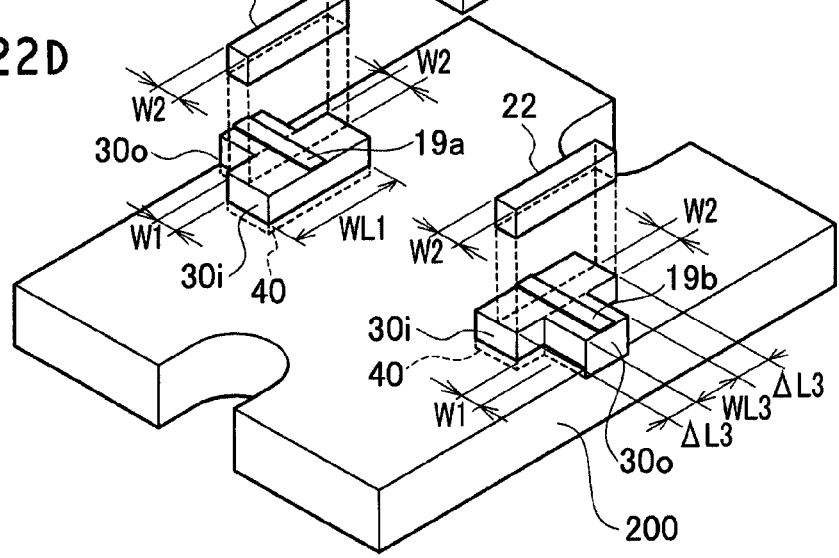
FIG. 22D is a schematic bird's-eye view showing the package according to the fourth embodiment, and is a schematic configuration diagram showing a lower layer feed through (30i and 30o) on a conductive base plate 200 including a counter boring unit 40, an input stripline 19a and an output stripline 19b on the lower layer feed through (30i and 30o), and an upper layer feed through 22 on the lower layer feed through 30i.

As shown in FIGS. 19 and 21, terminals 21a and 21b are disposed respectively out of the through-holes 34.

In the package 1 according to the third embodiment, the air layer 23 is formed between the sidewall of the lower layer feed through 20o, and the internal wall of the through-hole 34. That is, as shown in FIG. 20, in the package 1 according to the third embodiment, the outside lower layer feed through 20o has the air layer 23 formed between the outside lower layer feed through 20o and the through-holes 34 of the metal wall 16, without contacting the through-hole 34 of the metal wall 16.

As shown in FIG. 20, a lengthwise overlap width between the metal wall 16 and the upper layer feed through 22 is expressed by ΔL2. The horizontal overlap width between the metal wall 16 and the inside lower layer feed through 20i is a predetermined value rather smaller than ΔL3.

The upper layer feed through 22 is adhered to the sidewall of the metal wall 16 with silver brazing, for example. The width size of the adhesion portion is about 0.5 mm, for example. Similarly, a contact surface between the inside lower layer feed through 20i and the metal wall 16 is also adhered with silver brazing, for example.

As shown in FIG. 20, the outside lower layer feed through 20o passes through the metal wall 16, without contacting the metal wall 16. A bottom surface of the lower layer feed through (20i and 20o) contacts the conductive base plate 200, and a side surface of the lower layer feed through 20i contacts the metal wall 16.

Duplicating explanation is omitted since other configurations are the same as those of the first embodiment.

(High Frequency Terminal Structure)

According to a high frequency terminal structure according to the third embodiment, the air layers 23 are formed respectively at the top surfaces of the signal lines of the input stripline 19a and the output stripline 19b of the portion surrounded by the metal wall 16, and thereby reduction of impedance is avoidable. As a result, it can obtain the high frequency terminal structure whose impedance matching is satisfactory, reflection loss is controlled, and characteristics of the electric power resistance.

(Fabrication Method of Package)

Since a fabrication method of the package according to the third embodiment is the same as the fabrication method of the package according to the first embodiment, duplicating explanation is omitted.

(Feed Through Structure)

A schematic planar pattern configuration showing by enlarging the feed through structure near the output terminal of the package 1 according to the third embodiment is expressed as shown in FIG. 21. Also, a schematic cross-sectional structure taken in the line V-V of FIG. 21 is similarly expressed as FIG. 8.

As shown in FIG. 21, the following formula is satisfied: WL1−WL3=2ΔL3 where WL1 is the width of the inside lower layer feed through 20i disposed along the lines of the metal wall 16 in plane view, and WL2 is the width of the outside lower layer feed through 20o disposed along the lines of the metal wall 16 in plane view. Since the air gap is formed between the metal wall 16 and the outside lower layer feed through 20o, the horizontal overlap width between the inside lower layer feed through 20i and the metal wall 16 is a predetermined value rather smaller than ΔL3.

In the package 1 according to the third embodiment, the outside lower layer feed throughs 20o are surrounded by the metal wall 16 without contacting the metal wall 16, and the upper layer feed throughs 22 are adhered to the sidewall of the metal wall 16, and thereby the air layers 23 are formed respectively at the top surfaces of the signal lines of input stripline 19a and the output stripline 19b. Accordingly, reduction of impedance is avoided. As a result, it can obtain the feed through structure whose impedance matching is satisfactory, reflection loss is controlled, and characteristics of the electric power resistance.

Also, in the configuration example of the package 1 according to the third embodiment, the thickness W2 of the upper layer feed through 22 may be formed of the same grade with (or widely than) the thickness W1 of the metal wall 16.

According to the third embodiment, in the high airtight package used for a microwave band semiconductor device, it can provide the package which keeps characteristic impedance at 50Ω, without degrading an electric power capability.

Fourth Embodiment

A schematic bird's-eye view configuration for explaining a package according to a fourth embodiment is expressed as shown in FIG. 22. FIG. 22A shows a schematic configuration showing a metal cap 10. FIG. 22B shows a schematic configuration showing a metal seal ring 14*a*. FIG. 22C shows a schematic configuration showing a metal wall 16. FIG. 22D shows a schematic configuration showing a lower layer feed through (30*i* and 30*o*) on a conductive base plate 200 provided with a counter boring unit 40, an input stripline 19*a* and an output stripline 19*b* on the lower layer feed through (30*i*, and 30*o*), and an upper layer feed through 22.

A schematic planar pattern configuration of the package 1 according to the fourth embodiment is similarly expressed as FIG. 19.

Figure 23:
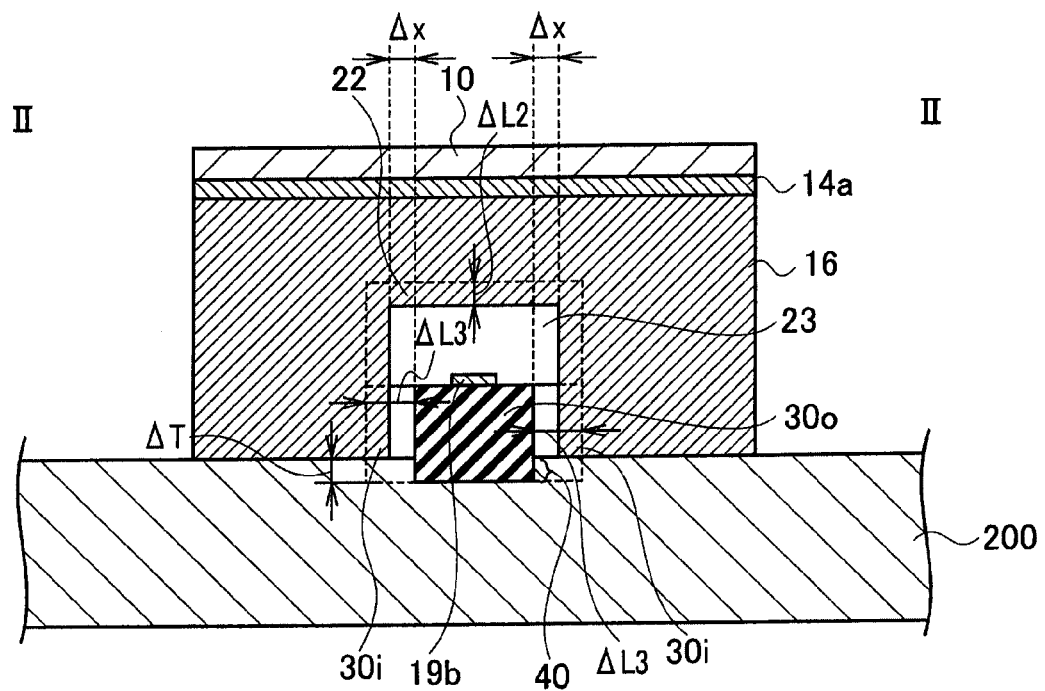
FIG. 23 is a schematic cross-sectional configuration showing the package according to the fourth embodiment, and is a schematic cross-sectional structure diagram taken in the line II-II of FIG. 19.

FIG. 23 shows a schematic cross-sectional configuration of the package according to the fourth embodiment, and a schematic cross-sectional structure taken in the line II-II of FIG. 19.

As shown in FIG. 22 to FIG. 23, in the package 1 according to the fourth embodiment, the conductive base plate 200 includes the counter boring unit 40, and the lower layer feed through (30*i* and 30*o*) is disposed on the counter boring unit 40 of the conductive base plate 200.

In the package 1 according to the fourth embodiment, the air layer 23 is formed between the sidewall of the lower layer feed through 30*o*, and the internal wall of the through-hole 34. That is, as shown in FIG. 23, in the package 1 according to the fourth embodiment, the outside lower layer feed through 30*o* has the air layer 23 formed between the outside lower layer feed through 30*o* and the through-holes 34 of the metal wall 16, without contacting the through-hole 34 of the metal wall 16. Duplicating explanation is omitted since other configurations are the same as those of the package according to the third embodiment.

According to the fourth embodiment, since the lower layer feed through (30*i* and 30*o*) can be disposed in the counter boring unit 40 by using the conductive base plate 200 including the counter boring unit 40, it can prevent from a displacement between the convex feed through 25 composed of the lower layer feed through (30*i* and 30*o*) and the upper layer feed through 22, and the metal wall 16.

Moreover, According to the fourth embodiment, since the metal wall 16 does not contact the side surface of the through-hole 34 by giving the gap between the metal wall 16 and the outside lower layer feed through 30*o*, an impedance of the input stripline 19*a* on the outside lower layer feed through 30*o* can be kept highly. Moreover, since the outside lower layer feed through 30*o* is not subject to a stress from the metal wall 16, it can reduce a possibility that a stress crack will occur in the outside lower layer feed through 30*o*.

(High Frequency Terminal Structure)

According to a high frequency terminal structure according to the fourth embodiment, the air layers 23 are formed respectively at the top surfaces of the signal lines of the input stripline 19*a* and the output stripline 19*b* of the portion surrounded by the metal wall 16, and thereby reduction of impedance is avoidable. As a result, it can obtain the high frequency terminal structure whose impedance matching is satisfactory, reflection loss is controlled, and characteristics of the electric power resistance.

(Fabrication Method of Package)

Since a fabrication method of the package according to the fourth embodiment is the same as the fabrication method of the package according to the second embodiment, duplicating explanation is omitted.

According to the fourth embodiment, since the air layer is formed between the top surface of the signal line of the portion surrounded by the metal wall and the metal wall, the reduction of impedance is avoidable. As a result, it can obtain the package whose impedance matching is satisfactory, reflection loss is controlled, and characteristics of the electric power resistance.

According to the fourth embodiment, it can provide the high airtight package which can prevent the displacement between the convex feed through and the metal wall, by using the conductive base plate including the counter boring unit.

According to the fourth embodiment, in the high airtight package used for a microwave band semiconductor device, it can provide the package which keeps characteristic impedance at 50Ω, without degrading an electric power capability.

Fifth Embodiment

Package Structure

A schematic bird's-eye view configuration for explaining a package according to a fifth embodiment is expressed as shown in FIG. 24. FIG. 24A shows a schematic configuration showing a metal cap 10. FIG. 24B shows a schematic configuration showing a metal seal ring 14*a*. FIG. 24C shows a schematic configuration showing a metal wall 16. FIG. 24D shows a schematic configuration of a lower layer feed through (20*i* and 20*o*) on a conductive base plate 200, an input stripline 19*a* and an output stripline 19*b* on the lower layer feed through (20*i* and 20*o*), and an upper layer feed through 22 on the lower layer feed through 20*i*.

As shown in FIG. 24, the package according to the fifth embodiment includes: a metal cap 10; a metal seal ring 14*a*; a metallic wall 16; a conductive base plate 200; lower layer feed throughs (20*i* and 20*o*) disposed on the conductive base plate 200; an input stripline 19*a* and an output stripline 19*b* disposed respectively on the lower layer feed throughs (20*i* and 20*o*); and upper layer feed throughs 22 disposed respectively on the inside lower layer feed throughs 20*i*.

Figure 24A:
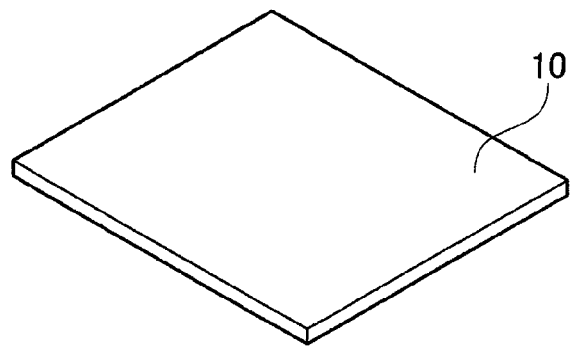
FIG. 24A is a schematic bird's-eye view showing a package according to a fifth embodiment, and is a schematic configuration diagram showing a metal cap 10.
Figure 24B:
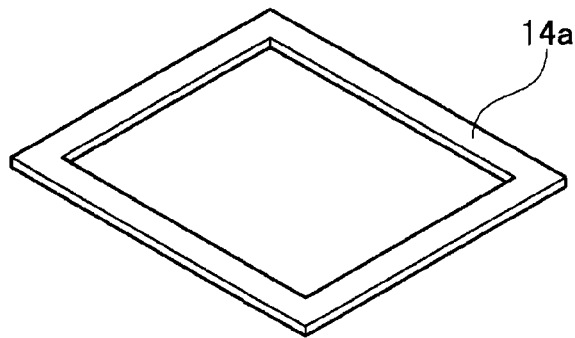
Figure 24C:
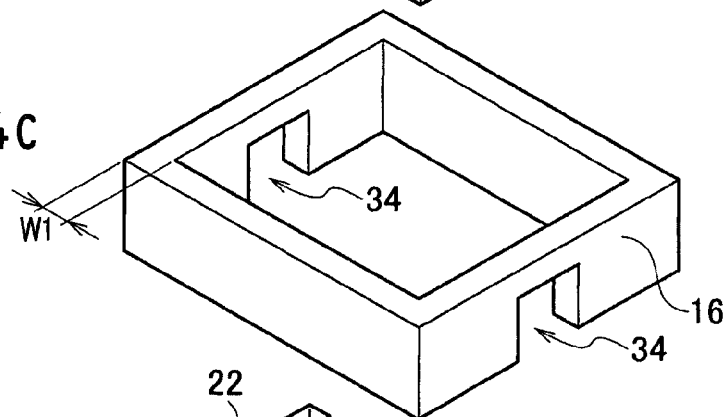
FIG. 24C is a schematic bird's-eye view showing the package according to the fifth embodiment, and is a schematic configuration diagram showing a metal wall 16.
Figure 24D:
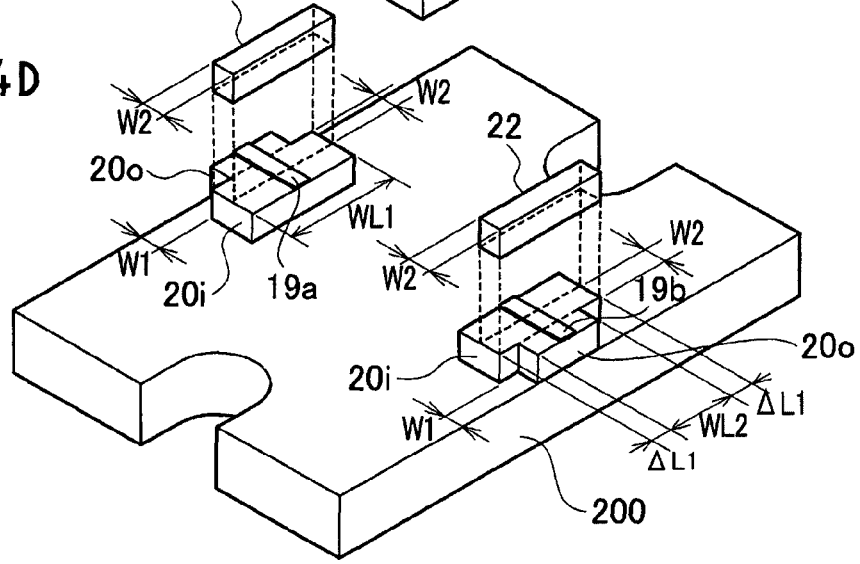
FIG. 24D is a schematic bird's-eye view showing the package according to the fifth embodiment, and is a schematic configuration diagram showing a lower layer feed through (20i and 20o) on a conductive base plate 200, an input stripline 19a and an output stripline 19b on the lower layer feed through (20i and 20o), and an upper layer feed through 22 on the lower layer feed through 20i.
Figure 26:
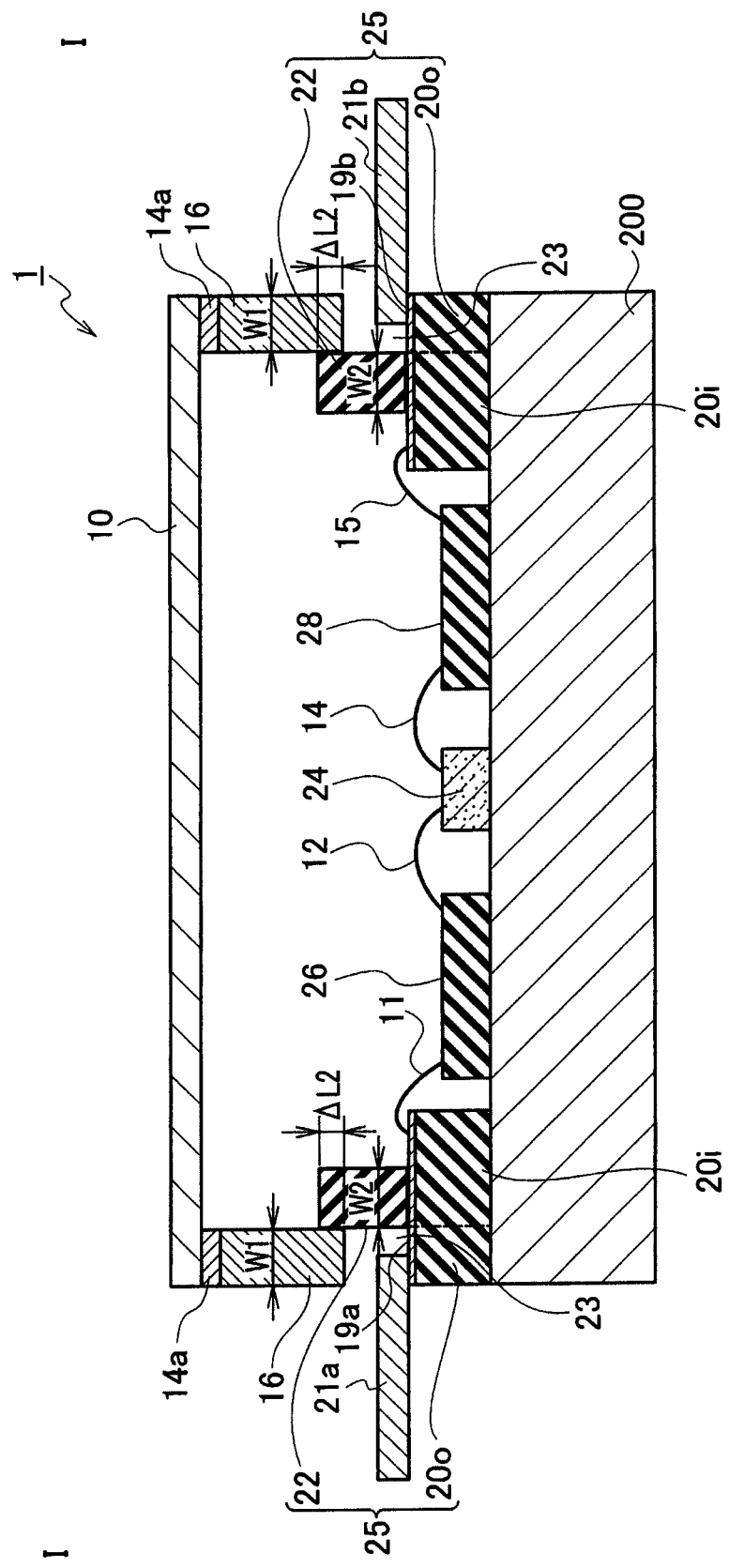
FIG. 26 is a schematic cross-sectional configuration showing the package according to the fifth embodiment, and is a schematic cross-sectional structure diagram taken in the line I-I of FIG. 25.
Figure 29:
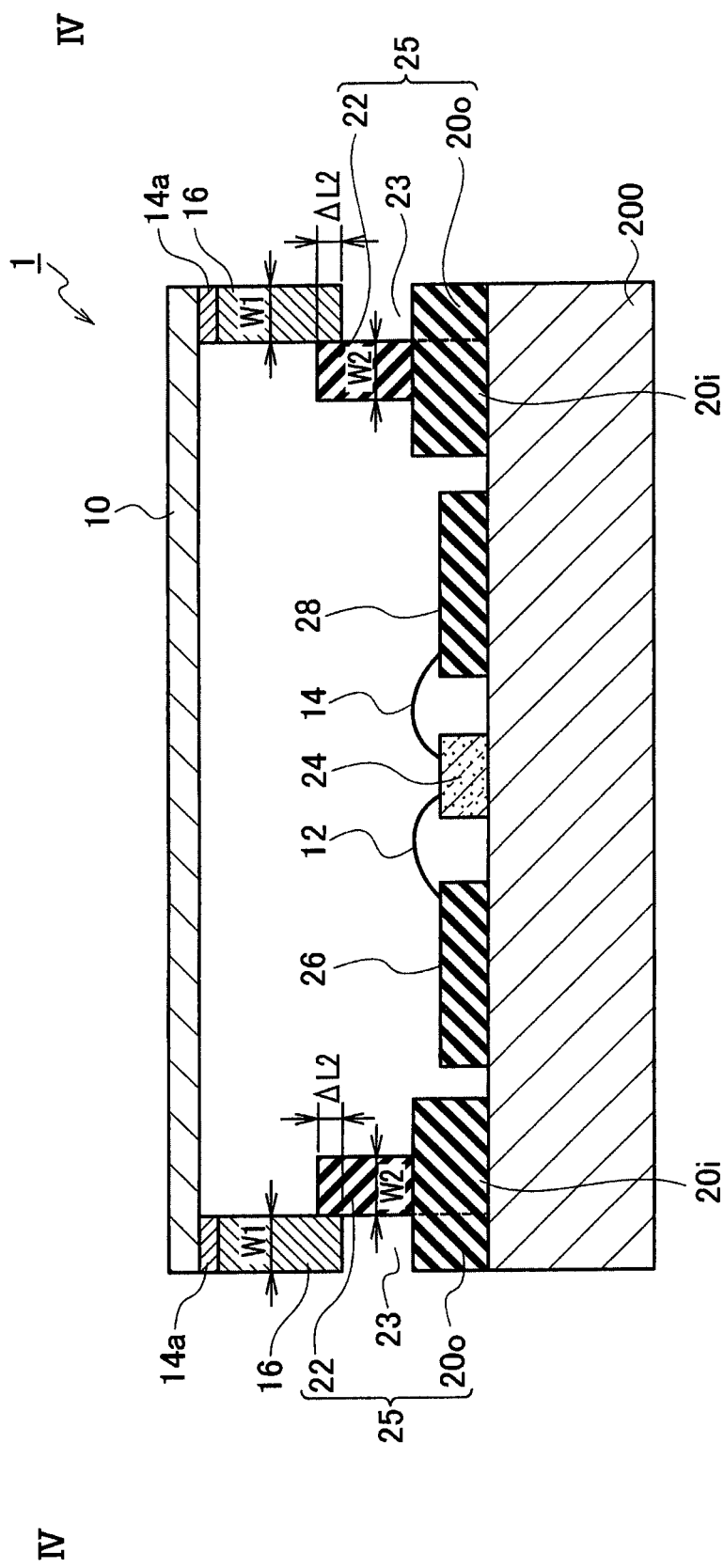
FIG. 29 is a schematic cross-sectional configuration showing the package according to the fifth embodiment, and is a schematic cross-sectional structure diagram taken in the line IV-IV of FIG. 25.

As shown in FIG. 24D, a width WL1 of the inside lower layer feed through 20*i* and the upper layer feed through 22 disposed the inside of the metal wall 16 is formed more widely than a width of the through-hole 34 of the metal wall 16. In this case, WL1−WL2=2ΔL1, for example, as shown in FIG. 1. Thus, the inside lower layer feed through 20*i* and the upper layer feed through 22 can be contacted on the side surface of the metal wall 16, by forming the width WL1 of the inside lower layer feed through 20*i* more widely than the width of the through-hole 34 of the metal wall 16, thereby securing airtightness. Also, as shown in FIG. 26 and FIG. 29, an air gap is provided between the input stripline 19*a* and the metal wall 16. Since the air layer 23 is formed between the top surface of the input stripline 19*a*, and the metal wall 16, reduction of impedance is avoidable.

Figure 27:
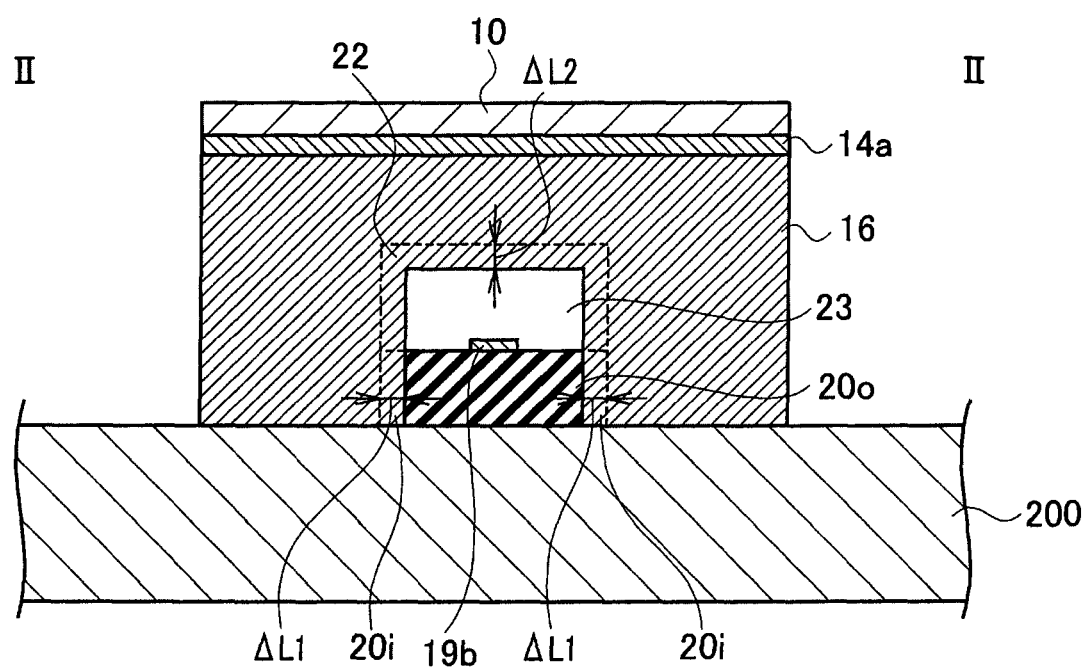
FIG. 27 is a schematic cross-sectional configuration showing the package according to the fifth embodiment, and is a schematic cross-sectional structure diagram taken in the line II-II of FIG. 25.

Similarly, as shown in FIGS. 26, 27 and 29, an air gap 23 is provided between the output stripline 19b and the metal wall 16. Since the air layer 23 is formed between the top surface of the output stripline 19b, and the metal wall 16, reduction of impedance is avoidable.

(Plane Pattern Configuration)

Figure 25:
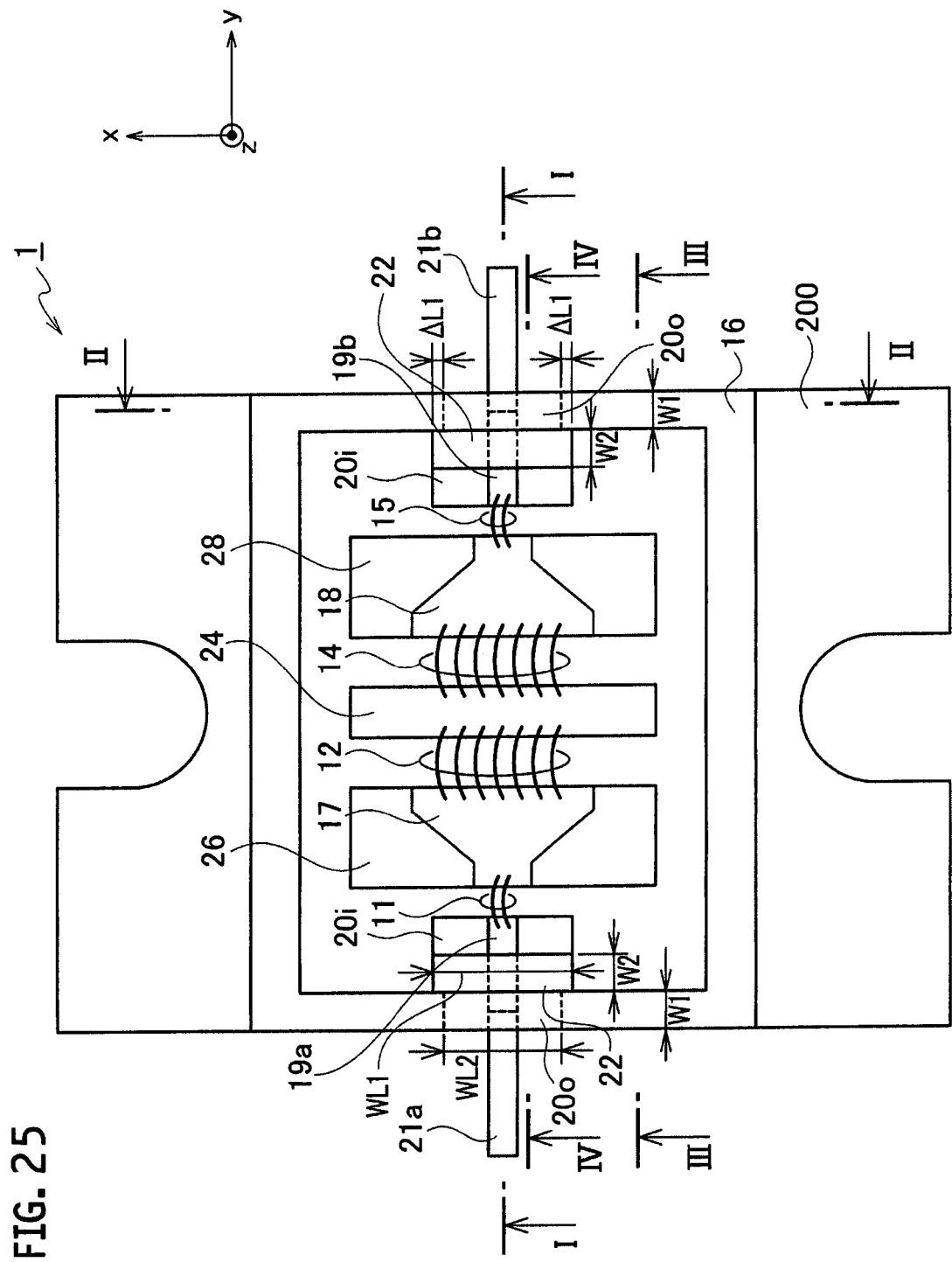
FIG. 25 is a schematic planar pattern configuration diagram showing the package according to the fifth embodiment.

A schematic planar pattern configuration of the package 1 according to the fifth embodiment is expressed as shown in FIG. 25. Also, a schematic cross-sectional structure taken in the line I-I of FIG. 25 is expressed as shown in FIG. 26. In FIG. 25, y axis indicates a direction which the line I-I extends, x axis indicates a direction in parallel to the drawing sheet and vertical to the y axis, and z axis indicates a direction vertical to the drawing sheet.

Figure 28:
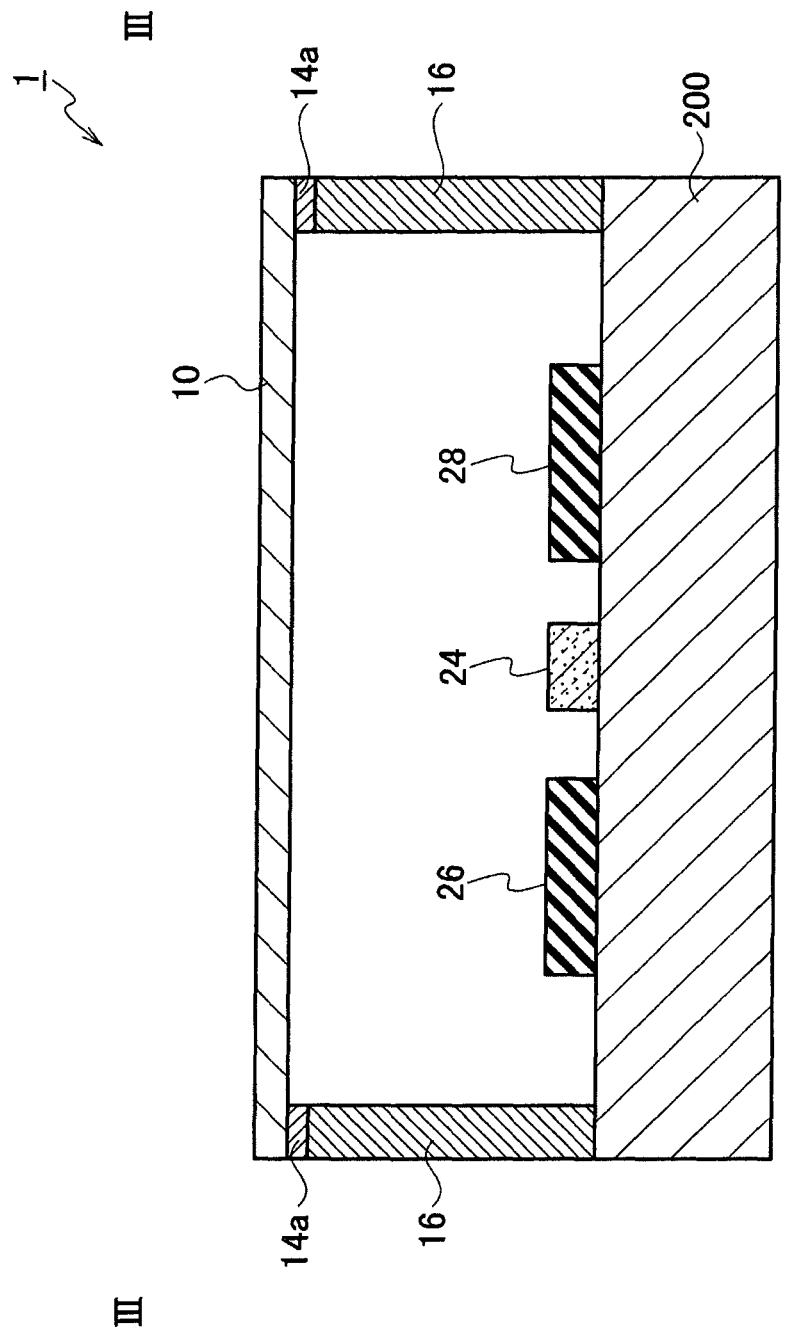
FIG. 28 is a schematic cross section configuration showing the package according to the fifth embodiment, and is a schematic cross-sectional structure diagram taken in the line III-III of FIG. 25.

Moreover, a schematic cross-sectional structure taken in the line II-II of FIG. 25 is expressed as shown in FIG. 27, and a schematic cross-sectional structure taken in the line III-III of FIG. 25 is expressed as shown in FIG. 28. Also, a schematic cross-sectional structure taken in the line IV-IV of FIG. 25 is expressed as shown in FIG. 29.

As shown in FIG. 24 to FIG. 29, the package according to the fifth embodiment includes: a conductive base plate 200; a metal wall 16 disposed on the conductive base plate 200; through-holes 34 formed at both the input and output portions of the metal wall 16; lower layer feed throughs (20i and 20o) disposed on the conductive base plate 200; wiring patterns 19a and 19b disposed respectively on the lower layer feed throughs (20i and 20o); upper layer feed throughs 22 disposed respectively on a part of the lower layer feed throughs (20i and 20o) and a part of the wiring patterns 19a and 19b; and terminals 21a and 21b disposed respectively on the wiring pattern 19a and 19b. In this case, a width of a part of the lower layer feed through 20 is wider than a width of the through-hole 34, and the lower layer feed throughs (20i and 20o) are adhered to the metal wall 16 side surface. Also, a width of the upper layer feed throughs 22 is wider than the width of the through-hole 34, and the upper layer feed throughs 22 are adhered to the metal wall 16 side surface. Accordingly, air layers 23 are formed respectively between the wiring patterns 19a and 19b and the internal wall of the through-holes 34.

Moreover, the upper layer feed through 22 and the lower layer feed through 20 are adhered to the inside of the metal wall 16.

Also, a semiconductor device 24 is disposed on the conductor plate 200, and the metal wall 16 disposed on the conductive base plate 200 houses the semiconductor device 24. Moreover, as shown in FIG. 24 to FIG. 27, the terminals 21a and 21b are disposed respectively in the through-holes 34.

As shown in FIGS. 26, 27 and 29, in the package 1 according to the fifth embodiment, the outside lower layer feed through 20o is surrounded by the metal wall 16.

As shown in FIGS. 26, 27 and 29, the lengthwise overlap width between the metal wall 16 and the upper layer feed through 22 is expressed as ΔL2. As shown in FIGS. 24, 25 and 27, the horizontal overlap width between the metal wall 16 and the inside lower layer feed through 20i is expressed as ΔL1.

The upper layer feed through 22 is adhered to the sidewall of the metal wall 16 with silver brazing, for example. The width size of the adhesion portion is approximately 0.5 mm, for example. Similarly, a contact surface between the lower layer feed through (20i and 20o) and the metal wall 16 is also adhered with silver brazing, for example.

As shown in FIGS. 24-27, the outside lower layer feed through 20o passes through the metal wall 16. A bottom surface of the lower layer feed through (20i and 20o) contacts the conductive base plate 200, and a side surfaces of the lower layer feed through (20i and 20o) contacts the metal wall 16.

Also, the package 1 according to the fifth embodiment includes: an input stripline 19a disposed on the lower layer feed through (20i and 20o), in the input portion of the metal wall 16; and an output stripline 19b disposed on the lower layer feed through (20i and 20o), in the output portion of the metal wall 16.

As shown in FIG. 25 to FIG. 26, the package according to the fifth embodiment includes: an RF input terminal 21a connected to the input stripline 19a; and an RF output terminal 21b connected to the output stripline 19b. The RF input terminal 21a and RF output terminal 21b are disposed respectively in the through-holes 34 disposed on the input and output portions of the metal wall 16.

Also, the upper layer feed through 22 is disposed at the inside of the metal wall 16, and is adhered to the sidewall of the metal wall 16 in the internal wall of the metal wall 16 as mentioned above.

Also, as shown in FIG. 3 and FIG. 6, an air gap is provided between the input stripline 19a and the metal wall 16. Since the air layer 23 is formed between the top surface of the input stripline 19a, and the metal walls 16, reduction of impedance is avoided.

Similarly, as shown in FIGS. 26, 27 and 29, an air gap 23 is provided between the output stripline 19b and the metal wall 16. Since the air layer 23 is formed between the top surface of the output stripline 19b and the metal walls 16, reduction of impedance is avoided.

Also, in the package 1 according to the fifth embodiment, the lower layer feed through (20i, 20o) includes the inside lower layer feed through 20i disposed at the inside of the metal wall 16, and the outside lower layer feed through 20o disposed at the outside of the metal wall 16. In plane view, a width WL1 of the inside lower layer feed through 20i disposed along the lines of the metal wall 16 is wider than a width WL2 of the outside lower layer feed through 20o, as above-mentioned.

Also, the package 1 according to the fifth embodiment may include: an input circuit substrate 26 and an output circuit substrate 28 which are adjoining of the semiconductor device 24 and are disposed on the conductive base plate 200 surrounded by the metal wall 16; an input matching circuit 17 which is disposed on the input circuit substrate 26 and is connected to the input stripline 19a; an output matching circuit 18 which is disposed on the output circuit substrate 28 and is connected to the output stripline 19b; and bonding wires 12 and 14 connect respectively between the semiconductor device 24 and the input matching circuit 17 and the output matching circuit 18. In addition, between the input stripline 19a and the input matching circuits 17 is connected by the bonding wire 11, and between the output stripline 19b and the output matching circuits 18 is connected by the bonding wire 15.

Also, the package 1 according to the first embodiment may include the metal seal ring 14a disposed on the metal wall 16, and the metal cap 10 disposed on the metal seal ring 14a.

(High Frequency Terminal Structure)

Figure 30:
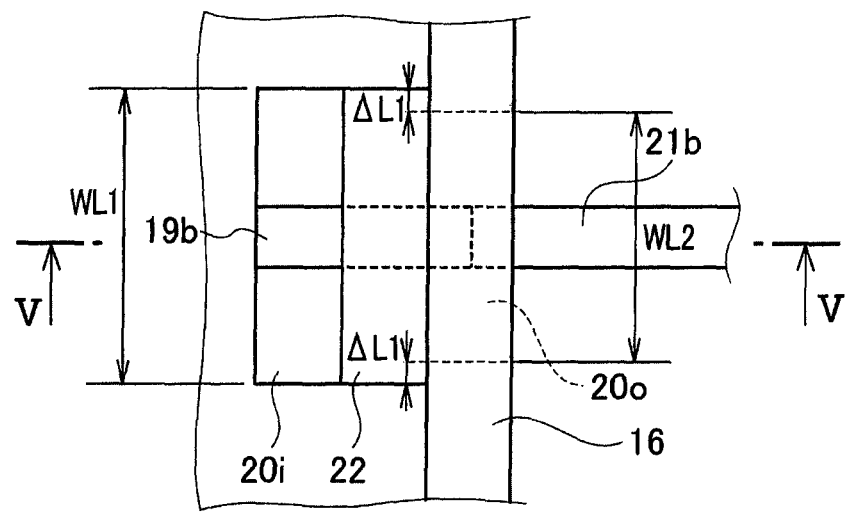
FIG. 30 is a schematic planar pattern configuration diagram showing by enlarging a feed through structure near an output terminal of the package according to the fifth embodiment.
Figure 31:
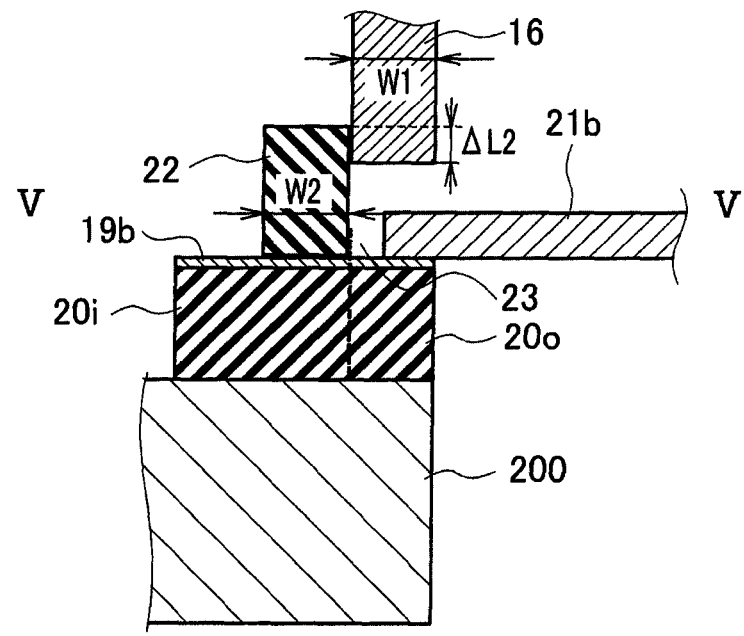
FIG. 31 is a cross-sectional structure showing by enlarging the feed through structure near the output terminal of the package according to the fifth embodiment, and is a schematic cross-sectional structure diagram taken in the line V-V of FIG. 30.
Figure 32A:
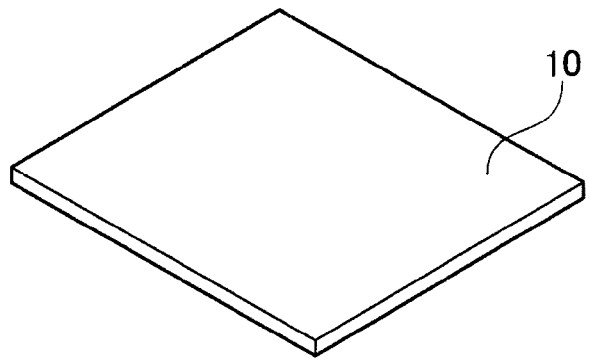
FIG. 32A is a schematic bird's-eye view showing a package according to a sixth embodiment, and is a schematic configuration diagram showing a metal cap 10.
Figure 32B:
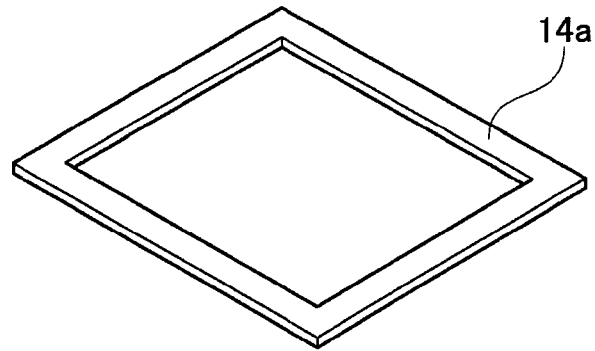
Figure 32C:
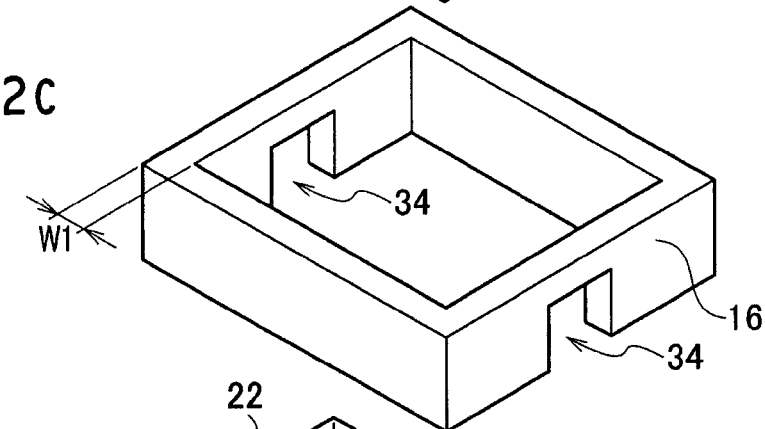
FIG. 32C is a schematic bird's-eye view showing the package according to the sixth embodiment, and is a schematic configuration diagram showing a metal wall 16.
Figure 32D:
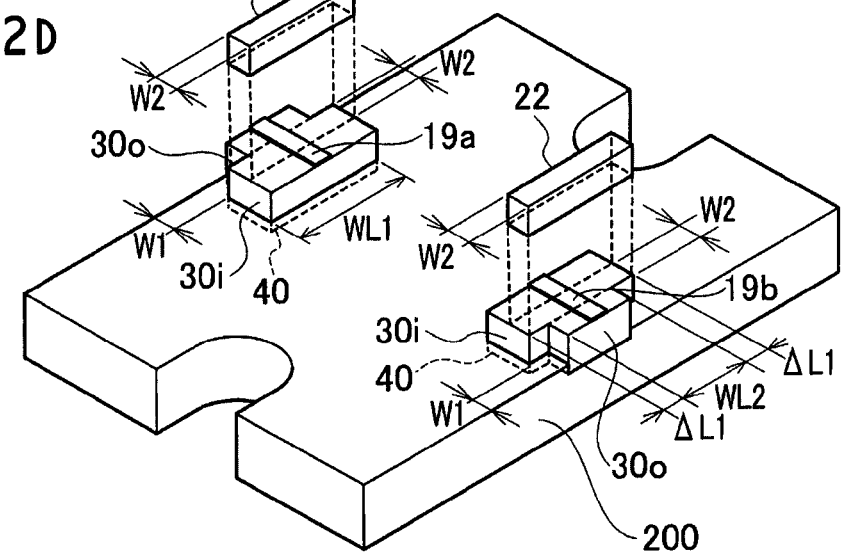
FIG. 32D is a schematic bird's-eye view showing the package according to the sixth embodiment, and is a schematic configuration diagram showing a lower layer feed through (30i and 30o) on a conductive base plate 200 including a counter boring unit 40, an input stripline 19a and an output stripline 19b on the lower layer feed through (30i and 30o), and an upper layer feed through 22 on the lower layer feed through 30i.

According to a high frequency terminal structure according to the fifth embodiment, the air layers 23 are formed respectively at the top surfaces of the signal lines of the input stripline 19a and the output stripline 19b of the portion surrounded by the metal wall 16, and thereby reduction of impedance is avoidable. As a result, it can obtain the high frequency terminal structure whose impedance matching is satisfactory, reflection loss is controlled, and characteristics of the electric power resistance.
(Fabrication Method of Package)
Since a fabrication method of the package according to the fifth embodiment is the same as the fabrication method of the package according to the first embodiment, duplicating explanation is omitted.
(Feed Through Structure)
A schematic planar pattern configuration showing by enlarging the feed through structure near the output terminal of the package 1 according to the fifth embodiment is expressed as shown in FIG. 30. Also, a schematic cross-sectional structure taken in the line V-V of FIG. 30 is expressed as shown in FIG. 31.

As shown in FIG. 30, the following formula is satisfied: WL1−WL2=2ΔL1 where WL1 is the width of the inside lower layer feed through 20i disposed along the lines of the metal wall 16 in plane view, and WL2 is the width of the outside lower layer feed through 20o disposed along the lines of the metal wall 16 in plane view, and ΔL1 is the horizontal overlap width between the inside lower layer feed through 20i and the metal wall 16 in plane view, as mentioned above. Also, Δ2 is the lengthwise overlap width between the upper layer feed through 22 and the metal wall 16, in FIG. 8.

In the package 1 according to the fifth embodiment, the outside lower layer feed throughs 20o are surrounded by the metal wall 16, and the upper layer feed throughs 22 are adhered to the sidewall of the metal wall 16, and thereby the air layers 23 are formed respectively at the top surfaces of the signal lines of input stripline 19a and the output stripline 19b. Accordingly, reduction of impedance is avoided.

According to the package 1 according to the fifth embodiment, since each of the air layers 23 is formed at each of the top surfaces of the signal lines of input stripline 19a and the output stripline 19b of the portion surrounded by the metal wall 16, the reduction of impedance is avoidable. As a result, it can obtain the feed through structure whose impedance matching is satisfactory, reflection loss is controlled, and characteristics of the electric power resistance.

As shown in FIG. 25 to FIG. 31, the package according to the fifth embodiment includes: the RF input terminal 21a connected to the input stripline 19a; and the RF output terminal 21b connected to the output stripline 19b. Since the RF input terminal 21a and RF output terminal 21b are disposed respectively in the through-holes 34 disposed on the input and output portions of the metal wall 16, the package size in the y axial direction of FIG. 25 can be shortened compared with that of the first embodiment, and the size of the conductive base plate 200 in the y axial direction can also be shortened. Accordingly, the package according to the fifth embodiment can reduce the size of occupied area of the package, thereby contributing to a saved weight and a reduced cost.

According to the fifth embodiment, in the high airtight package used for a microwave band semiconductor device, it can provide the package which keeps characteristic impedance at 50Ω, without degrading an electric power capability.

Sixth Embodiment

A schematic bird's-eye view configuration for explaining a package according to a sixth embodiment is expressed as shown in FIG. 32. FIG. 32A shows a schematic configuration showing a metal cap 10. FIG. 32B shows a schematic configuration showing a metal seal ring 14a. FIG. 32C shows a schematic configuration showing a metal wall 16. FIG. 32D shows a schematic configuration showing a lower layer feed through (30i and 30o) on a conductive base plate 200 provided with a counter boring unit 40, an input stripline 19a and an output stripline 19b on the lower layer feed through (30i and 30o), and an upper layer feed through 22.

A schematic planar pattern configuration of the package 1 according to the sixth embodiment is similarly expressed as FIG. 25.

Figure 33:
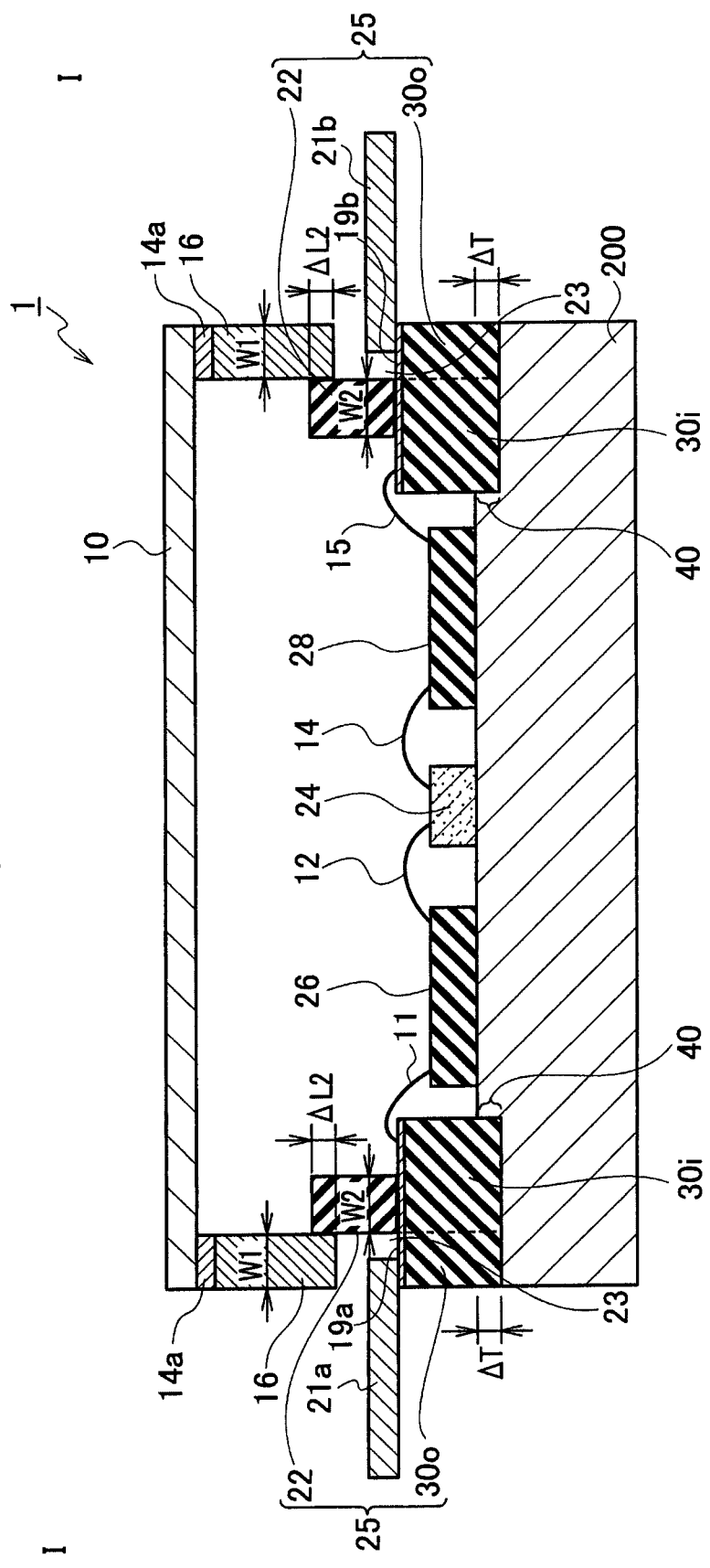
FIG. 33 is a schematic cross-sectional configuration showing the package according to the sixth embodiment, and is a schematic cross-sectional structure diagram taken in the line I-I of FIG. 25.
Figure 34:
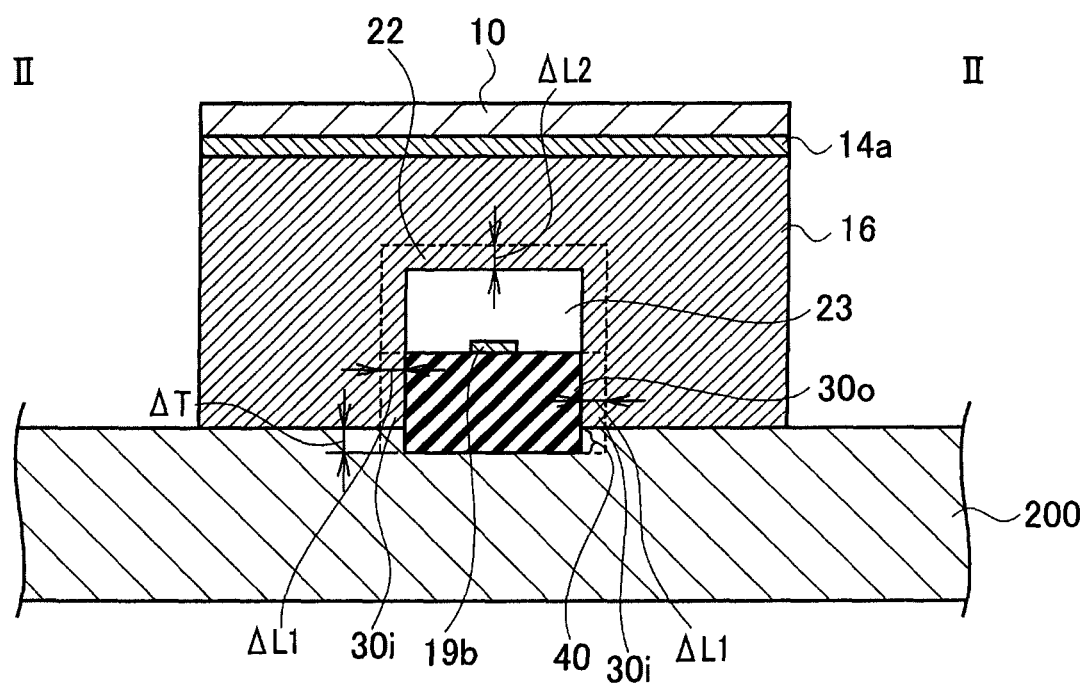
FIG. 34 is a schematic cross-sectional configuration showing the package according to the sixth embodiment, and is a schematic cross-sectional structure diagram taken in the line II-II of FIG. 25.
Figure 35:
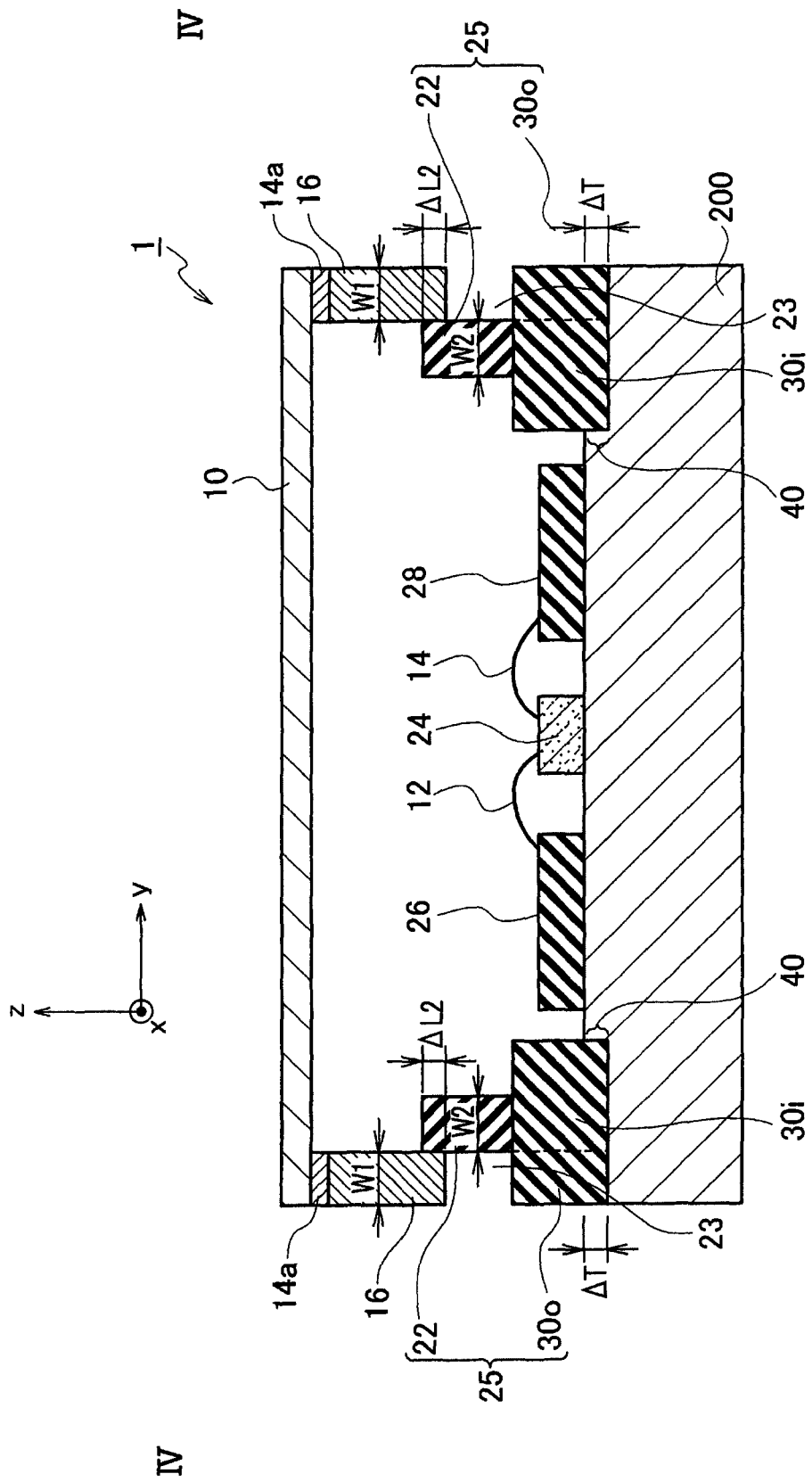
FIG. 35 is a schematic cross-sectional configuration showing the package according to the sixth embodiment, and is a schematic cross-sectional structure diagram taken in the line IV-IV of FIG. 25.
Figure 36A:
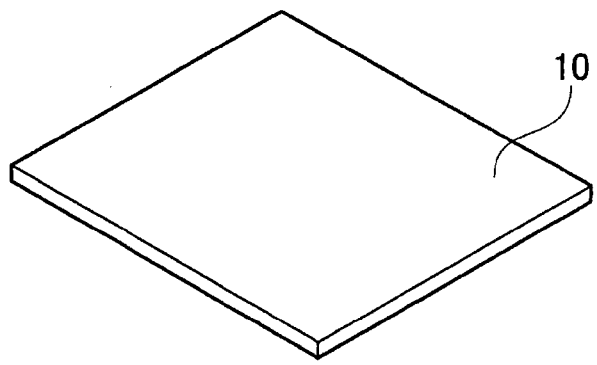
FIG. 36A is a schematic bird's-eye view showing a package according to a seventh embodiment, and is a schematic configuration diagram showing a metal cap 10.
Figure 36B:
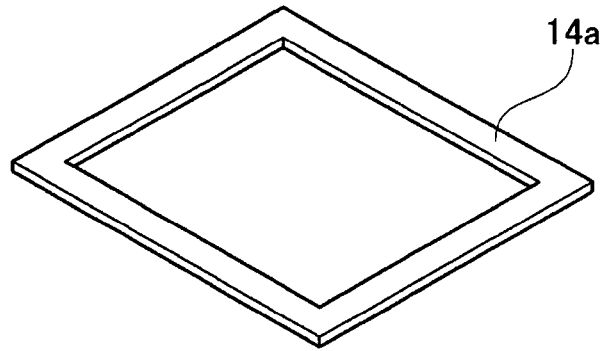
Figure 36C:
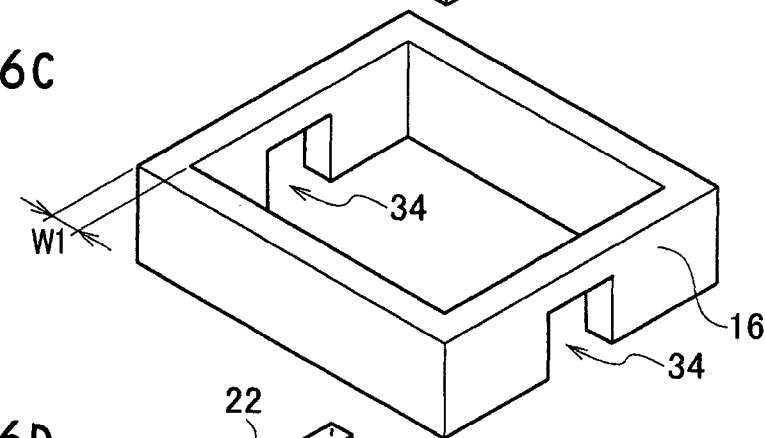
FIG. 36C is a schematic bird's-eye view showing the package according to the seventh embodiment, and is a schematic configuration diagram showing a metal wall 16.
Figure 36D:
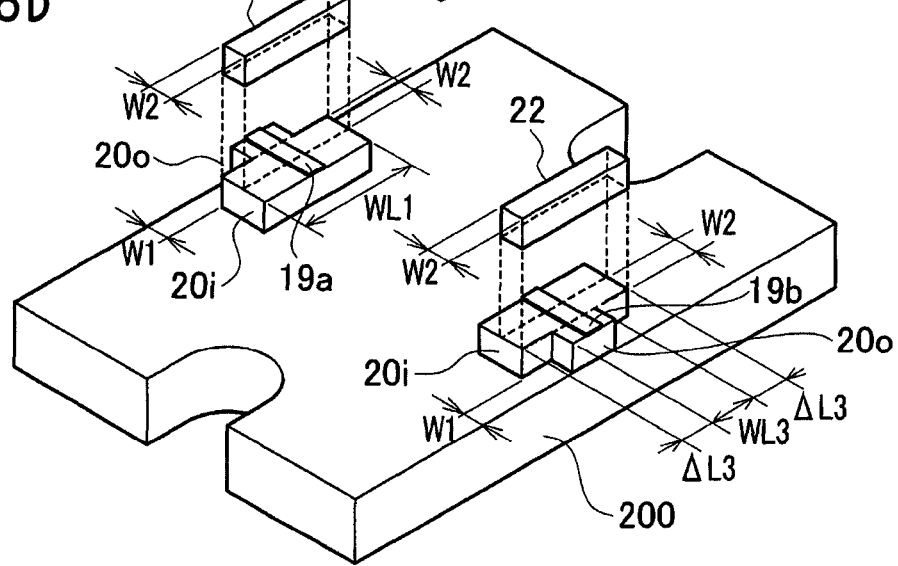
FIG. 36D is a schematic bird's-eye view showing the package according to the seventh embodiment, and is a schematic configuration diagram showing a lower layer feed through (20i and 20o) on a conductive base plate 200, an input stripline 19a and an output stripline 19b on the lower layer feed through (20i and 20o), and an upper layer feed through 22 on the lower layer feed through 20i.

A schematic cross-sectional configuration of the package according to the fifth embodiment, and a schematic cross-sectional structure taken in the line I-I of FIG. 25 is expressed as shown in FIG. 33. A schematic cross-sectional structure taken in the line II-II of FIG. 25 is expressed as shown in FIG. 34. A schematic cross-sectional structure taken in the line IV-IV of FIG. 25 is expressed as shown in FIG. 35. Also in FIG. 35, y axis indicates a direction which the line IV-IV extends, x axis indicates a direction vertical to the drawing sheet and vertical to the y axis, and z axis indicates a direction in parallel to the drawing sheet.

As shown in FIG. 32 to FIG. 35, in the package 1 according to the sixth embodiment, the conductive base plate 200 includes the counter boring unit 40, and the lower layer feed through (30i and 30o) is disposed on the counter boring unit 40 of the conductive base plate 200. The counter boring depth ΔT of the counter boring unit 40 is approximately 0.1 mm to 0.5 mm, for example. Duplicating explanation is omitted since other configurations are the same as those of the package according to the fifth embodiment.

According to the sixth embodiment, since the lower layer feed through (30i and 30o) can be disposed in the counter boring unit 40 by using the conductive base plate 200 including the counter boring unit 40, it can prevent from a displacement between the convex feed through 25 composed of the lower layer feed through (30i and 30o) and the upper layer feed through 22, and the metal wall 16.

Moreover, as shown in FIG. 32 to FIG. 35, the package according to the sixth embodiment includes: an RF input terminal 21a connected to the input stripline 19a; and an RF output terminal 21b connected to the output stripline 19b. Since the RF input terminal 21a and RF output terminal 21b are disposed respectively in the through-holes 34 disposed on the input and output portions of the metal wall 16, the package size in the y axial direction of FIG. 25 can be shortened compared with that of the first embodiment, and the size of the conductive base plate 200 in the y axial direction can also be shortened. Accordingly, the package according to the sixth embodiment can reduce the size of occupied area of the package, thereby contributing to a saved weight and a reduced cost. Duplicating explanation is omitted since other configurations are the same as those of the package according to the second embodiment.

(High Frequency Terminal Structure)
According to a high frequency terminal structure according to the sixth embodiment, the air layers 23 are formed respectively at the top surfaces of the signal lines of the input stripline 19a and the output stripline 19b of the portion surrounded by the metal wall 16, and thereby reduction of impedance is avoidable. As a result, it can obtain the high frequency terminal structure whose impedance matching is satisfactory, reflection loss is controlled, and characteristics of the electric power resistance.

(Fabrication Method of Package)
Since a fabrication method of the package according to the sixth embodiment is the same as the fabrication method of the package according to the second embodiment, duplicating explanation is omitted.

According to the sixth embodiment, since the air layer is formed between the top surface of the signal line of the portion surrounded by the metal wall and the metal wall, the reduction of impedance is avoidable. As a result, it can obtain the package whose impedance matching is satisfactory, reflection loss is controlled, and characteristics of the electric power resistance.

According to the sixth embodiment, it can provide the high airtight package which can prevent the displacement between the convex feed through and the metal wall, by using the conductive base plate including the counter boring unit.

Moreover, since the RF input output terminals are disposed respectively in the through-holes disposed in the input and output portions of the metal wall according to the package according to the sixth embodiment, the size of the conductive base plate in the y axial direction can be shortened. Accordingly, the size of the occupied area of the package can reduced, thereby contributing to a saved weight and a reduced cost.

Also in the package and its high frequency terminal structure according to the fifth to sixth embodiment, the configuration where the outside lower layer feed through 20o and 30o does not contact the metal wall 16 may be applied, in the same manner as for the third embodiment or the fourth embodiment.

Since the metal wall 16 does not contact the side surface of the through-hole 34 by giving such a gap between the metal wall 16 and the outside lower layer feed through 30o, an impedance of the input/output striplines 19a and 19b on the outside lower layer feed throughs 30o can be kept highly. Moreover, since the outside lower layer feed through 30o is not subject to a stress from the metal wall 16, it can reduce a possibility that a stress crack will occur in the outside lower layer feed through 30o.

According to the sixth embodiment, in the high airtight package used for a microwave band semiconductor device, it can provide the package which keeps characteristic impedance at 50Ω, without degrading an electric power capability.

Seventh Embodiment

A schematic bird's-eye view configuration of a package according to a seventh embodiment is expressed as shown in FIG. 36. FIG. 36A shows a schematic configuration showing a metal cap 10. FIG. 36B shows a schematic configuration showing a metal seal ring 14a. FIG. 36C shows a schematic configuration showing a metal wall 16. FIG. 36D shows a schematic configuration of a lower layer feed through (20i and 20o) on a conductive base plate 200, an input stripline 19a and an output stripline 19b on the lower layer feed through (20i and 20o), and an upper layer feed through 22 on the lower layer feed through 20i.

Figure 37:
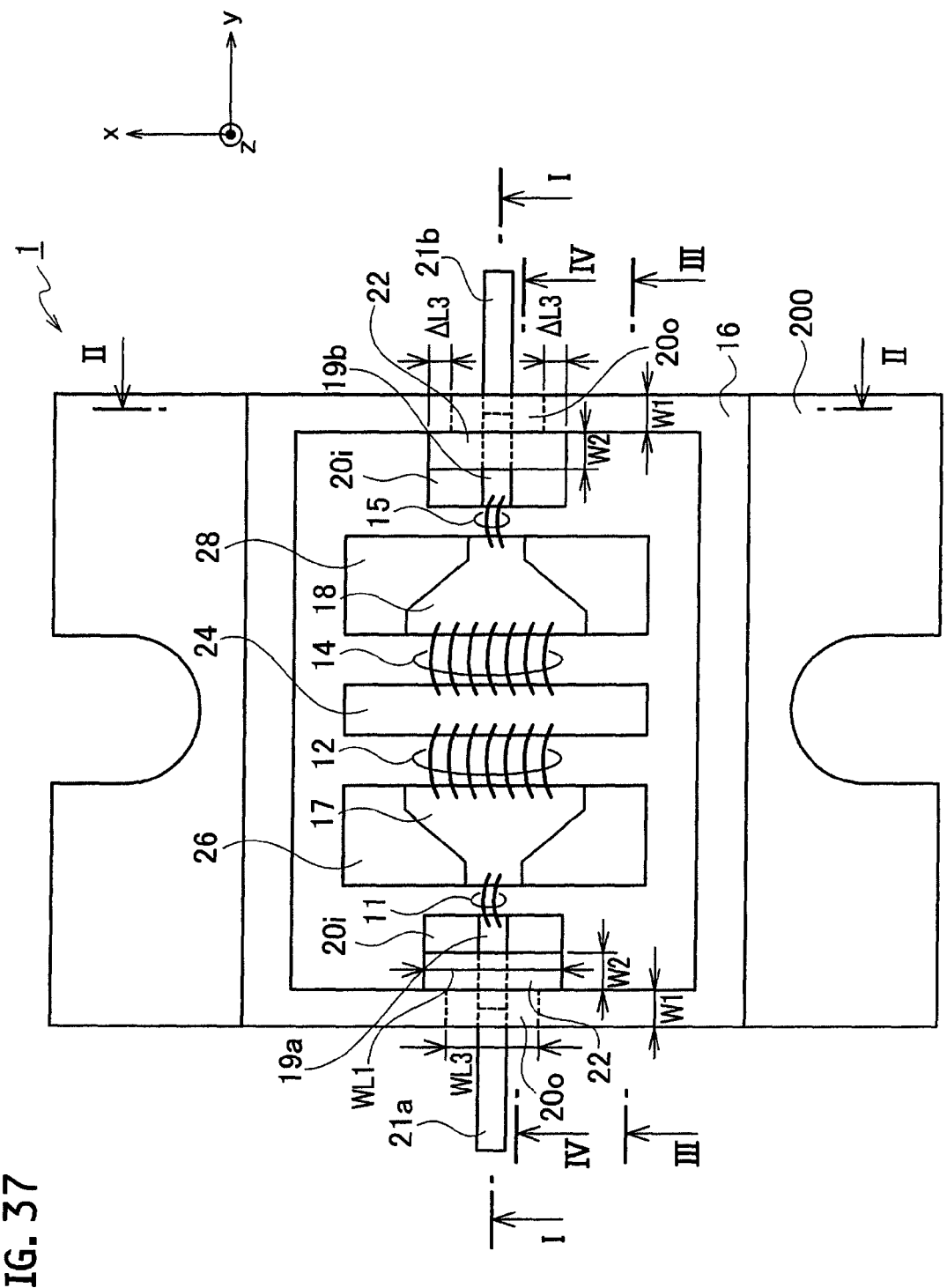
FIG. 37 is a schematic planar pattern configuration diagram showing the package according to the seventh embodiment.

A schematic planar pattern configuration of the package 1 according to the seventh embodiment is expressed as shown in FIG. 37. Also, a schematic cross-sectional structure taken in the line I-I of FIG. 37 is similarly expressed as FIG. 26.

Moreover, a schematic cross-sectional structure taken in the line II-II of FIG. 37 is similarly expressed as FIG. 20, and a schematic cross-sectional structure taken in the line III-III of FIG. 37 is similarly expressed as FIG. 28. Also, a schematic cross-sectional structure taken in the line IV-IV of FIG. 37 is similarly expressed as FIG. 29. In FIG. 37, y axis indicates a direction which the line I-I extends, x axis indicates a direction in parallel to the drawing sheet and vertical to the y axis, and z axis indicates a direction vertical to the drawing sheet.

Figure 38:
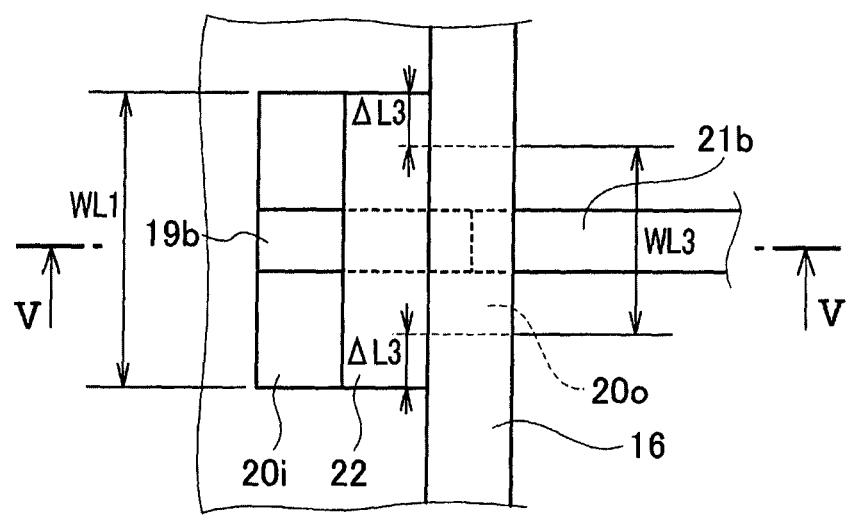
FIG. 38 is a schematic planar pattern configuration diagram showing by enlarging a feed through structure near an output terminal of the package according to the seventh embodiment.
Figure 39A:
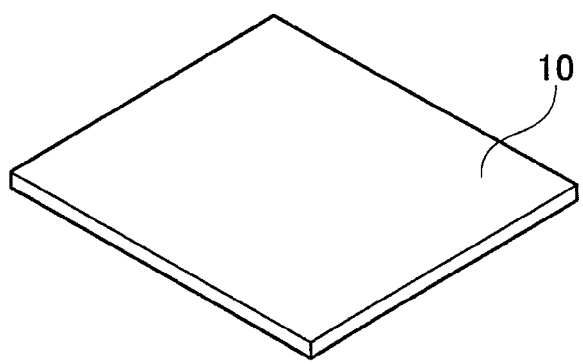
FIG. 39A is a schematic bird's-eye view showing a package according to a eighth embodiment, and is a schematic configuration diagram showing a metal cap 10.
Figure 39B:
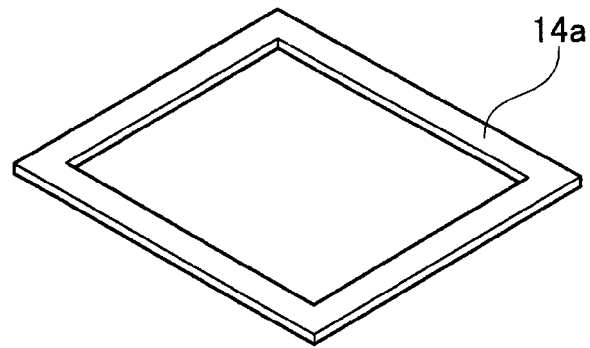
Figure 39C:
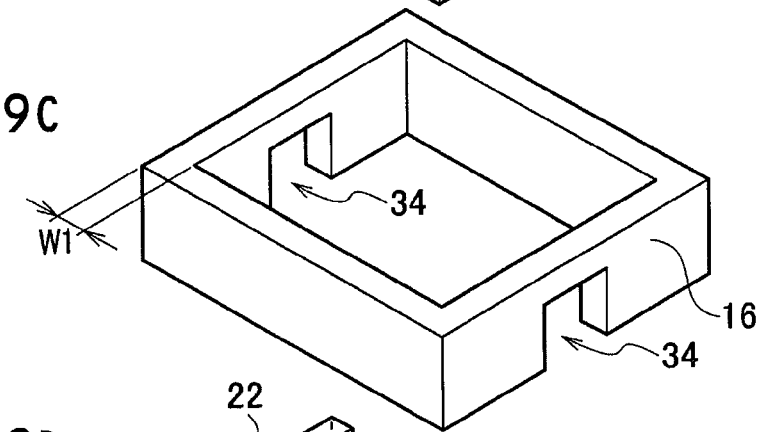
FIG. 39C is a schematic bird's-eye view showing the package according to the eighth embodiment, and is a schematic configuration diagram showing a metal wall 16.
Figure 39D:
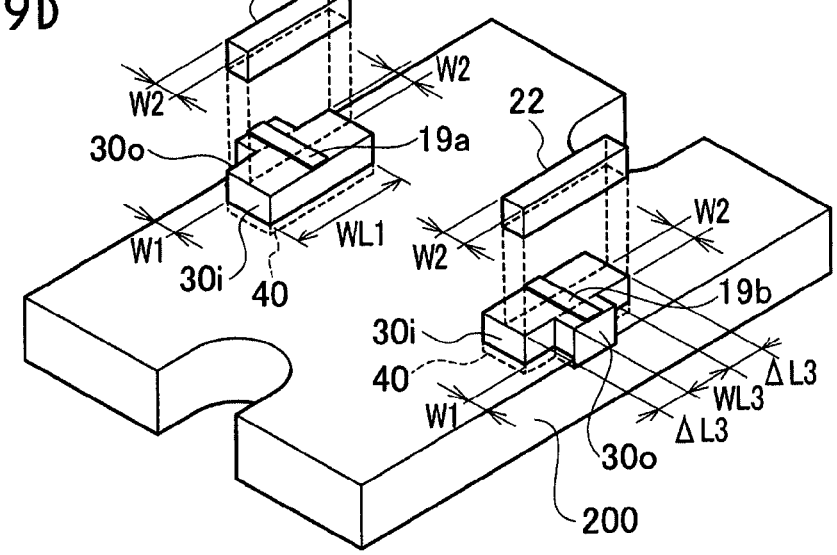
FIG. 39D is a schematic bird's-eye view showing the package according to the eighth embodiment, and is a schematic configuration diagram showing a lower layer feed through (30i and 30o) on a conductive base plate 200 including a counter boring unit 40, an input stripline 19a and an output stripline 19b on the lower layer feed through (30i and 30o), and an upper layer feed through 22 on the lower layer feed through 30i.

A schematic planar pattern configuration showing by enlarging the feed through structure near the output terminal of the package 1 according to the seventh embodiment is expressed as shown in FIG. 38. Also, a schematic cross-sectional structure taken in the line V-V of FIG. 38 is similarly expressed as FIG. 31.

As shown in FIG. 38, the following formula is satisfied: $WL1-WL3=2\Delta L3$ where WL1 is the width of the inside lower layer feed through 20i disposed along the lines of the metal wall 16 in plane view, and WL2 is the width of the outside lower layer feed through 20o disposed along the lines of the metal wall 16 in plane view. Since the air gap is formed between the metal wall 16 and the outside lower layer feed through 20o, the horizontal overlap width between the inside lower layer feed through 20i and the metal wall 16 is a predetermined value rather smaller than $\Delta L3$. Also, $\Delta 2$ is the lengthwise overlap width between the upper layer feed through 22 and the metal wall 16, in FIG. 38.

As shown in FIG. 36 to FIG. 38, the package according to the seventh embodiment includes: a conductive base plate 200; a metal wall 16 disposed on the conductive base plate 200; through-holes 34 formed at both the input and output portions of the metal wall 16; lower layer feed throughs (20i and 20o) disposed on the conductive base plate 200; wiring patterns 19a and 19b disposed respectively on the lower layer feed throughs (20i and 20o); upper layer feed throughs 22 disposed respectively on a part of the lower layer feed throughs (20i and 20o) and a part of the wiring patterns 19a and 19b; and terminals 21a and 21b disposed respectively on the wiring pattern 19a and 19b. In this case, a width of a part of the lower layer feed through 20 is wider than a width of the through-hole 34, and the lower layer feed throughs (20i and 20o) are adhered to the metal wall 16 side surface. Similarly, a width of the upper layer feed throughs 22 is wider than the width of the through-hole 34, and the upper layer feed throughs 22 are adhered to the metal wall 16 side surface. Accordingly, air layers 23 are formed respectively between the wiring patterns 19a and 19b and the internal wall of the through-holes 34.

In the package 1 according to the seventh embodiment, the upper layer feed through 22 and the lower layer feed through (20i and 20o) are adhered to the inside of the metal wall 16.

Also, a semiconductor device 24 is disposed on the conductor plate 200, and the metal wall 16 disposed on the conductive base plate 200 houses the semiconductor device 24.

Moreover, as shown in FIG. 36 to FIG. 38, the terminals 21a and 21b are disposed respectively in the through-holes 34.

In the package 1 according to the seventh embodiment, the air layer 23 is formed between the sidewall of the lower layer feed through 20o, and the internal wall of the through-hole 34. That is, as shown in FIG. 20, in the package 1 according to the seventh embodiment, the outside lower layer feed through 20o has the air layer 23 between the outside lower layer feed through 20o and the through-holes 34 of the metal wall 16, without contacting the through-hole 34 of the metal wall 16.

(High Frequency Terminal Structure)

According to a high frequency terminal structure according to the seventh embodiment, the air layers 23 are formed respectively at the top surfaces of the signal lines of the input stripline 19a and the output stripline 19b of the portion surrounded by the metal wall 16, and thereby reduction of impedance is avoidable. As a result, it can obtain the high frequency terminal structure whose impedance matching is satisfactory, reflection loss is controlled, and characteristics of the electric power resistance.

(Fabrication Method of Package)

Since a fabrication method of the package according to the seventh embodiment is the same as the fabrication method of the package according to the first embodiment, duplicating explanation is omitted.

In the package 1 according to the seventh embodiment, the outside lower layer feed throughs 20o are surrounded by the metal wall 16, and the upper layer feed throughs 22 are adhered to the sidewall of the metal wall 16, and thereby the air layers 23 are formed respectively at the top surfaces of the signal lines of input stripline 19a and the output stripline 19b. Accordingly, reduction of impedance is avoided.

According to the package 1 according to the seventh embodiment, since each of the air layers 23 is formed at each of the top surfaces of the signal lines of input stripline 19a and the output stripline 19b of the portion surrounded by the metal wall 16, the reduction of impedance is avoidable. As a result, it can obtain the feed through structure whose impedance matching is satisfactory, reflection loss is controlled, and characteristics of the electric power resistance.

According to the seventh embodiment, in the high airtight package used for a microwave band semiconductor device, it can provide the package which keeps characteristic impedance at 50Ω, without degrading an electric power capability.

Eighth Embodiment

A schematic bird's-eye view configuration for explaining a package according to a eighth embodiment is expressed as shown in FIG. 39. FIG. 39A shows a schematic configuration showing a metal cap 10. FIG. 39B shows a schematic configuration showing a metal seal ring 14a. FIG. 39C shows a schematic configuration showing a metal wall 16. FIG. 39D shows a schematic configuration showing a lower layer feed through (30i and 30o) on a conductive base plate 200 provided with a counter boring unit 40, an input stripline 19a and an output stripline 19b on the lower layer feed through (30i and 30o), and an upper layer feed through 22.

A schematic planar pattern configuration of the package 1 according to the eighth embodiment is similarly expressed as FIG. 37. Also, a schematic cross-sectional structure taken in the line I-I of FIG. 37 is similarly expressed as FIG. 33.

Moreover, a schematic cross-sectional structure taken in the line II-II of FIG. 37 is similarly expressed as FIG. 23, and a schematic cross-sectional structure taken in the line III-III of FIG. 37 is similarly expressed as FIG. 28. Also, a schematic cross-sectional structure taken in the line IV-IV of FIG. 37 is similarly expressed as FIG. 35.

In the package 1 according to eighth embodiment, as shown in FIG. 39, the conductive base plate 200 includes the counter boring units 40, and the lower layer feed throughs (30i and 30o) are disposed respectively on the counter boring units 40 of the conductive base plate 200.

In the package 1 according to the eighth embodiment, the air layer 23 is formed between the sidewall of the lower layer feed through 30o, and the internal wall of the through-hole 34. That is, as shown in FIG. 23, in the package 1 according to the eighth embodiment, the outside lower layer feed through 30o has the air layer 23 between the outside lower layer feed through 30o and the through-holes 34 of the metal wall 16, without contacting the through-hole 34 of the metal wall 16. Duplicating explanation is omitted since other configurations are the same as those of the package according to the seventh embodiment.

(High Frequency Terminal Structure)

According to a high frequency terminal structure according to the eighth embodiment, the air layers 23 are formed respectively at the top surfaces of the signal lines of the input stripline 19a and the output stripline 19b of the portion surrounded by the metal wall 16, and thereby reduction of impedance is avoidable. As a result, it can obtain the high frequency terminal structure whose impedance matching is satisfactory, reflection loss is controlled, and characteristics of the electric power resistance.

(Fabrication Method of Package)

Since a fabrication method of the package according to the eighth embodiment is the same as the fabrication method of the package according to the second embodiment, duplicating explanation is omitted.

According to the eighth embodiment, since the air layer is formed between the top surface of the signal line of the portion surrounded by the metal wall and the metal wall, the reduction of impedance is avoidable. As a result, it can obtain the package whose impedance matching is satisfactory, reflection loss is controlled, and characteristics of the electric power resistance.

According to the eighth embodiment, it can provide the high airtight package which can prevent the displacement between the convex feed through and the metal wall, by using the conductive base plate including the counter boring unit.

Moreover, since the RF input output terminals are disposed respectively in the through-holes disposed in the input and output portions of the metal wall according to the package according to the eighth embodiment, the size of the conductive base plate in the y axial direction can be shortened. Accordingly, the size of the occupied area of the package can reduced, thereby contributing to a saved weight and a reduced cost.

Since the metal wall 16 does not contact the side surface of the through-hole 34 by giving such a gap between the metal wall 16 and the outside lower layer feed through 30o, an impedance of the input/output striplines 19a and 19b on the outside lower layer feed throughs 30o can be kept highly. Moreover, since the outside lower layer feed through 30o is not subject to a stress from the metal wall 16, it can reduce a possibility that a stress crack will occur in the outside lower layer feed through 30o.

According to the eighth embodiment, in the high airtight package used for a microwave band semiconductor device, it can provide the package which keeps characteristic impedance at 50Ω, without degrading an electric power capability.

Ninth Embodiment

Package Structure

A schematic bird's-eye view configuration for explaining a package according to a ninth embodiment is expressed as shown in FIG. 40. FIG. 40A shows a schematic configuration showing a metal cap 10. FIG. 40B shows a schematic configuration showing a metal seal ring 14a. FIG. 40C shows a schematic configuration showing a metal wall 16. FIG. 40D shows a schematic configuration of a lower layer feed through (20i and 20o) on a conductive base plate 200, an input stripline 19a and an output stripline 19b on the lower layer feed through (20i and 20o), and an upper layer feed through 22 on the lower layer feed through 20i.

As shown in FIG. 40, the package according to the ninth embodiment includes: a metal cap 10; a metal seal ring 14a; a metallic wall 16; a conductive base plate 200; lower layer feed throughs (20i and 20o) disposed on the conductive base plate 200; an input stripline 19a and an output stripline 19b disposed respectively on the lower layer feed throughs (20i and 20o); and upper layer feed throughs 22 disposed respectively on the outside lower layer feed throughs 20o.

Figure 40A:
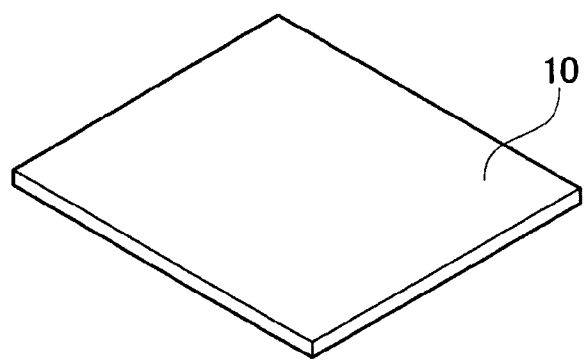
FIG. 40A is a schematic bird's-eye view showing a package according to a ninth embodiment, and is a schematic configuration diagram showing a metal cap 10.
Figure 40B:
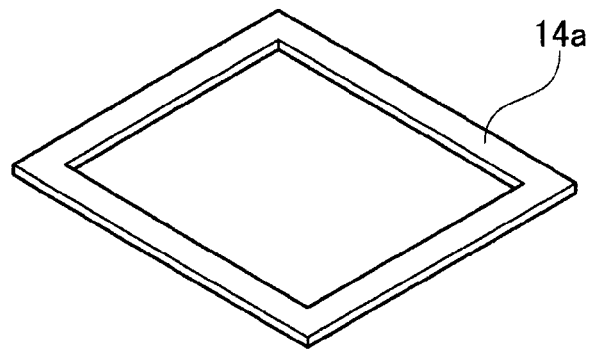
Figure 40C:
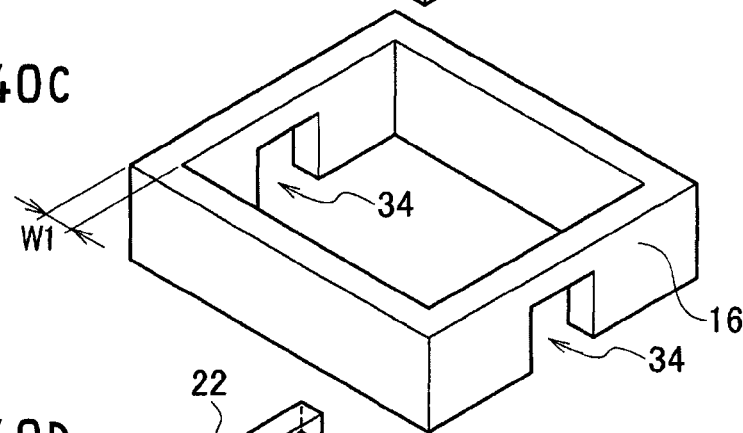
FIG. 40C is a schematic bird's-eye view showing the package according to the ninth embodiment, and is a schematic configuration diagram showing a metal wall 16.
Figure 40D:
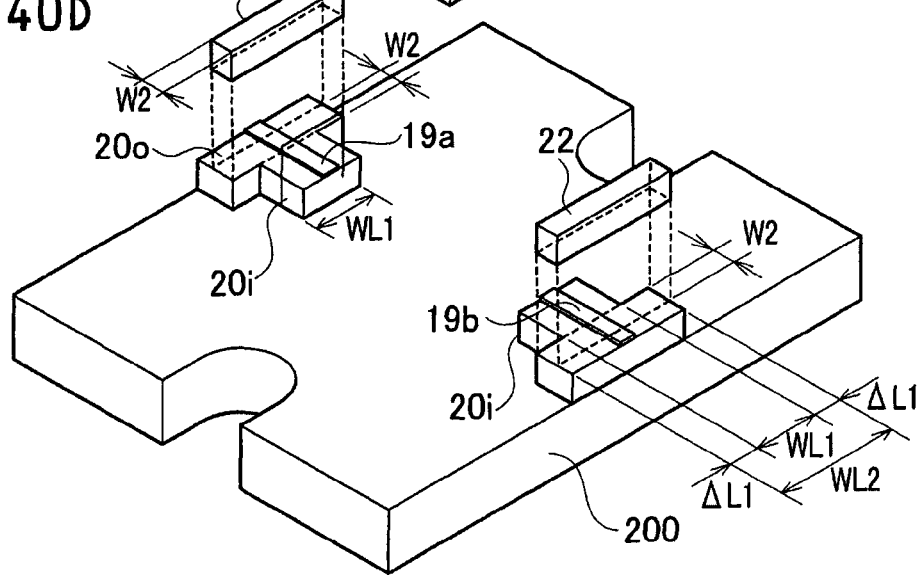
FIG. 40D is a schematic bird's-eye view showing the package according to the ninth embodiment, and is a schematic configuration diagram showing a lower layer feed through (20i and 20o) on a conductive base plate 200, an input stripline 19a and an output stripline 19b on the lower layer feed through (20i and 20o), and an upper layer feed through 22 on the lower layer feed through 20i.
Figure 42:
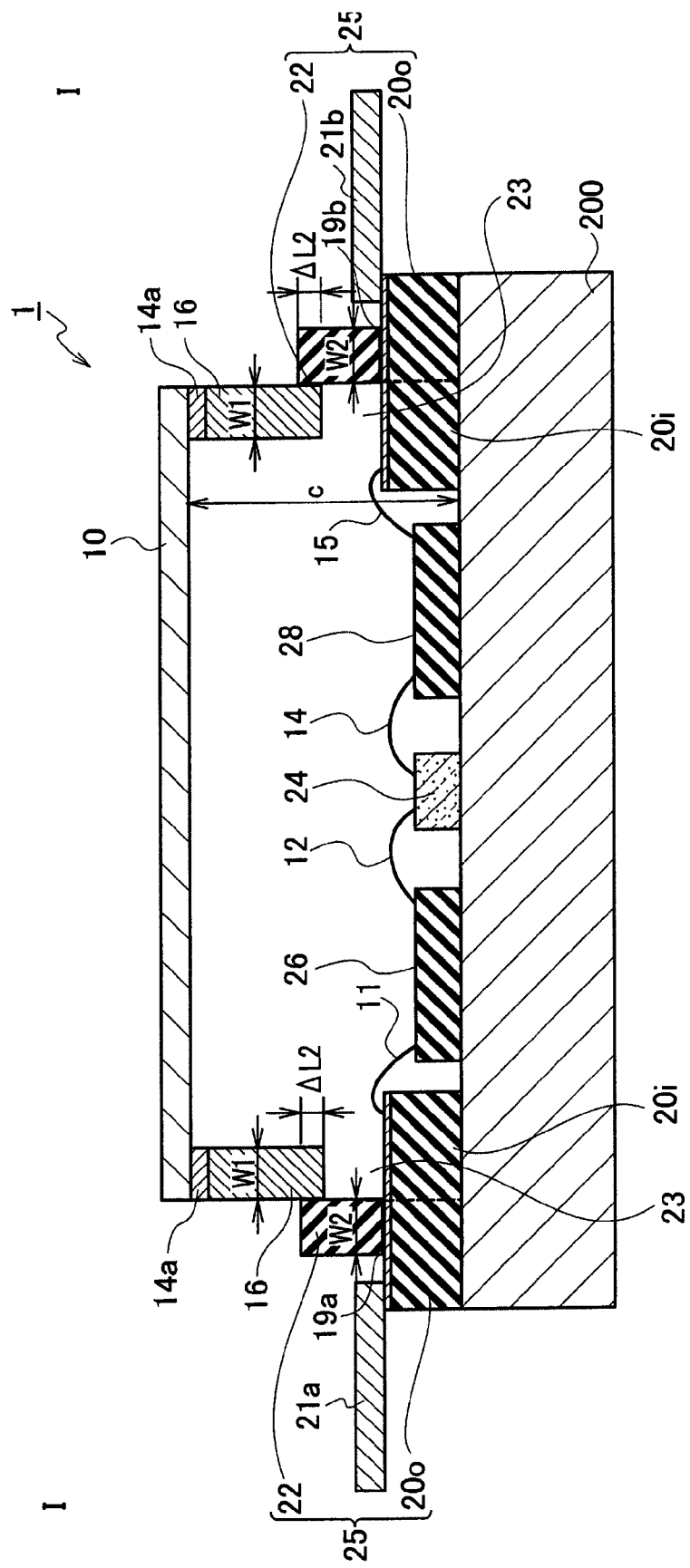
FIG. 42 is a schematic cross-sectional configuration showing the package according to the ninth embodiment, and is a schematic cross-sectional structure diagram taken in the line I-I of FIG. 41.
Figure 43:
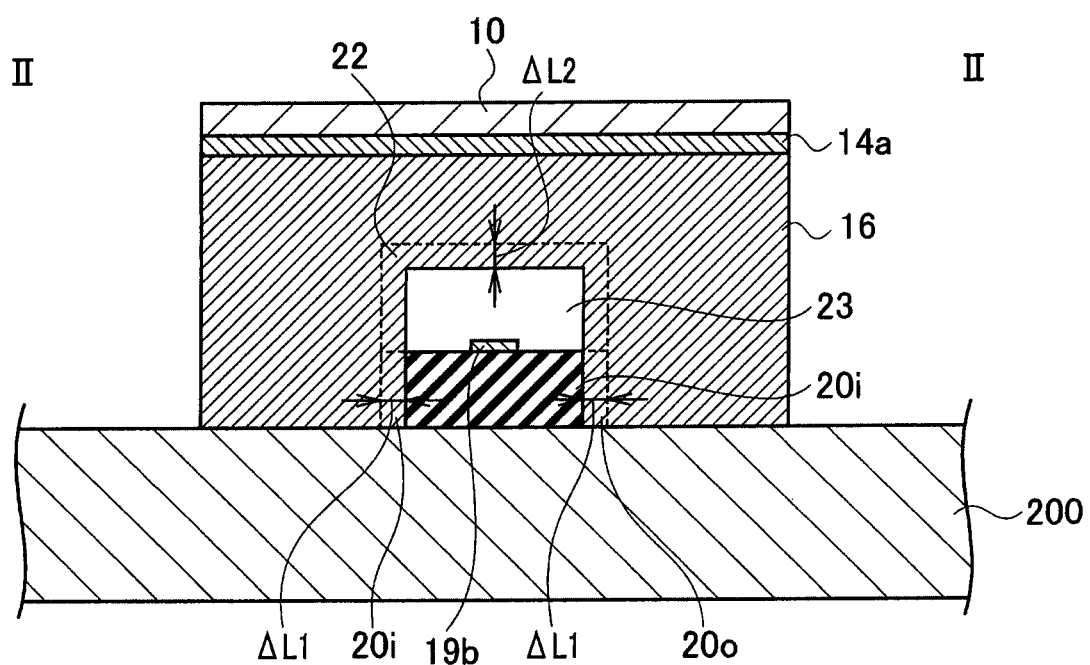
FIG. 43 is a schematic cross-sectional configuration showing the package according to the ninth embodiment, and is a schematic cross-sectional structure diagram taken in the line II-II of FIG. 41.
Figure 45:
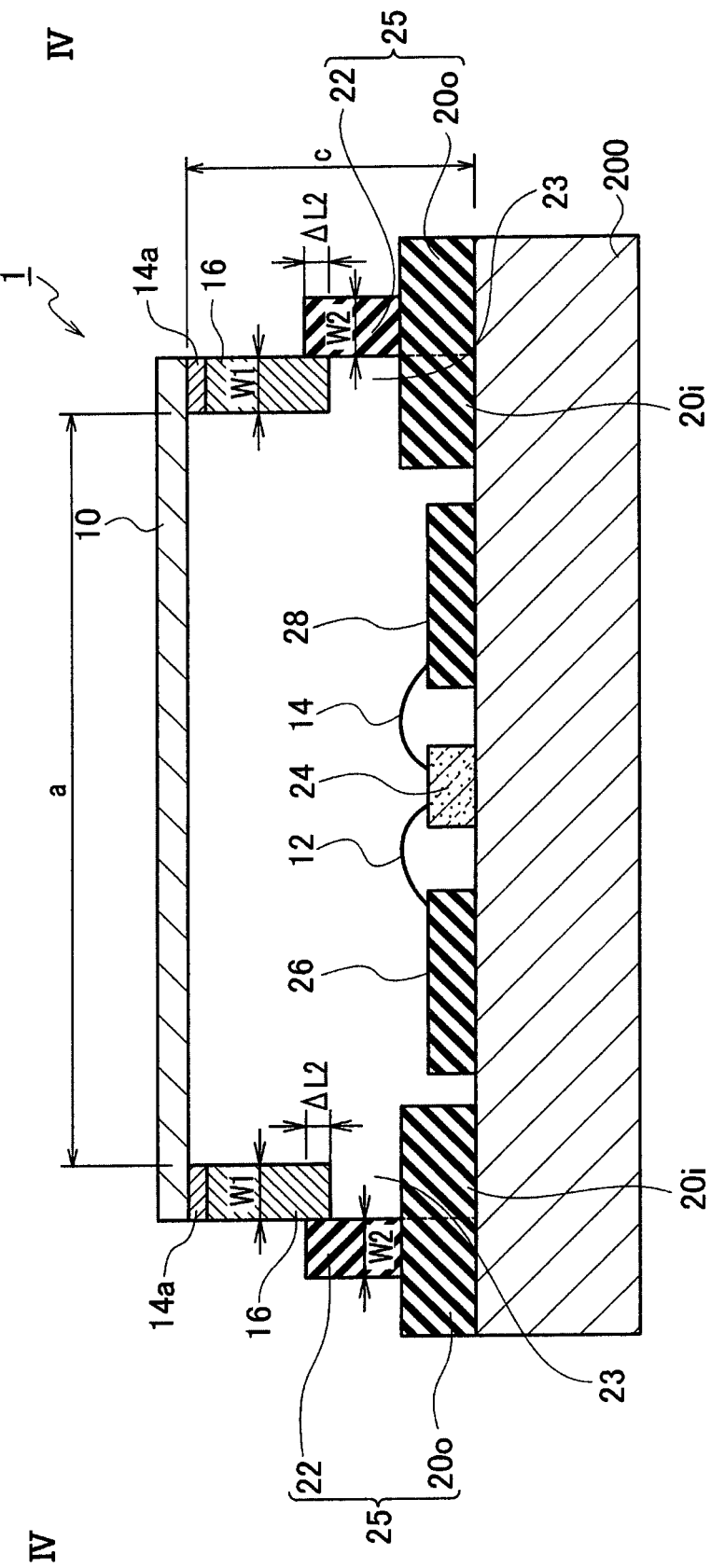
FIG. 45 is a schematic cross-sectional configuration showing the package according to the ninth embodiment, and is a schematic cross-sectional structure diagram taken in the line IV-IV of FIG. 41.

As shown in FIG. 40D, a width WL2 of the outside lower layer feed through 20o and the upper layer feed through 22 disposed outside the metal wall 16 is formed more widely than a width WL1 of the through-hole 34 of the metal wall 16. In this case, WL2−WL1=2ΔL1, for example, as shown in FIG. 40. Thus, the outside lower layer feed through 20o and the upper layer feed through 22 can be contacted on the side surface of the metal wall 16, by forming the width WL2 of the outside lower layer feed through 20o more widely than the width WL1 of the through-hole 34 of the metal wall 16, thereby securing airtightness. As shown in FIG. 42, FIG. 43, and FIG. 45, an air gap is provided between the input stripline 19a and the metal wall 16. Since the air layer 23 is formed between the top surface of the input stripline 19a, and the metal wall 16, reduction of impedance is avoidable.

Also, as shown in FIG. 42 and FIG. 45, an air gap is provided between the output stripline 19b and the metal wall 16. Since the air layer 23 is formed between the top surface of the output stripline 19b, and the metal wall 16, reduction of impedance is avoidable.

The input stripline 19a and the output stripline 19b are formed of tungsten, gold plate, copper foil, etc., for example. A width and thickness of the input stripline 19a and the output stripline 19b are determined in consideration of value of an amount of electric power capability, and values of a dielectric constant and desired characteristic impedance of the lower layer feed through (20i and 20o).

(Plane Pattern Configuration)

Figure 41:
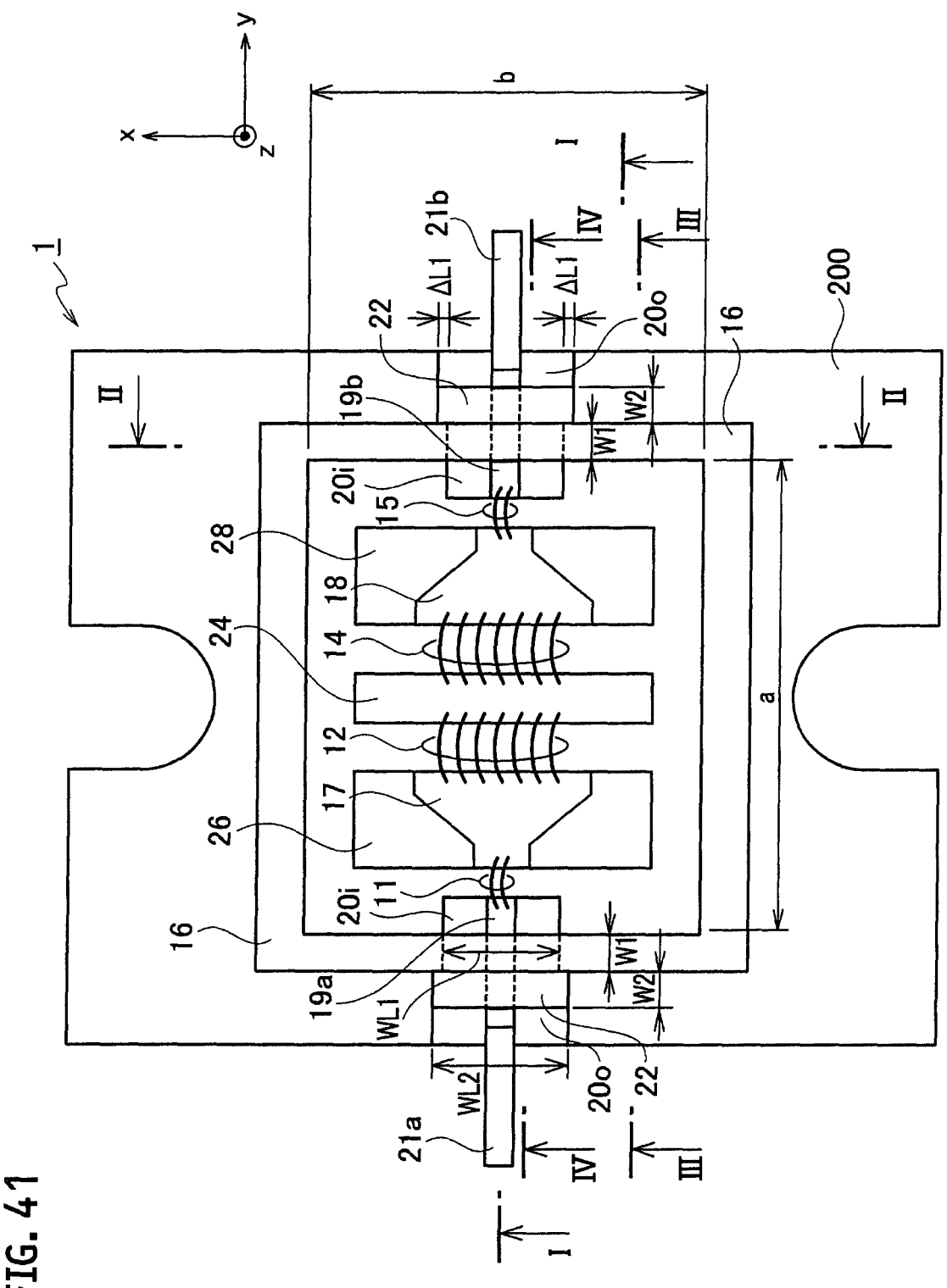
FIG. 41 is a schematic planar pattern configuration diagram showing the package according to the ninth embodiment.
Figure 44:
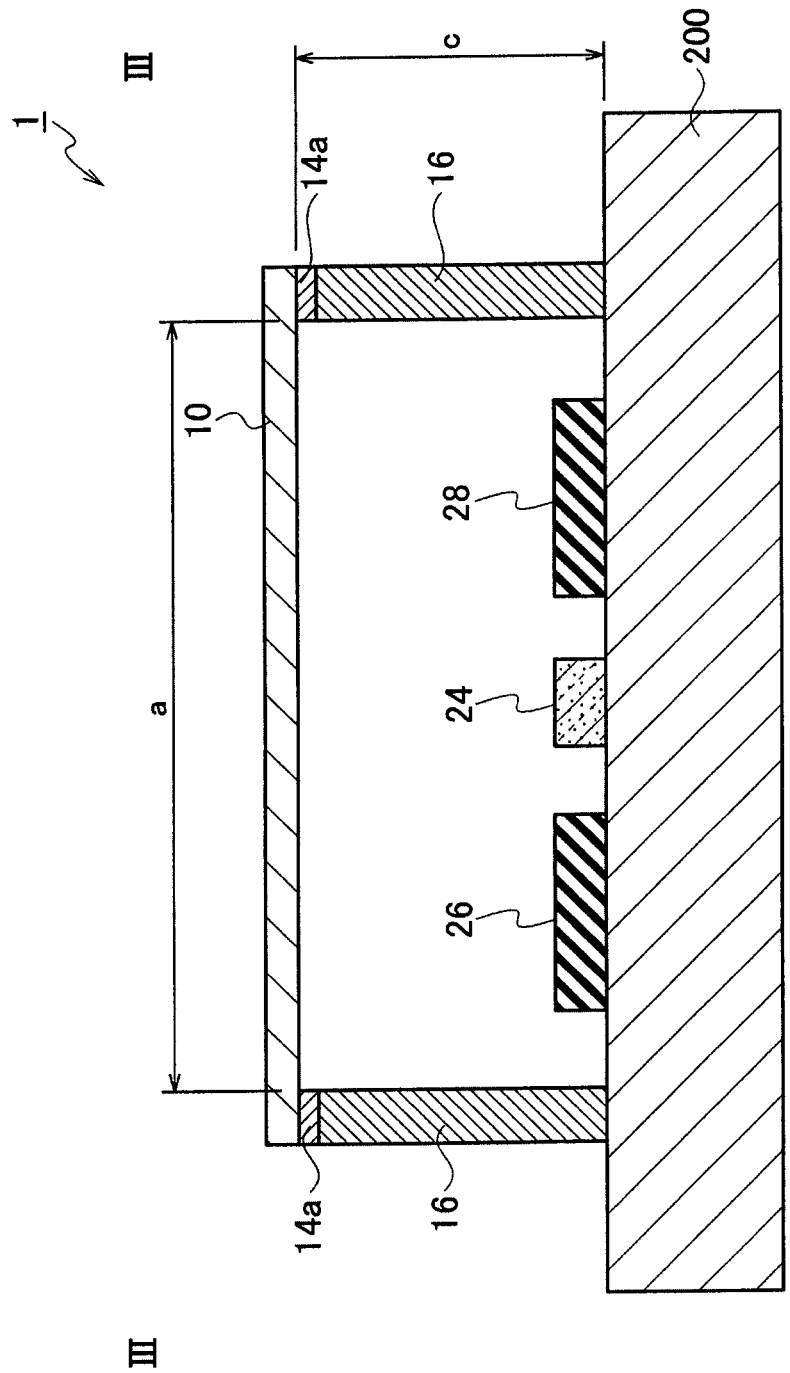
FIG. 44 is a schematic cross section configuration showing the package according to the ninth embodiment, and is a schematic cross-sectional structure diagram taken in the line III-III of FIG. 41.

A schematic planar pattern configuration of the package 1 according to the ninth embodiment is expressed as shown in FIG. 41. Also, a schematic cross-sectional structure taken in the line I-I of FIG. 41 is expressed as shown in FIG. 42. Moreover, a schematic cross-sectional structure taken in the line II-II of FIG. 41 is expressed as shown in FIG. 43, and a schematic cross-sectional structure taken in the line III-III of FIG. 41 is expressed as shown in FIG. 44. Also, a schematic cross-sectional structure taken in the line IV-IV of FIG. 41 is expressed as shown in FIG. 45. In FIG. 41, y axis indicates a direction which the line I-I extends, x axis indicates a direction in parallel to the drawing sheet and vertical to the y axis, and z axis indicates a direction vertical to the drawing sheet.

As shown in FIG. 40 to FIG. 45, the package according to the ninth embodiment includes: a conductive base plate 200; a metal wall 16 disposed on the conductive base plate 200; through-holes 34 formed at both the input and output portions of the metal wall 16; lower layer feed throughs (20i and 20o) disposed on the conductive base plate 200; wiring patterns 19a and 19b disposed respectively on the lower layer feed throughs (20i and 20o); upper layer feed throughs 22 disposed respectively on a part of the lower layer feed throughs (20i and 20o) and a part of the wiring patterns 19a and 19b; and terminals 21a and 21b disposed respectively on the wiring pattern 19a and 19b. In this case, a width of a part of the lower layer feed through 20 is wider than a width of the through-hole 34, and the lower layer feed throughs (20i and 20o) are adhered to the metal wall 16 side surface. Similarly, a width of the upper layer feed throughs 22 is wider than the width of the through-hole 34, and the upper layer feed throughs 22 are adhered to the metal wall 16 side surface. Accordingly, air layers 23 are formed respectively between the wiring patterns 19a and 19b and the internal wall of the through-holes 34.

Moreover, the upper layer feed through 22 and the lower layer feed through 20 are adhered to the outside of the metal wall 16.

Moreover, a semiconductor device 24 is disposed on the conductor plate 200, and the metal wall 16 disposed on the conductive base plate 200 houses the semiconductor device 24.

As shown in FIGS. 41, 42 and 46-47, terminals 21a and 21b are disposed respectively out of the through-holes 34.

As shown in FIGS. 40-45, in the package 1 according to a ninth embodiment, the upper layer feed through 22 is disposed the outside of the metal wall 16, and are adhered to the sidewall of the metal wall 16 in the external wall of the metal wall 16.

As shown in FIGS. 40-45, in the package 1 according to the ninth embodiment, the inside lower layer feed through 20i is surrounded by the metal wall 16.

As shown in FIGS. 40-45, a lengthwise overlap width between the metal wall 16 and the upper layer feed through 22 is expressed by ΔL2. As shown in FIGS. 40-45, a horizontal overlap width between the metal wall 16 and the outside lower layer feed through 20o is expressed as ΔL1.

The upper layer feed through 22 is adhered to the sidewall of the metal wall 16 with silver brazing, for example. The width size of the adhesion portion is approximately 0.5 mm, for example. Similarly, a contact surface between the lower layer feed through (20i and 20o) and the metal wall 16 is also adhered with silver brazing, for example.

As shown in FIGS. 40-45, the inside lower layer feed through 20i passes through the metal wall 16. A bottom surface of the lower layer feed through (20i and 20o) contacts the conductive base plate 200, and a side surfaces of the lower layer feed through (20i and 20o) contacts the metal wall 16.

Moreover, the package 1 according to the ninth embodiment includes: an input stripline 19a disposed on the lower layer feed through (20i and 20o), in the input portion of the metal wall 16; and an output stripline 19b disposed on the lower layer feed through (20i and 20o), in the output portion of the metal wall 16.

Moreover, the upper layer feed through 22 is disposed at the outside of the metal wall 16, and is adhered to the sidewall of the metal wall 16 in the external wall of the metal wall 16, as above-mentioned.

Also, as shown in FIG. 42 and FIG. 45, an air gap is provided between the input stripline 19a and the metal wall 16. Since the air layer 23 is formed between the top surface of the input stripline 19a, and the metal walls 16, reduction of impedance is avoided.

Similarly, as shown in FIGS. 42, 43 and 45, an air gap 23 is provided between the output stripline 19b and the metal wall 16. Since the air layer 23 is formed between the top surface of the output stripline 19b and the metal walls 16, reduction of impedance is avoided.

Also, in the package 1 according to the ninth embodiment, the lower layer feed through (20i, 20o) includes the inside lower layer feed through 20i disposed at the lower side and the inside of the metal wall 16, and the outside lower layer feed through 20o disposed at the outside of the metal wall 16. In plane view, the width WL1 of the inside lower layer feed through 20i disposed along the lines of the metal wall 16 is narrower than the width WL2 of the outside lower layer feed through 20o.

Also, the package 1 according to the ninth embodiment may include: an input circuit substrate 26 and an output circuit substrate 28 which are adjoining of the semiconductor device 24 and are disposed on the conductive base plate 200 surrounded by the metal wall 16; an input matching circuit 17 which is disposed on the input circuit substrate 26 and is connected to the input stripline 19a; an output matching circuit 18 which is disposed on the output circuit substrate 28 and is connected to the output stripline 19b; and bonding wires 12 and 14 connect respectively between the semiconductor device 24 and the input matching circuit 17 and the output matching circuit 18. In addition, between the input stripline 19a and the input matching circuits 17 is connected by the bonding wire 11, and between the output stripline 19b and the output matching circuits 18 is connected by the bonding wire 15.

Moreover, the package 1 according to the ninth embodiment includes a metal seal ring 14a disposed on the metal wall 16, and a metal cap 10 disposed on the metal seal ring 14a.
(High Frequency Terminal Structure)

According to a high frequency terminal structure according to the ninth embodiment, the air layers 23 are formed respectively at the top surfaces of the signal lines of the input stripline 19a and the output stripline 19b of the portion surrounded by the metal wall 16, and thereby reduction of impedance is avoidable. As a result, it can obtain the high frequency terminal structure whose impedance matching is satisfactory, reflection loss is controlled, and characteristics of the electric power resistance.
(Fabrication Method of Package)

Since a fabrication method of the package according to the ninth embodiment is the same as the fabrication method of the package according to the first embodiment, duplicating explanation is omitted.
(Feed Through Structure)

Figure 46:
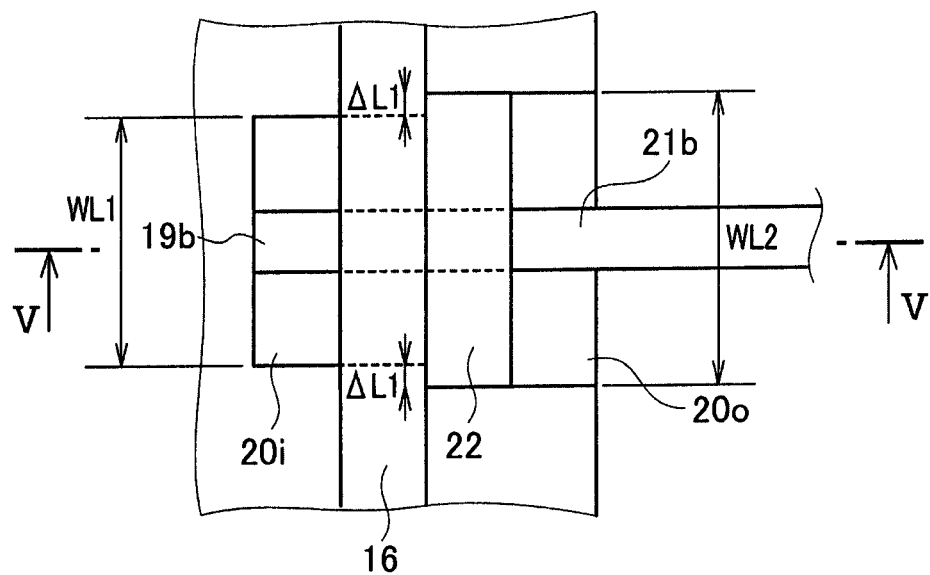
FIG. 46 is a schematic planar pattern configuration diagram showing by enlarging a feed through structure near an output terminal of the package according to the ninth embodiment.
Figure 47:
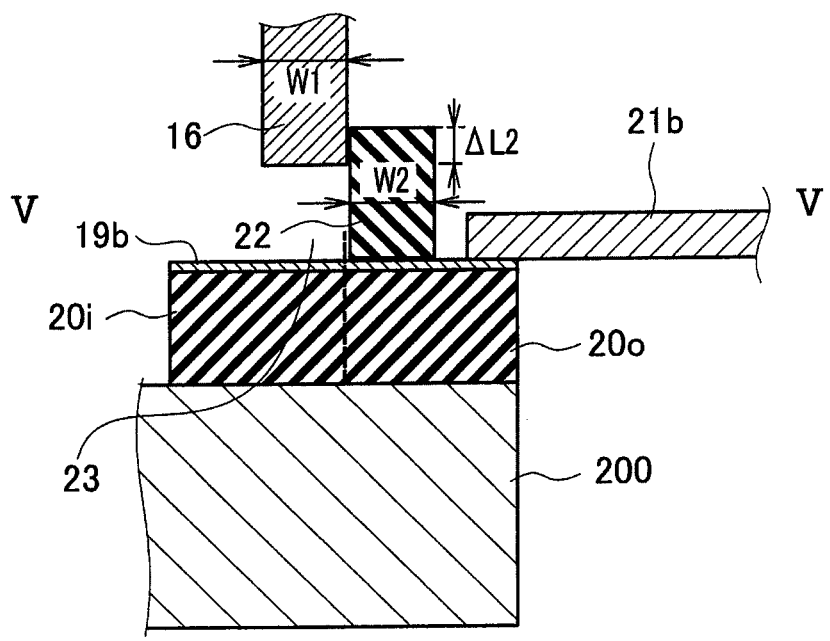
FIG. 47 is a cross-sectional structure showing by enlarging the feed through structure near the output terminal of the package according to the ninth embodiment, and is a schematic cross-sectional structure diagram taken in the line V-V of FIG. 46.
Figure 48A:
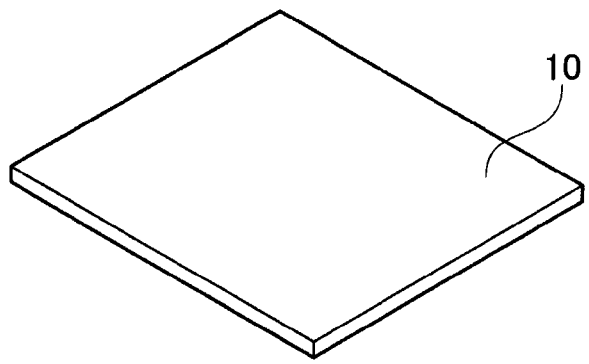
FIG. 48A is a schematic bird's-eye view showing a package according to a tenth embodiment, and is a schematic configuration diagram showing a metal cap 10.
Figure 48B:
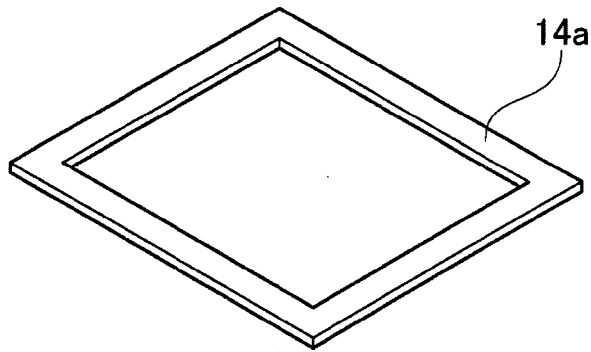
Figure 48C:
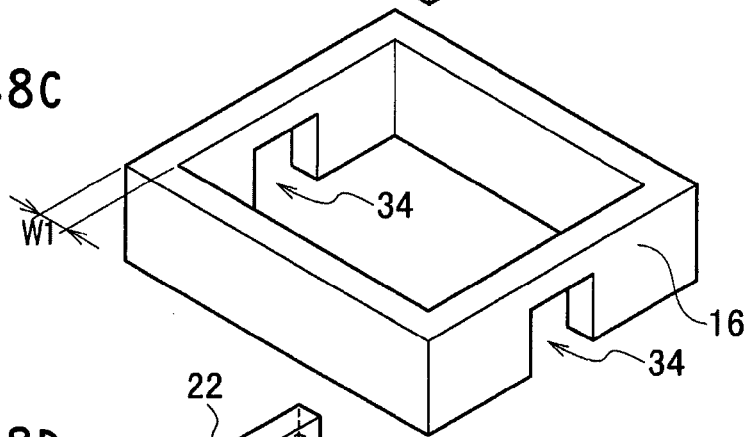
FIG. 48C is a schematic bird's-eye view showing the package according to the tenth embodiment, and is a schematic configuration diagram showing a metal wall 16.
Figure 48D:
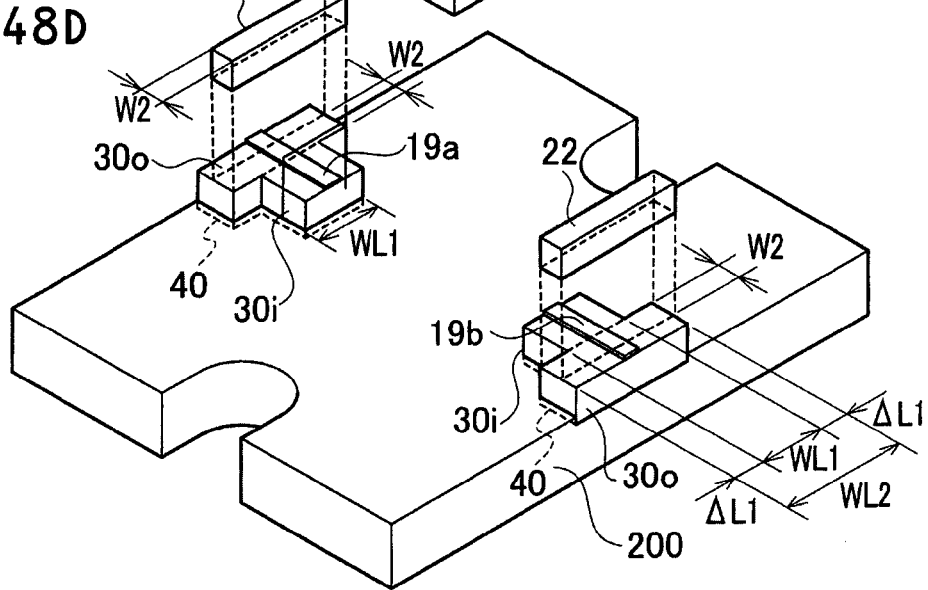
FIG. 48D is a schematic bird's-eye view showing the package according to the tenth embodiment, and is a schematic configuration diagram showing a lower layer feed through (30i and 30o) on a conductive base plate 200 including a counter boring unit 40, an input stripline 19a and an output stripline 19b on the lower layer feed through (30i and 30o), and an upper layer feed through 22 on the lower layer feed through 30i.

A schematic planar pattern configuration showing by enlarging the feed through structure near the output terminal of the package 1 according to the ninth embodiment is expressed as shown in FIG. 46. Also, a schematic cross-sectional structure taken in the line V-V of FIG. 46 is expressed as shown in FIG. 47.

As shown in FIG. 46, the following formula is satisfied: WL2−WL1=2ΔL1 where WL2 is the width of the outside lower layer feed through 20o disposed along the lines of the metal wall 16 in plane view, WL1 is the width of the inside lower layer feed through 20i disposed along the lines of the metal wall 16 in plane view, and ΔL1 is the horizontal overlap width between the outside lower layer feed through 20o and the metal wall 16 in plane view, as mentioned above. Also, Δ2 is the lengthwise overlap width between the upper layer feed through 22 and the metal wall 16, in FIG. 47.

In the package 1 according to the ninth embodiment, the inside lower layer feed throughs 20i are surrounded by the metal wall 16, and the upper layer feed throughs 22 are adhered to the sidewall of the metal wall 16, and thereby the air layers 23 are formed respectively at the top surfaces of the signal lines of input stripline 19a and the output stripline 19b. Accordingly, reduction of impedance is avoided.

According to the package 1 according to the ninth embodiment, since each of the air layers 23 is formed at each of the top surfaces of the signal lines of input stripline 19a and the output stripline 19b of the portion surrounded by the metal wall 16, the reduction of impedance is avoidable. As a result, it can obtain the feed through structure whose impedance matching is satisfactory, reflection loss is controlled, and characteristics of the electric power resistance.

In the package 1 according to the ninth embodiment, a length a in the y axial direction of the portion surrounded by the metal wall 16 to configure the cavity can be shortened compared with the first to eighth embodiments. Accordingly, compared with the first to eighth embodiments, the value of a cavity resonance frequency in TE111 mode can be set up highly, and high frequency performance can be achieved.

According to the ninth embodiment, in the high airtight package used for a microwave band semiconductor device, it can provide the package which keeps characteristic impedance at 50Ω, without degrading an electric power capability.

Tenth Embodiment

A schematic bird's-eye view configuration for explaining a package according to a tenth embodiment is expressed as shown in FIG. 48. FIG. 48A shows a schematic configuration showing a metal cap 10. FIG. 48B shows a schematic configuration showing a metal seal ring 14a. FIG. 48C shows a schematic configuration showing a metal wall 16. FIG. 48D shows a schematic configuration showing a lower layer feed through (30i and 30o) on a conductive base plate 200 provided with a counter boring unit 40, an input stripline 19a and an output stripline 19b on the lower layer feed through (30i and 30o), and an upper layer feed through 22.

Figure 49:
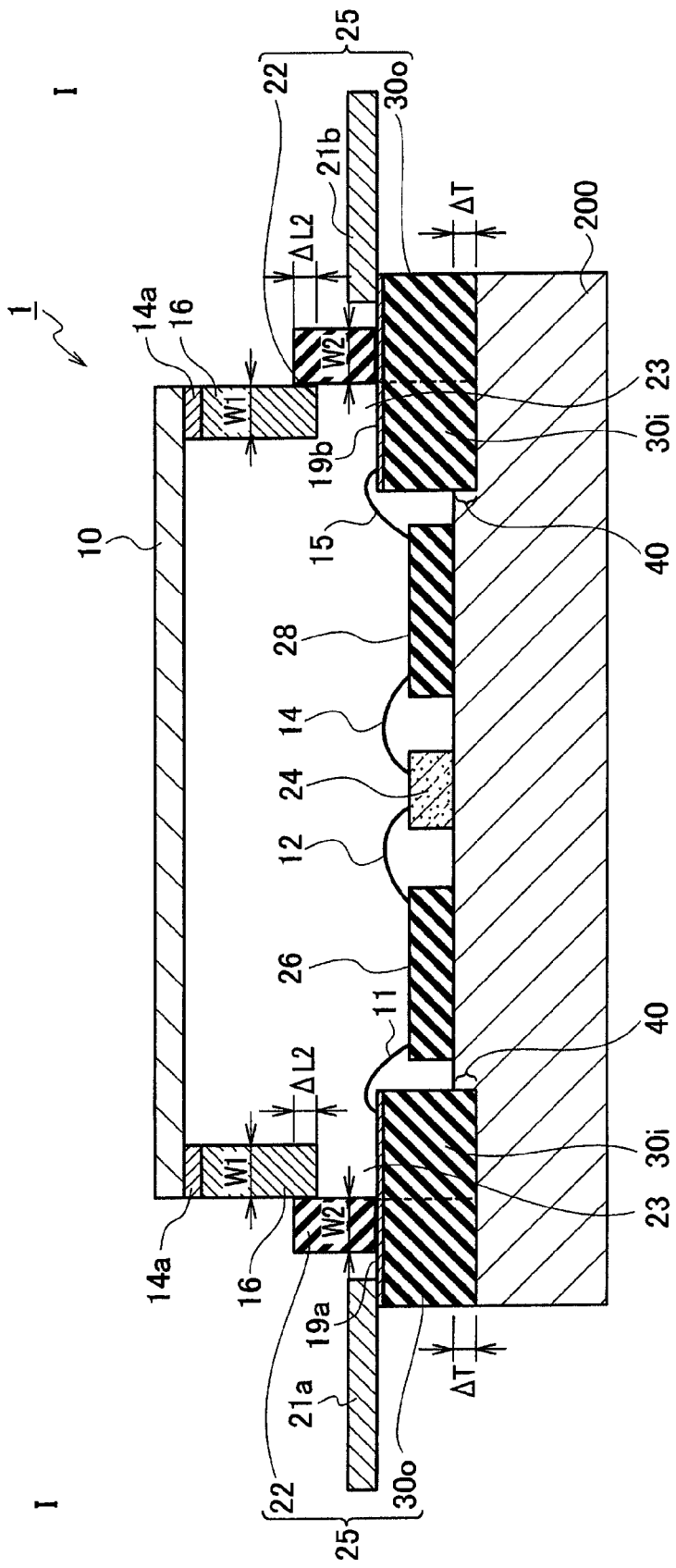
FIG. 49 is a schematic cross-sectional configuration showing the package according to the tenth embodiment, and is a schematic cross-sectional structure diagram taken in the line I-I of FIG. 41.
Figure 50:
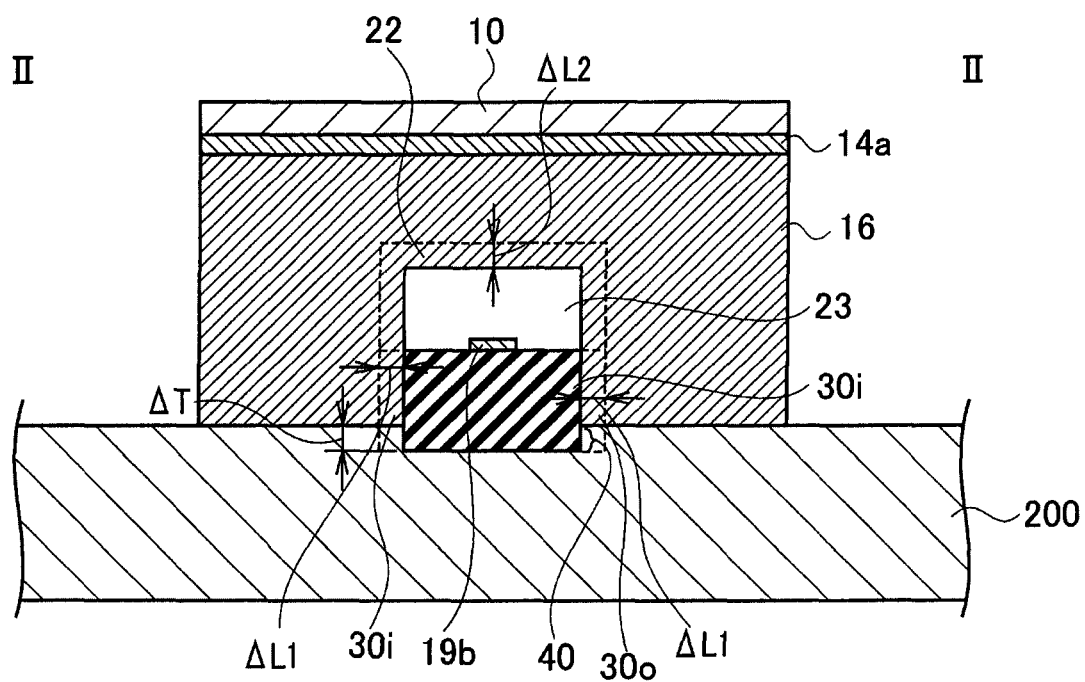
FIG. 50 is a schematic cross-sectional configuration showing the package according to the tenth embodiment, and is a schematic cross-sectional structure diagram taken in the line II-II of FIG. 41.
Figure 51:
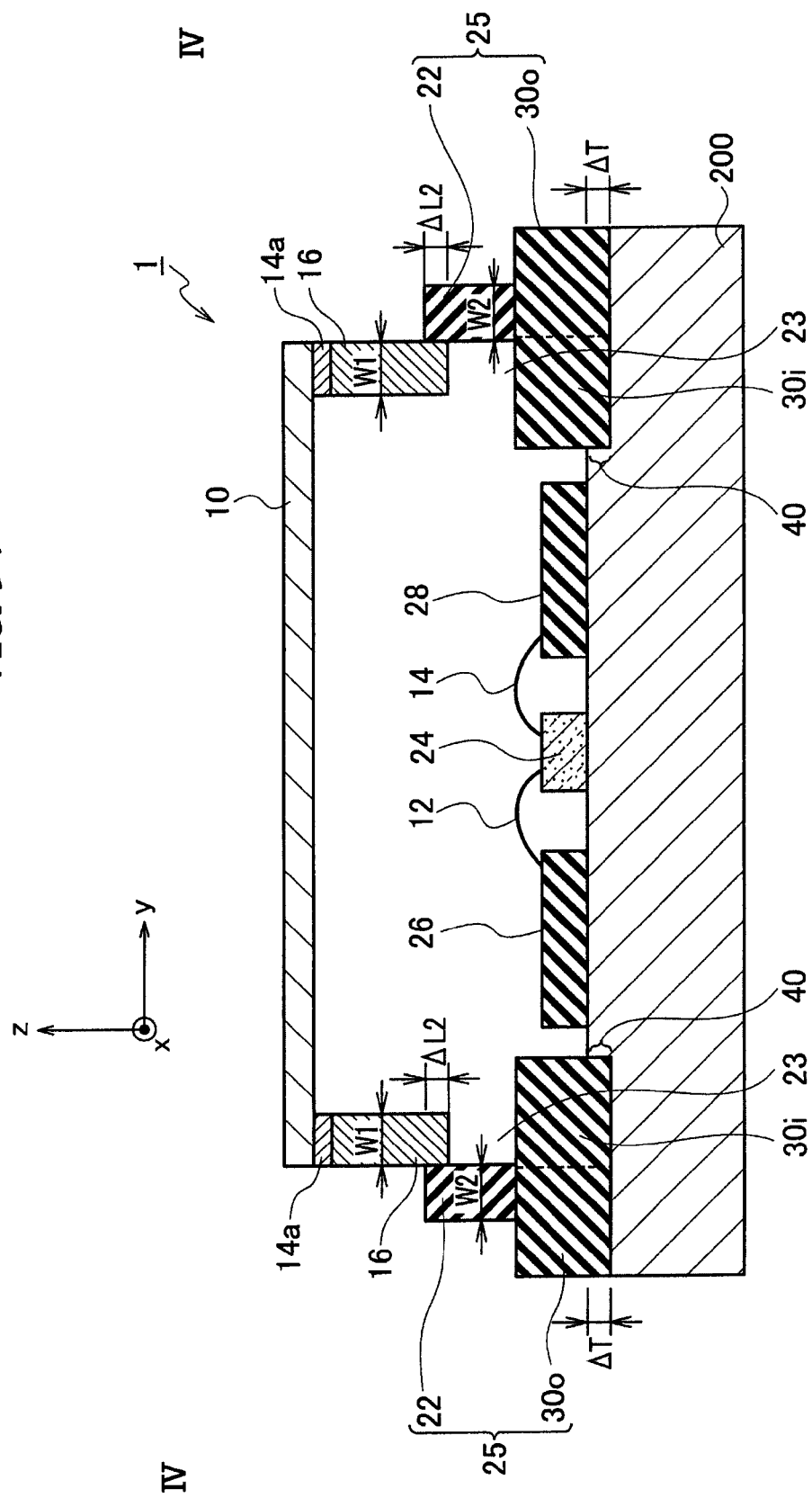
FIG. 51 is a schematic cross-sectional configuration showing the package according to the tenth embodiment, and is a schematic cross-sectional structure diagram taken in the line IV-IV of FIG. 41.

A schematic planar pattern configuration of the package 1 according to the tenth embodiment is similarly expressed as FIG. 41. A schematic cross-sectional structure taken in the line I-I of FIG. 41 is expressed as shown in FIG. 49. A schematic cross-sectional structure taken in the line II-II of FIG. 41 is expressed as shown in FIG. 50. A schematic cross-sectional structure taken in the line IV-IV of FIG. 41 is expressed as shown in FIG. 51.

As shown in FIG. 48 to FIG. 51, in the package 1 according to the tenth embodiment, the conductive base plate 200 includes the counter boring unit 40, and the lower layer feed through (30i and 30o) is disposed on the counter boring unit 40 of the conductive base plate 200. The counter boring depth ΔT of the counter boring unit 40 is approximately 0.1 mm to 0.5 mm, for example. Duplicating explanation is omitted since other configurations are the same as those of the package according to the ninth embodiment.

According to the tenth embodiment, since the lower layer feed through (30i and 30o) can be disposed in the counter boring unit 40 by using the conductive base plate 200 including the counter boring unit 40, it can prevent from a displacement between the convex feed through 25 composed of the lower layer feed through (30i and 30o) and the upper layer feed through 22, and the metal wall 16. Also in the package 1 according to the tenth embodiment, the value of a cavity resonance frequency in TE111 mode can be set up highly, and high frequency performance can be achieved, compared with the first to eighth embodiments.
(High Frequency Terminal Structure)

According to a high frequency terminal structure according to the tenth embodiment, the air layers 23 are formed respectively at the top surfaces of the signal lines of the input stripline 19a and the output stripline 19b of the portion surrounded by the metal wall 16, and thereby reduction of impedance is avoidable. As a result, it can obtain the high frequency terminal structure whose impedance matching is satisfactory, reflection loss is controlled, and characteristics of the electric power resistance.
(Fabrication Method of Package)

Since a fabrication method of the package according to the tenth embodiment is the same as the fabrication method of the package according to the second embodiment, duplicating explanation is omitted.

According to the tenth embodiment, since the air layer is formed between the top surface of the signal line of the portion surrounded by the metal wall and the metal wall, the reduction of impedance is avoidable. As a result, it can obtain the package whose impedance matching is satisfactory, reflection loss is controlled, and characteristics of the electric power resistance.

According to the tenth embodiment, it can provide the high airtight package which can prevent the displacement between the convex feed through and the metal wall, by using the conductive base plate including the counter boring unit.

Figure 52:
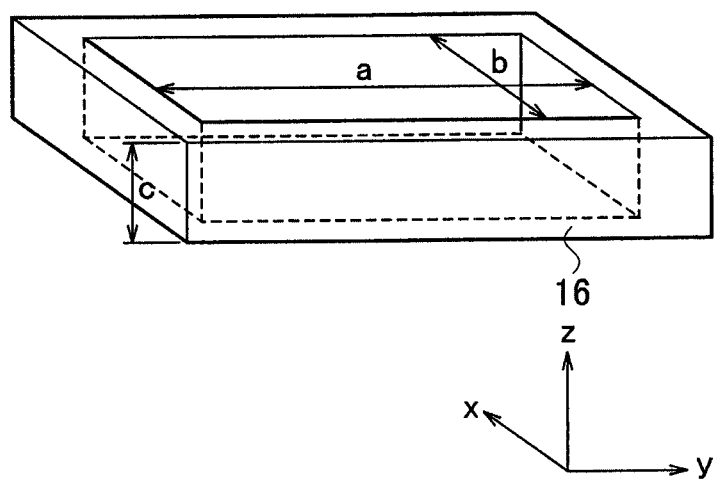
FIG. 52 is a schematic bird's-eye view showing a cavity resonator corresponding to the packages according to the ninth to tenth embodiments.

A schematic bird's-eye view structure of the cavity portion of the package 1 according to the ninth to tenth embodiments is expressed as shown in FIG. 52. The cavity portion of the package 1 according to the ninth to tenth embodiment is equivalent to the inside surrounded with the metal wall 16, and has a width of b in the X axial direction, a length of a in the Y axial direction, and a height of c in Z axial direction.

Figure 53:
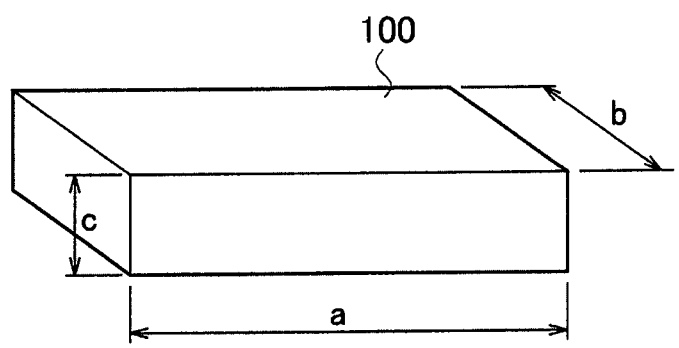
FIG. 53 is a schematic bird's-eye view showing a cavity resonator portion corresponding to the packages according to the ninth to tenth embodiments.
Figure 54A:
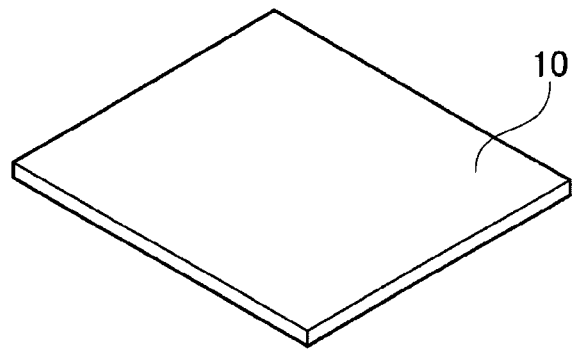
FIG. 54A is a schematic bird's-eye view showing a package according to a eleventh embodiment, and is a schematic configuration diagram showing a metal cap 10.
Figure 54B:
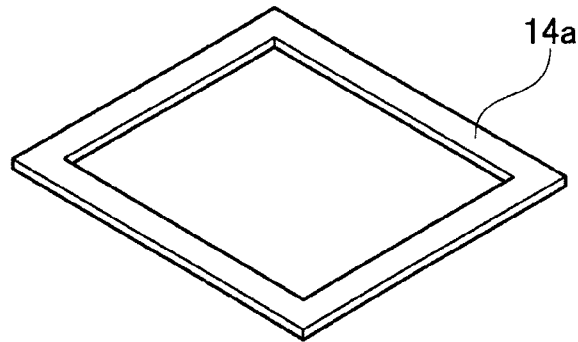
Figure 54C:
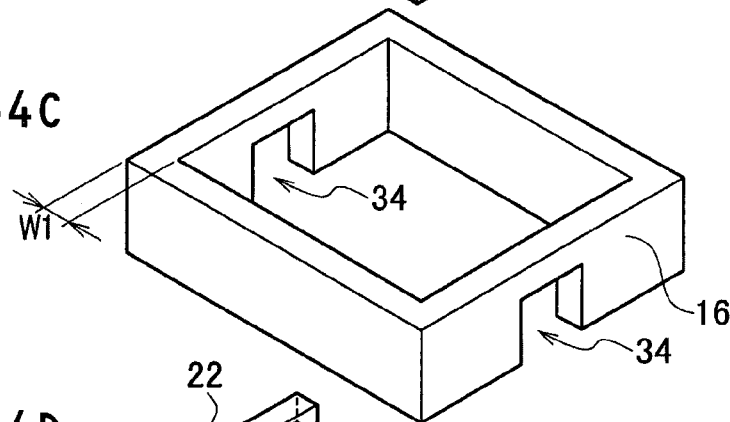
FIG. 54C is a schematic bird's-eye view showing the package according to the eleventh embodiment, and is a schematic configuration diagram showing a metal wall 16.
Figure 54D:
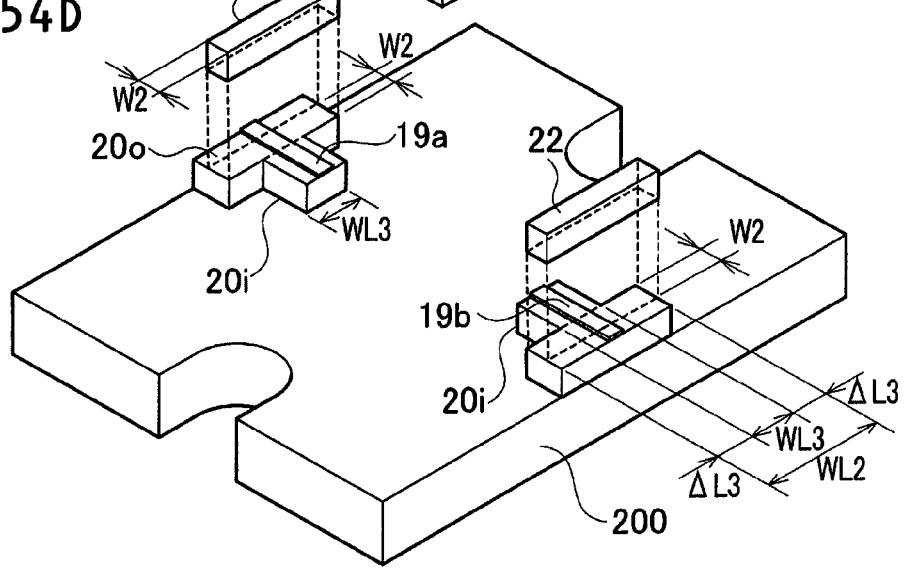
FIG. 54D is a schematic bird's-eye view showing the package according to the eleventh embodiment, and is a schematic configuration diagram showing a lower layer feed through (20*i* and 20*o*) on a conductive base plate 200, an input stripline 19*a* and an output stripline 19*b* on the lower layer feed through (20*i* and 20*o*), and an upper layer feed through 22 on the lower layer feed through 20*i*.

A schematic bird's-eye view structure of a cavity resonator 100 corresponding to the cavity portion of the package 1 according to the ninth to tenth embodiments is expressed as shown in FIG. 53. The cavity resonator 100 corresponding to the cavity portion of the package 1 according to the ninth to tenth embodiments has a length of a, a width of b, and a height of c. A cavity resonance frequency f, in the TE111 mode of such a cavity resonator 100 is satisfied the following equation:

$$f_c = v/2(1/a^2 + 1/b^2 + 1/c^2)^{1/2}$$

where v is light velocity.

As is clear from the above-mentioned equation it is proved that the cavity resonance frequency $f_c$ can be set up highly, by setting up the cavity size (i.e., a×b×c) to small value. Accordingly, the length a in the Y axial direction can be shortened in the package 1 according to the ninth to tenth embodiments.

According to the tenth embodiment, in the high airtight package used for a microwave band semiconductor device, it can provide the package which keeps characteristic impedance at 50Ω, without degrading an electric power capability.

Eleventh Embodiment

A schematic bird's-eye view configuration of a package according to an eleventh embodiment is expressed as shown in FIG. 54. FIG. 54A shows a schematic configuration showing a metal cap 10. FIG. 54B shows a schematic configuration showing a metal seal ring 14a. FIG. 54C shows a schematic configuration showing a metal wall 16. FIG. 54D shows a schematic configuration of a lower layer feed through (20i and 20o) on a conductive base plate 200, an input stripline 19a and an output stripline 19b on the lower layer feed through (20i and 20o), and an upper layer feed through 22 on the lower layer feed through 20i.

Figure 55:
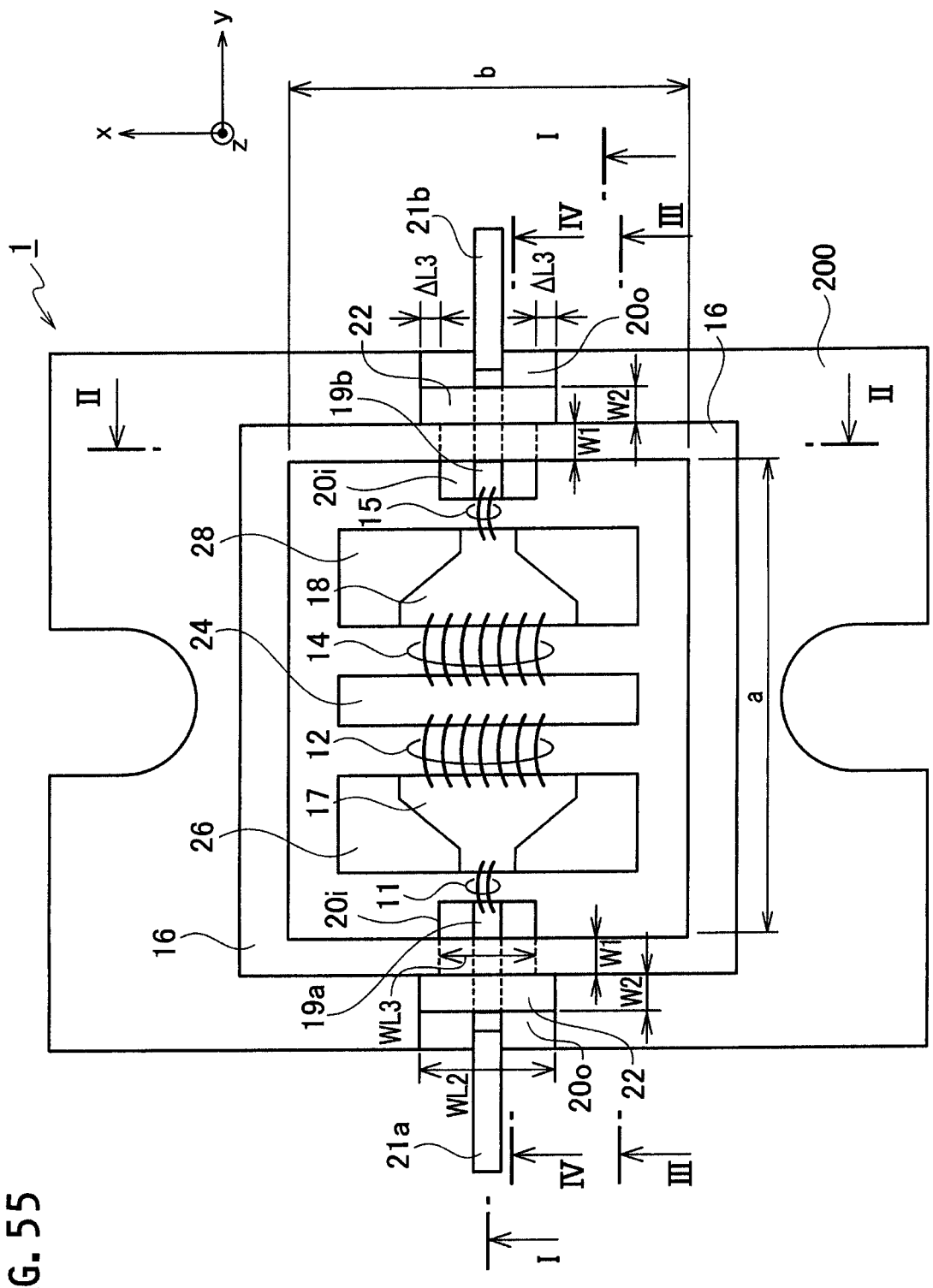
FIG. 55 is a schematic planar pattern configuration diagram showing the package according to the eleventh embodiment.

A schematic planar pattern configuration of the package according to the eleventh embodiment is expressed as shown in FIG. 55. Moreover, a schematic cross-sectional structure taken in the line I-I of FIG. 55 is similarly expressed as FIG. 42.

A schematic cross-sectional structure taken in the line II-II of FIG. 55 is similarly expressed as the drawing for which the representation of items 20i and 20o are changed with those of FIG. 20. A schematic cross-sectional structure taken in the line III-III of FIG. 55 is similarly expressed as FIG. 44. Also, a schematic cross-sectional structure taken in the line IV-IV of FIG. 55 is similarly expressed as FIG. 45. In FIG. 55, y axis indicates a direction which the line I-I extends, x axis indicates a direction in parallel to the drawing sheet and vertical to the y axis, and z axis indicates a direction vertical to the drawing sheet.

Figure 56:
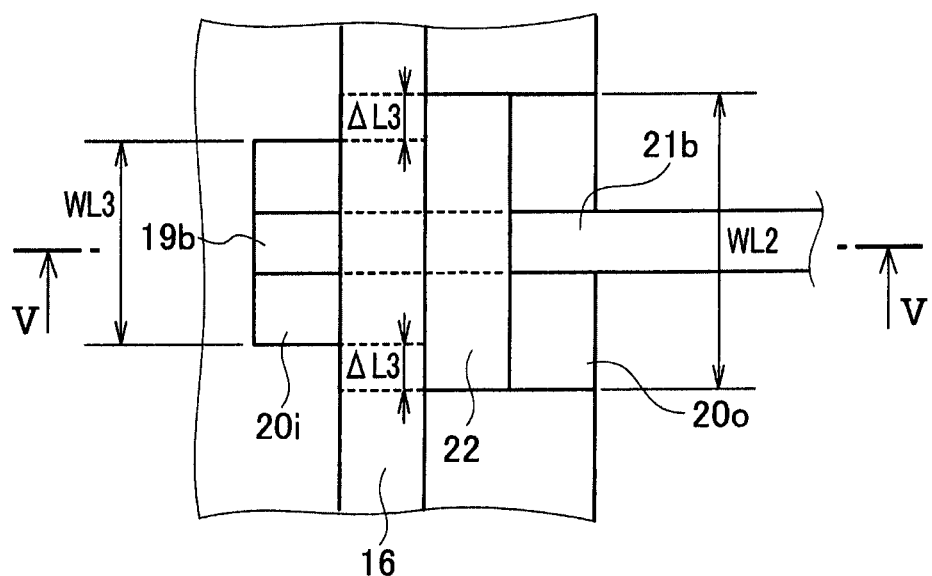
FIG. 56 is a schematic planar pattern configuration diagram showing by enlarging a feed through structure near an output terminal of the package according to the eleventh embodiment.
Figure 57A:
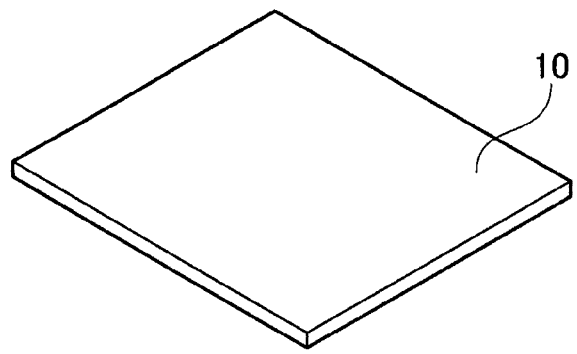
FIG. 57A is a schematic bird's-eye view showing a package according to a twelfth embodiment, and is a schematic configuration diagram showing a metal cap 10.
Figure 57B:
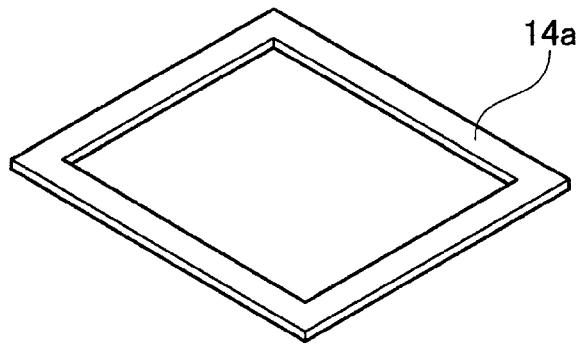
FIG. 57B is a schematic bird's-eye view showing the package according to the twelfth embodiment, and is a schematic configuration diagram showing a metal seal ring 14*a*.
Figure 57C:
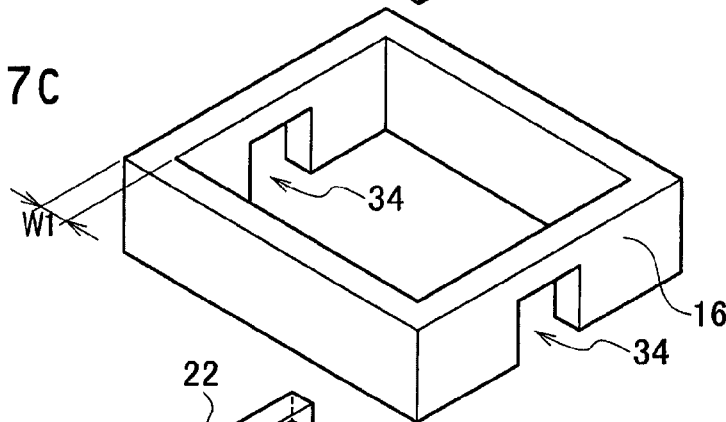
FIG. 57C is a schematic bird's-eye view showing the package according to the twelfth embodiment, and is a schematic configuration diagram showing a metal wall 16.
Figure 57D:
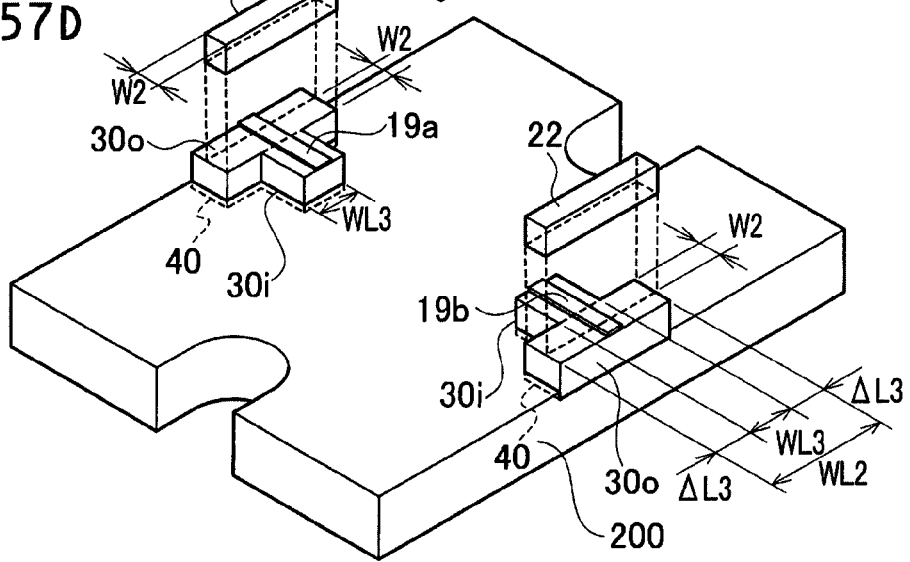
FIG. 57D is a schematic bird's-eye view showing the package according to the twelfth embodiment, and is a schematic configuration diagram showing a lower layer feed through (30*i* and 30*o*) on a conductive base plate 200 including a counter boring unit 40, an input stripline 19*a* and an output stripline 19*b* on the lower layer feed through (30*i* and 30*o*), and an upper layer feed through 22 on the lower layer feed through 30*i*.

A schematic planar pattern configuration showing by enlarging the feed through structure near the output terminal of the package 1 according to the eleventh embodiment is expressed as shown in FIG. 56. Also, a schematic cross-sectional structure taken in the line V-V of FIG. 56 is similarly expressed as FIG. 43.

As shown in FIG. 56, the following formula is satisfied: WL2−WL3=2ΔL3 where WL2 is the width of the outside lower layer feed through 20o disposed along the lines of the metal wall 16 in plane view, and WL3 is the width of the inside lower layer feed through 20i disposed along the lines of the metal wall 16 in plane view. Since the air gap is formed between the metal wall 16 and the outside lower layer feed through 20o, the horizontal overlap width between the inside lower layer feed through 20i and the metal wall 16 is a predetermined value rather smaller than ΔL3. Also, Δ2 is the lengthwise overlap width between the upper layer feed through 22 and the metal wall 16, in FIG. 43.

As shown in FIG. 54 to FIG. 56, the package according to the eleventh embodiment includes: a conductive base plate 200; a metal wall 16 disposed on the conductive base plate 200; through-holes 34 formed at both the input and output portions of the metal wall 16; lower layer feed throughs (20i and 20o) disposed on the conductive base plate 200; wiring patterns 19a and 19b disposed respectively on the lower layer feed throughs (20i and 20o); upper layer feed throughs 22 disposed respectively on a part of the lower layer feed throughs (20i and 20o) and a part of the wiring patterns 19a and 19b; and terminals 21a and 21b disposed respectively on the wiring pattern 19a and 19b. In this case, the width of a part of the lower layer feed through 20 is wider than the width of the through-hole 34, and the lower layer feed throughs (20i and 20o) are adhered to the metal wall 16 side surface. Similarly, the width of the upper layer feed throughs 22 is wider than the width of the through-hole 34, and the upper layer feed throughs 22 are adhered to the metal wall 16 side surface. Accordingly, air layers 23 are formed respectively between the wiring patterns 19a and 19b and the internal wall of the through-holes 34.

In the package 1 according to the eleventh embodiment, the upper layer feed through 22 and the lower layer feed through 20 are adhered to the outside of the metal wall 16.

Also, a semiconductor device 24 is disposed on the conductor plate 200, and the metal wall 16 disposed on the conductive base plate 200 houses the semiconductor device 24.

Moreover, as shown in FIG. 54 to FIG. 56, the terminals 21a and 21b are disposed respectively out of the through-holes 34.

In the package 1 according to the eleventh embodiment, the air layer 23 is formed between the sidewall of the lower layer feed through 20i, and the internal wall of the through-hole 34. That is, in the package 1 according to the eleventh embodiment, the inside lower layer feed through 20i has the air layer 23 between the inside lower layer feed through 20i and the through-holes 34 of the metal wall 16, without contacting the through-hole 34 of the metal wall 16.

Since the metal wall 16 does not contact the side surface of the through-hole 34 by giving such a gap between the metal wall 16 and the inside lower layer feed through 20i, an impedance of the input/output striplines 19a and 19b on the inside lower layer feed throughs 20i can be kept highly. Moreover, since the inside lower layer feed through 20i is not subject to a stress from the metal wall 16, it can reduce a possibility that a stress crack will occur in the inside lower layer feed through 20i.

Since a fabrication method of the package according to the eleventh embodiment is the same as the fabrication method of the package according to the first embodiment, duplicating explanation is omitted.

According to the package 1 according to the eleventh embodiment, since each of the air layers 23 is formed at each of the top surfaces of the signal lines of input stripline 19a and the output stripline 19b of the portion surrounded by the metal wall 16, the reduction of impedance is avoidable. As a result, it can obtain the feed through structure whose impedance matching is satisfactory, reflection loss is controlled, and characteristics of the electric power resistance.

Moreover, in the package 1 according to the eleventh embodiment, a length a in the y axial direction of the portion surrounded by the metal wall 16 to configure the cavity can be shortened compared with the first to eighth embodiments. Accordingly, compared with the first to eighth embodiments, the value of a cavity resonance frequency in TE111 mode can be set up highly, and high frequency performance can be achieved.

According to the eleventh embodiment, in the high airtight package used for a microwave band semiconductor device, it can provide the package which keeps characteristic impedance at 50Ω, without degrading an electric power capability.

Twelfth Embodiment

A schematic bird's-eye view configuration for explaining a package according to a twelfth embodiment is expressed as shown in FIG. 57. FIG. 57A shows a schematic configuration showing a metal cap 10. FIG. 57B shows a schematic configuration showing a metal seal ring 14a. FIG. 57C shows a schematic configuration showing a metal wall 16. FIG. 57D shows a schematic configuration showing a lower layer feed through (30i and 30o) on a conductive base plate 200 provided with a counter boring unit 40, an input stripline 19a and an output stripline 19b on the lower layer feed through (30i and 30o), and an upper layer feed through 22.

A schematic planar pattern configuration of the package 1 according to the twelfth embodiment is similarly expressed as FIG. 55. A schematic cross-sectional structure taken in the line I-I of FIG. 55 is expressed as shown in FIG. 49. A schematic cross-sectional structure taken in the line II-II of FIG. 55 is similarly expressed as the drawing for which the representation of items 30i and 30o are changed with those of FIG. 23. A schematic cross-sectional structure taken in the line IV-IV of FIG. 55 is similarly expressed as FIG. 51.

As shown in FIG. 57, in the package 1 according to the twelfth embodiment, the conductive base plate 200 includes the counter boring unit 40, and the lower layer feed through (30i and 30o) is disposed on the counter boring unit 40 of the conductive base plate 200. The counter boring depth ΔT of the counter boring unit 40 is approximately 0.1 mm to 0.5 mm, for example. Duplicating explanation is omitted since other configurations are the same as those of the package according to the eleventh embodiment.

According to the twelfth embodiment, since the lower layer feed through (30i and 30o) can be disposed in the counter boring unit 40 by using the conductive base plate 200 including the counter boring unit 40, it can prevent from a displacement between the convex feed through 25 composed of the lower layer feed through (30i and 30o) and the upper layer feed through 22, and the metal wall 16.

Since a fabrication method of the package according to the twelfth embodiment is the same as the fabrication method of the package according to the second embodiment, duplicating explanation is omitted.

In the package 1 according to the twelfth embodiment, the air layer 23 is formed between the sidewall of the lower layer feed through 30i, and the internal wall of the through-hole 34. That is, in the package 1 according to the twelfth embodiment, the inside lower layer feed through 30i has the air layer 23 between the inside lower layer feed through 30i and the through-holes 34 of the metal wall 16, without contacting the through-hole 34 of the metal wall 16.

Since the metal wall 16 does not contact the side surface of the through-hole 34 by giving such a gap between the metal wall 16 and the inside lower layer feed through 30i, an impedance of the input/output striplines 19a and 19b on the inside lower layer feed throughs 30i can be kept highly. Moreover, since the inside lower layer feed through 30i is not subject to a stress from the metal wall 16, it can reduce a possibility that a stress crack will occur in the inside lower layer feed through 30i.

According to the package 1 according to the twelfth embodiment, since each of the air layers 23 is formed at each of the top surfaces of the signal lines of input stripline 19a and the output stripline 19b of the portion surrounded by the metal wall 16, the reduction of impedance is avoidable. As a result, it can obtain the feed through structure whose impedance matching is satisfactory, reflection loss is controlled, and characteristics of the electric power resistance.

Also in the package 1 according to the twelfth embodiment, the value of a cavity resonance frequency in TE111 mode can be set up highly, and high frequency performance can be achieved, compared with the first to eighth embodiments.

According to the twelfth embodiment, in the high airtight package used for a microwave band semiconductor device, it can provide the package which keeps characteristic impedance at 50Ω, without degrading an electric power capability.

According to the above-mentioned embodiments, the high airtight package which keeps characteristic impedance at 50Ω used for a microwave band semiconductor device can be provided, without degrading electric power capability.

Other Embodiments

While certain embodiments have been described, the embodiments have been presented by way of examples only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

In addition, applicable semiconductor devices mounted in the package according to the embodiments are not only FET and HEMT but also amplifying elements (e.g., a Laterally Diffused Metal-Oxide-Semiconductor Field Effect Transistor (LDMOS) and a Hetero-j unction Bipolar Transistor (HBT), etc.).

Such being the case, the present invention covers a variety of embodiments, whether described or not.

What is claimed is:

1. A package comprising:
   a conductive base plate;
   a metal wall configured to be disposed on the conductive base plate;
   a through-hole configured to be disposed in input and output portions of the metal wall;
   a lower layer feed through configured to be disposed on the conductive base plate;
   a wiring pattern configured to be disposed on the lower layer feed through;

an upper layer feed through configured to be disposed on a part of the lower layer feed through and a part of the wiring pattern; and a terminal configured to be disposed on the wiring pattern, wherein a width of a part of the lower layer feed through is wider than a width of the through-hole, the lower layer feed through is adhered to a side surface of the metal wall, a width of the upper layer feed through is wider than the width of the through-hole, the upper layer feed through is adhered to the side surface of metal wall, and an air layer is formed between the wiring pattern and an internal wall of the through-hole.

2. The package according to claim 1, wherein the upper layer feed through and the lower layer feed through are adhered to an inside of the metal wall.

3. The package according to claim 1, wherein an air layer is formed between a sidewall of the lower layer feed through and the internal wall of the through-hole.

4. The package according to claim 2, wherein the terminal is disposed in the through-hole.

5. The package according to claim 3, wherein the terminal is disposed in the through-hole.

6. The package according to claim 2, wherein the conductive base plate includes a counter boring unit, and the lower layer feed through is disposed on the counter boring unit of the conductive base plate.

7. The package according to claim 3, wherein the conductive base plate includes a counter boring unit, and the lower layer feed through is disposed on the counter boring unit of the conductive base plate.

8. The package according to claim 4, wherein the conductive base plate includes a counter boring unit, and the lower layer feed through is disposed on the counter boring unit of the conductive base plate.

9. The package according to claim 1, wherein the upper layer feed through and the lower layer feed through are adhered to an outside of the metal wall.

10. The package according to claim 6, wherein an air layer is formed between the sidewall of the lower layer feed through, and the internal wall of the through-hole.

11. The package according to claim 6, wherein the conductive base plate includes a counter boring unit, and the lower layer feed through is disposed on the counter boring unit of the conductive base plate.

12. The package according to claim 7, wherein the conductive base plate includes a counter boring unit, and the lower layer feed through is disposed on the counter boring unit of the conductive base plate.

* * * * *